United States Patent [19]
Kornachuk et al.

[11] Patent Number: 6,044,481
[45] Date of Patent: Mar. 28, 2000

[54] PROGRAMMABLE UNIVERSAL TEST INTERFACE FOR TESTING MEMORIES WITH DIFFERENT TEST METHODOLOGIES

[75] Inventors: Steve P. Kornachuk, Milpitas; Craig R. Silver, Cupertino; Scott T. Becker, San Jose, all of Calif.

[73] Assignee: Artisan Components, Inc., Sunnyvale, Calif.

[21] Appl. No.: 09/099,913

[22] Filed: Jun. 18, 1998

Related U.S. Application Data

[63] Continuation-in-part of application No. 08/853,276, May 9, 1997, Pat. No. 5,968,192.
[60] Provisional application No. 60/051,385, Jul. 1, 1997.

[51] Int. Cl.[7] ................................. H04B 17/00
[52] U.S. Cl. .................. 714/724; 714/725; 714/726; 714/733
[58] Field of Search .................... 714/724, 725, 714/733, 726

[56] References Cited

U.S. PATENT DOCUMENTS

| | | | |
|---|---|---|---|
| 4,872,169 | 10/1989 | Whetsel, Jr. ............................ | 371/22.3 |
| 4,942,577 | 7/1990 | Ozaki ..................................... | 371/22.3 |
| 5,029,135 | 7/1991 | Okubo .................................... | 365/203 |
| 5,084,874 | 1/1992 | Whetsel, Jr. ............................ | 371/22.3 |
| 5,091,889 | 2/1992 | Hamano et al. ...................... | 365/233.5 |
| 5,130,647 | 7/1992 | Sakashita et al. ..................... | 324/158 |
| 5,150,366 | 9/1992 | Bardell, Jr. et al. ................... | 371/22.3 |
| 5,181,191 | 1/1993 | Farwell ................................. | 368/113 |
| 5,283,760 | 2/1994 | Chin et al. ......................... | 365/189.01 |
| 5,355,369 | 10/1994 | Greenbergerl et al. ................ | 371/22.3 |
| 5,381,420 | 1/1995 | Henry .................................... | 371/22.3 |
| 5,392,296 | 2/1995 | Suzuki ................................... | 371/22.3 |
| 5,414,663 | 5/1995 | Komarek et al. ...................... | 365/210 |
| 5,426,650 | 6/1995 | Ganapathy et al. ................... | 371/22.3 |
| 5,428,622 | 6/1995 | Kuban et al. .......................... | 371/22.3 |
| 5,434,804 | 7/1995 | Bock et al. ............................ | 364/579 |
| 5,448,575 | 9/1995 | Hashizume ............................ | 371/22.3 |
| 5,448,576 | 9/1995 | Russell ................................. | 371/22.3 |
| 5,642,324 | 6/1997 | Ghosh et al. ...................... | 365/230.03 |
| 5,680,357 | 10/1997 | Sung et al. ............................. | 365/210 |
| 5,694,369 | 12/1997 | Abe ....................................... | 365/210 |
| 5,717,697 | 2/1998 | Yin ....................................... | 371/21.5 |
| 5,783,480 | 7/1998 | Seo et al. .............................. | 438/599 |
| 5,808,933 | 9/1998 | Ross, Jr. et al. ...................... | 365/156 |
| 5,831,919 | 11/1998 | Haukness et al. ..................... | 365/205 |
| 5,892,725 | 4/1999 | Lattimore et al. ................ | 365/230.03 |
| 5,917,744 | 6/1999 | Kirihata et al. ......................... | 365/63 |
| 5,968,129 | 10/1999 | Kornachuk et al. .................... | 714/724 |

OTHER PUBLICATIONS

B. Nadeau–Dostie, A. Silburt and V. Agarwal, Serial Interfacing for Embedded–Memory Testing, IEEE Design & Test Computers, pp. 52–63, Apr. 1990.

A. Silburt, R. Phillips, R. Gibson, S. Wood, A. Bluschke, J. Fujimoto, S. Kornachuk, B. Nadeau–Dostie, R. Verma and P. Diedrich, "A 180–MHz 0.8–$\mu m$ BiCMOS Modular Memory Family of DRAM and Multiport SRAM," IEEE Journal of Solid–State Circuits, vol. 28, No. 3, Mar. 1993.

(List continued on next page.)

*Primary Examiner*—Phung M. Chung
*Attorney, Agent, or Firm*—Martine Penilla & Kim, LLP

[57] ABSTRACT

A programmable memory test interface for testing a memory device is disclosed. The interface includes a plurality of programmable input pins and output pins. The interface also includes a logic interfacing means for connecting external signals to the plurality of programmable input pins and output pins. The external signals are processed by the logic interfacing means and then communicated to a plurality of memory connection pins that couple up to the memory device. The logic component means is capable of being configured in accordance with one or more memory testing methodologies including a serial built-in-self-test (BIST), a parallel built-in-self-test (BIST), a parallel test, a serial test, and a scan test. The configuring is performed by selectively interconnecting selected ones of the plurality of input pins and output pins to the external signals that drive the logic interface means in a test mode that operates in one or more memory testing methodologies or a mission mode.

36 Claims, 44 Drawing Sheets

OTHER PUBLICATIONS

S. Kornachuk, L. McNaughton, R. Gibbins and B. Nadeau–Dostie, "A High Speed Embedded Cache Design with Non–Intrusive BIST, " Northern Telecom, Canada, IEEE International Workshop of Memory Tech., Design and Testing, Aug. 8–9, 1994, pp. 40–45.

Unknown, "The Three Dimensions of Built–In Self–Test," LogicVision, Inc., San Jose, A, 1996.

Unknown, "Embeddable BIST Technology for External Memory Test, " LogicVision, Inc., San Jose, CA, 1996.

Unknown, "IEEE Standard Test Access Port and Boundary–Scan Architecture", Aug. 17, 1990, IEEE Std 1149.1–1990, Inst. of Electrical and Electronics Engineers, Inc., NY.

V. Agrawal, C. Kime and K. Saluja, "*A Tutorial on Built–In Self–Test*", Jun. 1993, pp. 69–77, Univ. of Wisconsin, Madison.

G.M. Blair, "*Skew–free clock distribution for standard–cell VLSI designs*, " Apr. 1992, vol. 139, No. 2, pp. 211–213, Institution of Electrical Engineers, NY.

H. Bakoglu, "*Circuits, Interconnections, and Packaging for VLSI*", 1990, pp. 367–385, Addison–Wesley VLSI System Series.

P. Varma, "On Path Delay Testing in a Standard Scan Environment", 1994 IEEE, CrossCheck Technology, Inc., San Jose, CA.

PROGRAMMABLE UNIVERSAL TEST INTERFACE FOR TESTING MEMORIES WITH DIFFERENT TEST METHODOLOGIES

CROSS REFERENCE TO RELATED APPLICATIONS

This application claims priority of and is a continuation-in-part of U.S. Ser. No. 08/853,276, filed on May 9, 1997, which is now as U.S. Pat. No. 5,968,192, entitled "Programmable Universal Test Interface and Method for Making the Same," and this application also claims priority of U.S. Provisional Patent Application having U.S. Ser. No. 60/051,385, filed on Jul. 1, 1997, entitled "Programmable Universal Test Interface and Method for Making the Same." Each of the above-identified patent applications are hereby incorporated by reference.

BACKGROUND OF THE INVENTION

1. Field of the Invention

The present invention relates generally to integrated circuits, and more particularly to programmable memory test interfacing logic circuitry and methods for making the same.

2. Description of the Related Art

As semiconductor integrated circuits have become smaller and more densely integrated over the years, there has been increased demands for more comprehensive testing to verify electrical interconnections as well as the integrated circuit's functionality. One type of integrated circuit testing concerns testing the functional characteristics and electrical interconnections of memory devices that may be embedded in, for example, application specific integrated circuits (ASICs). In some applications, as many as 100 random access memories (RAMs) may be embedded in the core logic of a single ASIC, and each memory is typically tested to ensure proper functionality. Because of the dense integration, designers have, for some time, implemented testing circuitry that is embedded directly on the ASIC device to enable rapid verification of the integrity of the millions of electrical interconnections and the functionality of memory devices themselves.

There are a number of well known and commonly used testing methodologies that may be embedded into the ASIC, each requiring special logic circuitry and interfacing connections. The special logic circuitry is typically available in the form of "test collars," which contain the necessary interconnections for performing a desired testing methodology. Because circuit design companies tend to have varying preferences on the types of test collars used in their ASIC applications, each test collar is typically optimized for performing a single type of test methodology. As is well known in the art, typical test methodologies may include a serial built-in-self-test (BIST), a parallel BIST, a parallel test (MUX isolation), a serial memory test and a scan test. For more information on memory testing methodologies, reference may be made to (1) A. L. Silburt, A 180-*MHz* 0.8 μ-m *BiCMOS Modular Memory Family of DRAM and Multiport SRAM*, IEEE Journal of Solid-State Circuits, Vol. 28, No. 3, March 1993; (2) B. Nadeau-Dostie, *Serial Interfacing for Embedded-Memory Testing*, IEEE Design and Test of Computers, April 1990; and (3) S. Kornachuk, *A High Speed Embedded Cache Design with Non-Intrusive BIST*, IEEE International Workshop on Memory Technology Design and Testing, pages 40–45, August 1994. All three articles are incorporated herein by reference.

FIG. 1A shows an application specific integrated circuit (ASIC) 100 having a core logic 102 and a number of embedded test collars for testing memory devices. In this example, ASIC 100 includes a memory core A 104 and a memory core B 106, each having a test collar 110 and a test collar 114, respectively. As described above, test collar 110 and 114 are typically selected by the designer to accomplish a specific memory testing methodology. Once the test collar for performing the designer's chosen testing methodology has been integrated in ASIC 100, a test controller 120 that is specifically chosen to interact with test collars 110 and 114 is also integrated into the ASIC 100.

In addition to embedding test collars 110 and 114 for performing the type of testing methodologies described above, designers also typically integrate scan test collars 108 for testing wire routing and chip logic preceding memory inputs and following memory outputs. As shown, scan collars 108 directly interface with memory core A 104 and memory core B 106, and miscellaneous storage elements 118 (e.g., latches, flip flops, and other memories). As is well known, memory core A 104, memory core B 106, and miscellaneous storage elements 118 are typically interspersed and interconnected with static logic circuitry used when ASIC 100 operates in its mission mode (i.e., non-test mode).

When a scan test is performed, "scan-in" (SI) and "scan-out" (SO) pins located on each scan collar 108 as well as on each storage element contained in miscellaneous storage elements 118, are serially chained together to form one long scan chain. By way of example, FIG. 1B shows a magnification of scan collars 108 and miscellaneous storage elements 118, each having SI and SO pins serially chained together, beginning at a SI pad 122 and ending at a SO pad 124. In this manner, all of the wire routing and chip logic preceding memory inputs and following memory outputs may be conveniently tested directly from the ASIC's bonding pads (e.g., by inputting test vectors into SI pad 122 and checking the results exiting SO pad 124).

Although special test collars for performing serial BIST, parallel BIST, parallel test, and serial test are readily available for integration into most ASIC designs, these test collars typically demand a fair amount of core logic 102 area to be properly laid out. As a result, the necessity to integrating test collars into a multi-memory ASICs has the unfortunate effect of increasing chip size and, therefore packaging sizes.

Yet another drawback of implementing different test collars for performing different types of testing methodologies is, that a substantial amount of design labor and verification goes into integrating test collars into a particular ASIC. For example, assume that design company A prefers to test its ASIC memory devices with a serial BIST methodology and a scan test, and design company B prefers to test its ASIC memory devices with a parallel test and a scan test. Although both design company A and B may be using the same types of memories, such as, for example, a DRAM memory, an SRAM memory or an SDRAM memory, both companies are generally required to perform custom test collar integration to implement their chosen testing methodologies. Although custom test collar integration is typically not a difficult design task, custom integration is generally a time consuming task that may slow down product development and subsequent product release.

In view of the foregoing, there is a need for a memory test interface that may be programmed to perform user selected memory testing methodologies without the need for methodology specific test collars. Further, there is a need for a method of making a memory test interface that may be integrated to a memory device itself, and programmable by a user to perform its preferred memory testing methodology.

SUMMARY OF THE INVENTION

Broadly speaking, the present invention fills these needs by providing a programmable memory testing interface that may be configured to operate in a number of user programmed testing methodology arrangements. It should be appreciated that the present invention can be implemented in numerous ways, including as a process, an apparatus, a system, a device, or a method. Several embodiments of the present invention are described below.

In one embodiment, a programmable memory test interface for testing a memory device is disclosed. The programmable memory test interface includes a plurality of programmable input pins and output pins, and logic circuitry to interface the plurality of programmable input pins and output pins to the memory device. The logic circuitry is capable of being configured in accordance with a plurality of different memory testing methodologies, and is configurable into at least one memory testing methodology depending on the wiring of the plurality of programmable input pins and output pins. Preferably, the programmable input pins and output pins may be selectively interconnected, or may be coupled to a test controller that is configured to drive the logic circuitry in at least one of the plurality of different memory testing methodologies.

In another embodiment, a programmable memory test interface for testing a memory device is disclosed. The interface includes a plurality of programmable input pins and output pins. Also includes is a logic component means for interfacing the plurality of programmable input pins and output pins to the memory device. The logic component means is capable of being configured in accordance with one or more memory testing methodologies. The configuring is preferably accomplished by interconnecting selected ones of the plurality of programmable input pins and output pins. The interface further includes a plurality of memory interfacing pins that connect the logic component means to the memory device.

In yet another embodiment, a programmable memory test interface is disclosed. The programmable test interface includes logic circuitry that is configured to be integrated to a memory device. The memory device has a plurality of receiving connections that are configured to be coupled to a plurality of internal connections of the logic circuitry. The interface further includes a plurality of programmable input pins and output pins that lead to and from the logic circuitry. The programmable input pins and output pins are configured to receive control driving signals from external wiring that connects to selected ones of the programmable input pins and output pins that enable operating the memory device in one of a test mode and a mission mode. In this manner, the programmable input pins and output pins can be selectively interconnected to transform the logic circuitry into at least one type of memory testing methodology interface. This enables testing the memory device when operating in the test mode and operating the memory device in a non-test mode when in the mission mode.

Still further, the present invention discloses another programmable memory test interface embodiment for testing a memory device. The interface includes a plurality of programmable input pins and output pins. A logic interfacing means for connecting external signals to the plurality of programmable input pins and output pins. The external signals are processed by the logic interfacing means and then communicated to a plurality of memory connection pins that couple up to the memory device. The logic component means is capable of being configured in accordance with one or more memory testing methodologies including a serial built-in-self-test (BIST), a parallel built-in-self-test (BIST), a parallel test, a serial test, and a scan test. The configuring is performed by selectively interconnecting selected ones of the plurality of input pins and output pins to the external signals that drive the logic interface means in a test mode that operates in the one or more memory testing methodology or a mission mode.

In yet another embodiment, a method for using a memory generator to make a memory core on a semiconductor chip is disclosed. The method includes integrating interface logic circuitry to the memory core. The interface logic circuitry has a plurality of memory core pins that connect to the memory core, and the interface logic also includes a plurality of input pins and output pins. The method further includes interconnecting some of the plurality of input pins and output pins to convert the programmable memory testing interface into at least one memory test methodology that is selected from the group consisting of a serial built-in-self-test, a parallel built-in-self-test, a parallel test, a serial test, and a scan test. The plurality of input pins and output pins that are capable of being interconnected are further capable of being connected to wiring that is external to the interface logic circuitry, and the wiring is configured to drive the memory core in a test mode or a mission mode.

Advantageously, the various embodiments of the present invention provide methods and apparatuses for a universal memory test interface that is modular in many respects, and provides designers with the programming flexibility to configure the interface to perform their preferred testing methodologies. By way of example, a designer may simply perform minor electrical interconnections among the universal test interface input/output pins, and/or simply connect the universal test interface to the designer's most preferred test controller. In addition, when the universal test interface of the present invention is compactly integrated as part of a memory device, substantial reductions in core logic area may be achieved, thereby enabling more densely integrated and compact high performance applications. This integration also allows customization of the test interface element design, such that the negative impact of test access on mission mode performance is minimized. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for a programmable memory test interface is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In one embodiment of the present invention, a universal test interface (UTI™) that may be implemented for testing memory devices integrated into integrated circuits is disclosed. In this embodiment, the UTI is a modular memory test interface that is preferably programmable to perform any number of testing methodology selected by the end user. By way of example, Artisan Components, Inc. of California, makes a number of Process-Perfect™ memories that may be integrated with the UTI to offer a full range of memory testing methodology (i.e., design for test "DFT") options, including support of a serial built-in-self-test (BIST), a parallel BIST, a parallel test (MUX isolation), a serial memory test, and a scan test. It is important to realize that the UTI of the present invention is user programmable, significantly more compact than prior art collar implementations, and is specifically designed to reduce the impact on mission mode performance degradation.

Figure 1B:
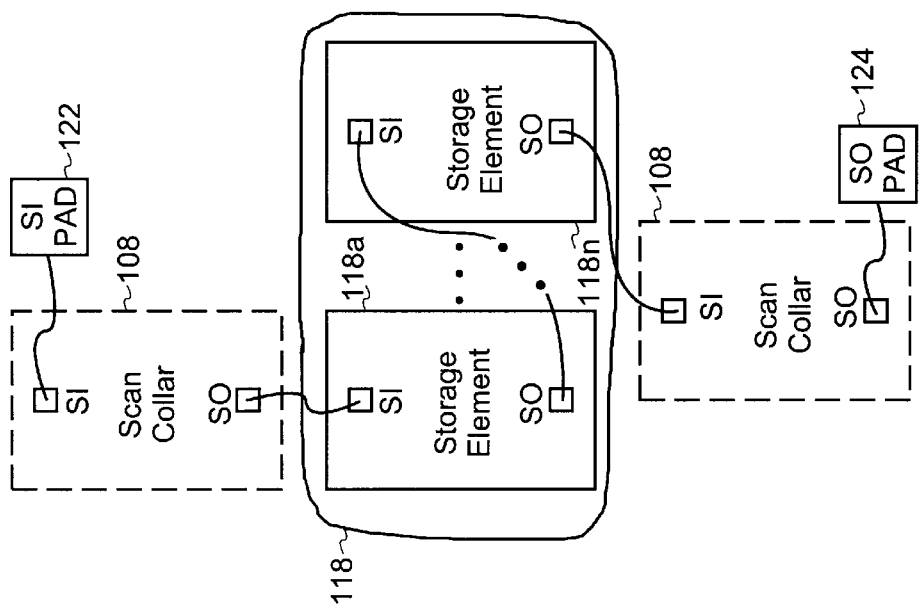
FIG. 1B illustrates a scan test wiring arrangement using scan test collars to complete a scan test of the wire routing and chip logic preceding memory inputs and following memory outputs.
Figure 1A:
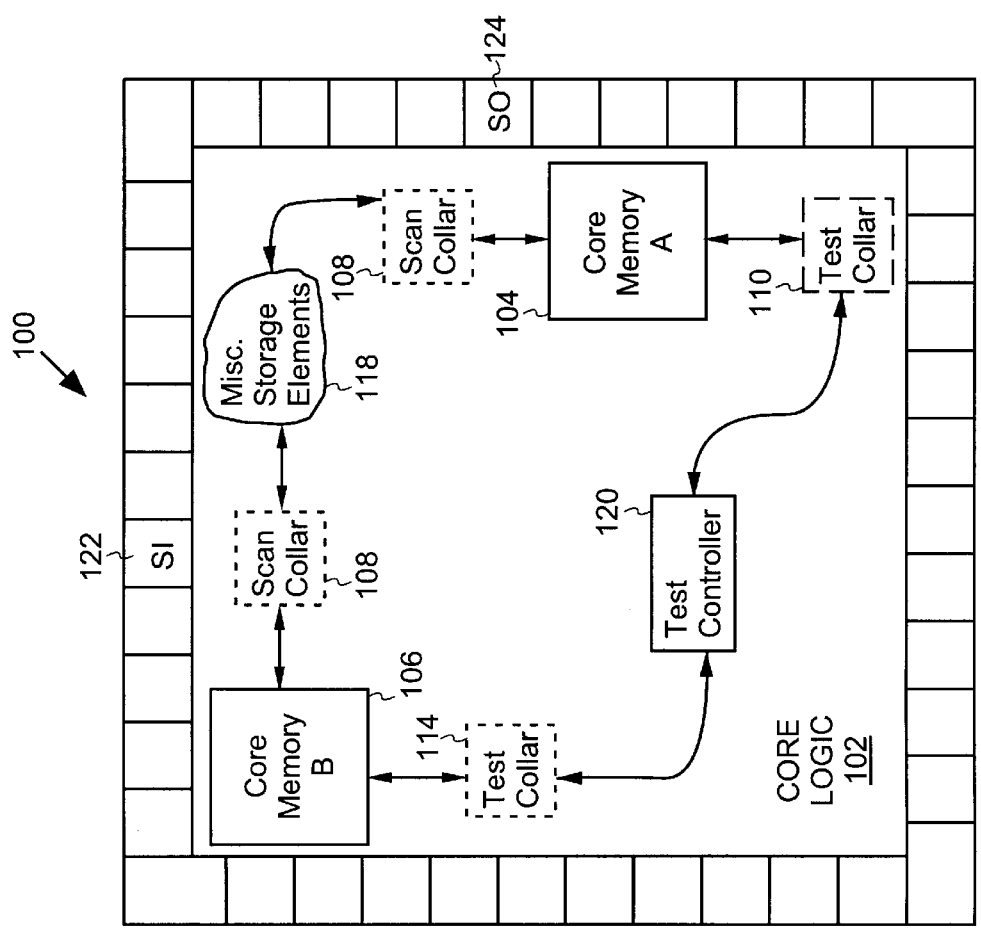
FIG. 1A shows an application specific integrated circuit (ASIC) having core logic and number of embedded test collars for testing memory devices.
Figure 2A:
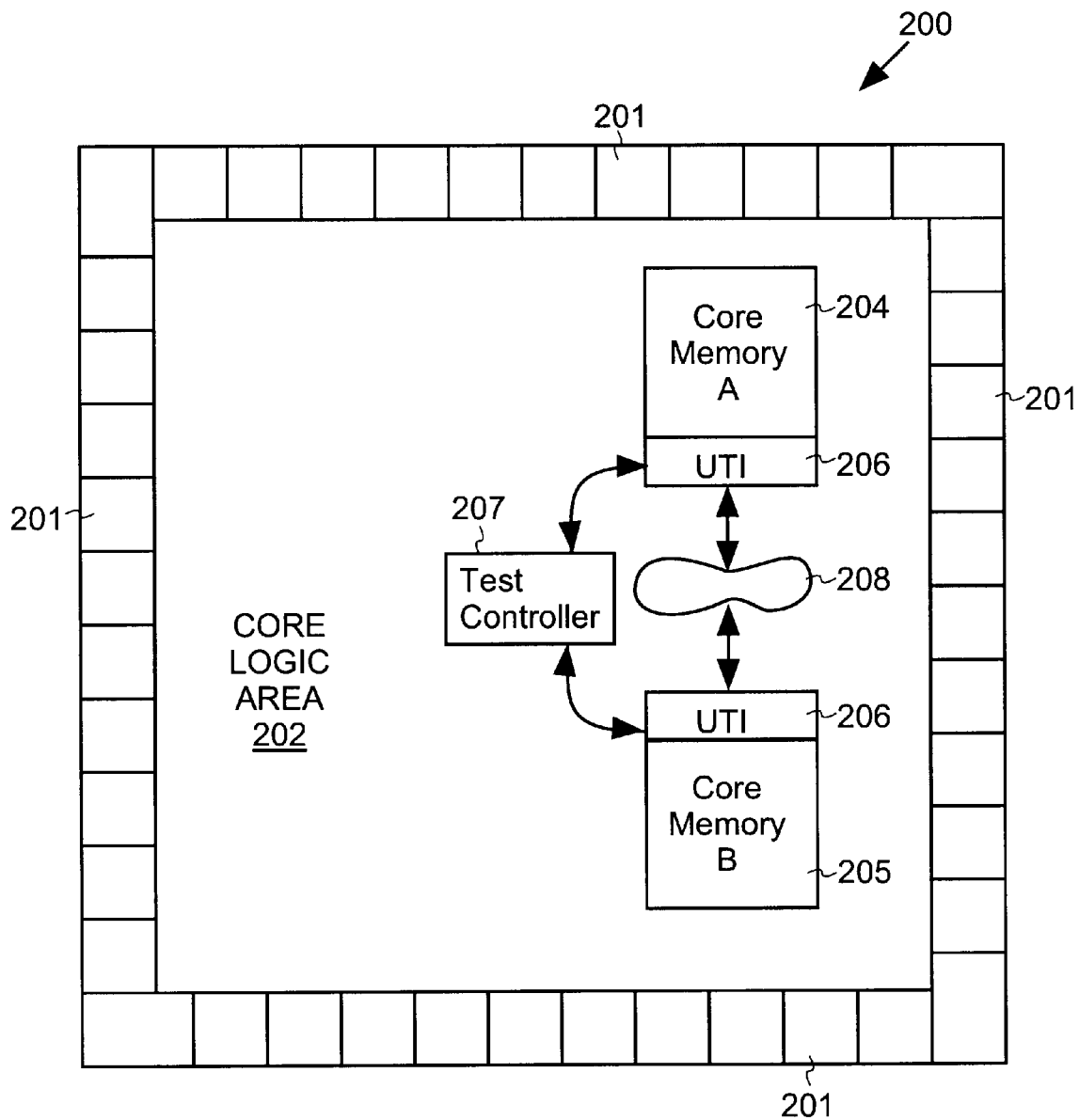
FIG. 2A is a top view of an exemplary integrated circuit design having a plurality of input/output cells and bond pads defined along the periphery in accordance with one embodiment of the present invention.

FIG. 2A is a top view of an exemplary integrated circuit design 200 having a plurality of input/output cells and bond pads 201 defined along the periphery in accordance with one embodiment of the present invention. Contained within integrated circuit design 200 is a central core logic area 202 where a core memory A 204 and a core memory B 205 are integrated. In this embodiment, core memory A 204 and core memory B 205 each have a universal test interface (UTI) 206 integrated along one side of the core memory devices. Connected to each UTI 206 is a test controller 207 which is typically integrated into core logic area 202 to drive specific user-defined test patterns (i.e., vectors) into UTI 206 when testing under specific testing methodologies. In one embodiment, test controller 207 may be optimized to drive UTI 206 with test patterns designed to test a memory device under a serial built-in-self-test (BIST), a parallel BIST, a parallel test (i.e., MUX isolation), and a serial memory test.

Also shown is a cloud 208 which may represent any number of miscellaneous storage elements that may lie between core memory A 204 and core memory B 205. As described above, it is also common to test memory cores (i.e., 204 and 205) and miscellaneous storage elements for appropriate wire routing and logic integration by implementing a scan test. When scan testing is desired, UTI 206 may simply be programmed by performing simple wiring interconnections to form a "scan chain" that will allow UTI 206 to receive and process scan test patterns. It should be appreciated that by providing a simple integrated UTI 206 as part of core memory A 204 and core memory B 205, the need to implementing prior art test collars for each user desired test methodology is essentially eliminated. As such, the integrated circuit design may be designed in a more compact layout, thereby reducing the overall size of the chip.

By way of example, by simply providing UTI 206 as part of each core memory, the user need not concern itself with integrating one methodology-specific test collar into core logic area 202 to enable its preferred memory testing methodology. As such, UTI 206 provides the power of a programmable logic interface that may be wired to perform any desired testing methodology, while reducing the possibly laborious task that may be associated with integrating methodology-specific test collars.

Figure 2B:
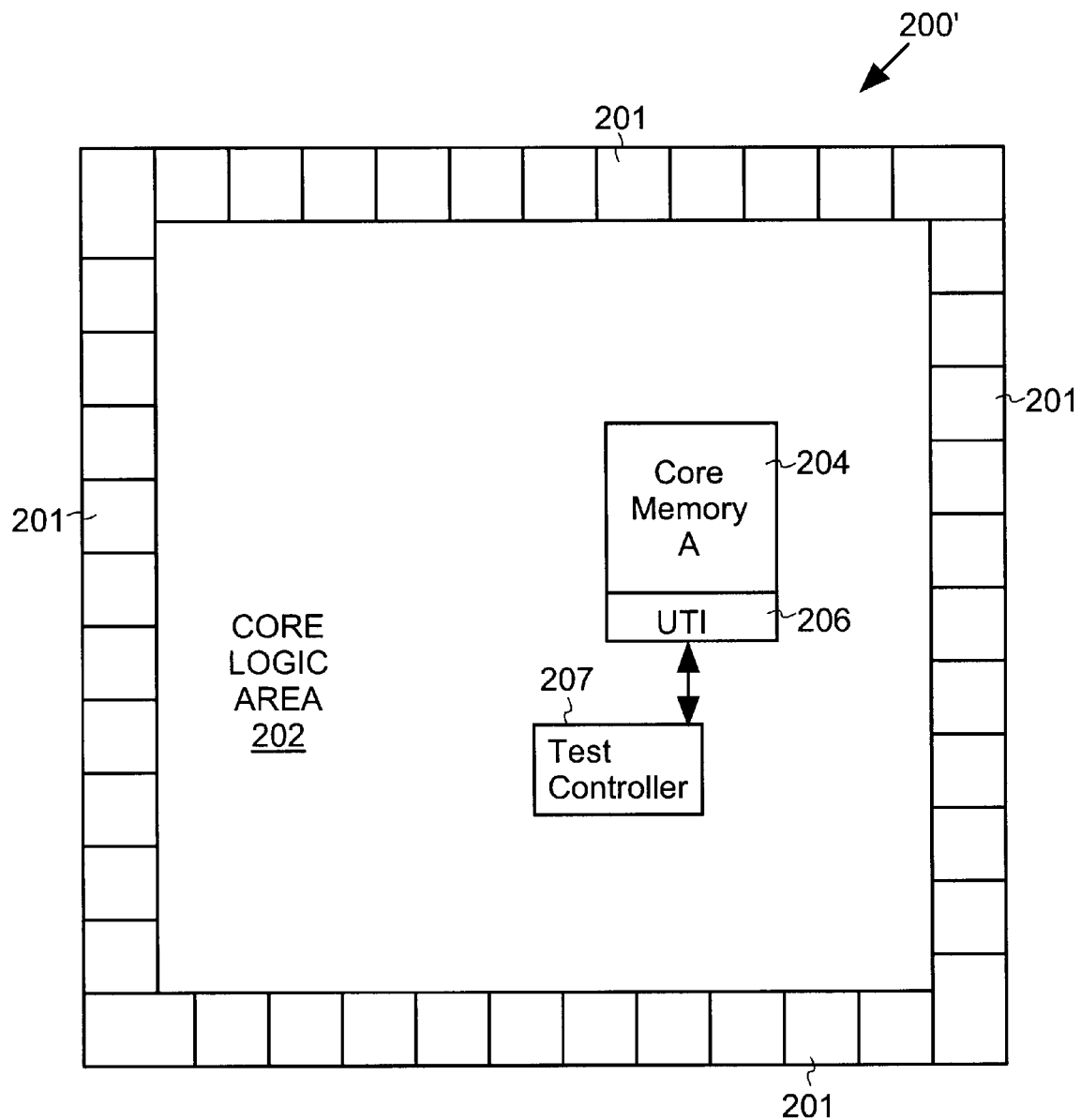
FIG. 2B shows another exemplary integrated circuit design having only one core memory and an integrated universal test interface in accordance with one embodiment of the present invention.

FIG. 2B shows another exemplary integrated circuit design 200' having only core memory A 204 and an integrated UTI 206 in accordance with one embodiment of the present invention. In this example, test controller 207 need only interface with one UTI 206 to drive the logic circuitry provided in UTI 206, with user provided test patterns when UTI 206 is set in test mode. UTI 206 is also well suited interface with core memory A 204 to operate in mission mode with a minimal degree of performance impact. As in FIG. 2A, a scan test may also be performed in addition to any other test controller driven testing methodology without further impacting mission mode operation. It is therefore important to realize that UTI 206 is typically programmed to operate for test configurations, such as, for example: (a) a serial BIST and scan test; (b) a parallel BIST and scan test; (c) a parallel test and scan test; and (d) a serial test and scan test. However, in some instances, it may be desirable to program UTI 206 to operate in more than two testing methodologies by implementing a minimal amount of logic circuitry that is external to the UTI 206. It should be noted that none of the necessary external logic required for the above strategy will impact mission mode performance.

In one embodiment, UTI 206 may have selected input/output pins (shown below) wired together to complete a scan chain, and thereby enable the receiving of test vectors configured to test the wire routing and chip logic preceding memory inputs and following memory outputs. Because the UTI 206 is very compact and flexibly programmed in accordance with a particular user's testing preferences, it is even possible to reduce the chip size of even large scale application specific integrated circuits (ASICs) having up to 30 or more embedded core memories, thereby enabling more dense integration. Accordingly, UTI 206 provides ASIC designers with a powerful circuit that eliminates the need for specialized test collars, and eliminates integration, routing and timing constraints that may be unique with each particular testing methodology.

Figure 2C:
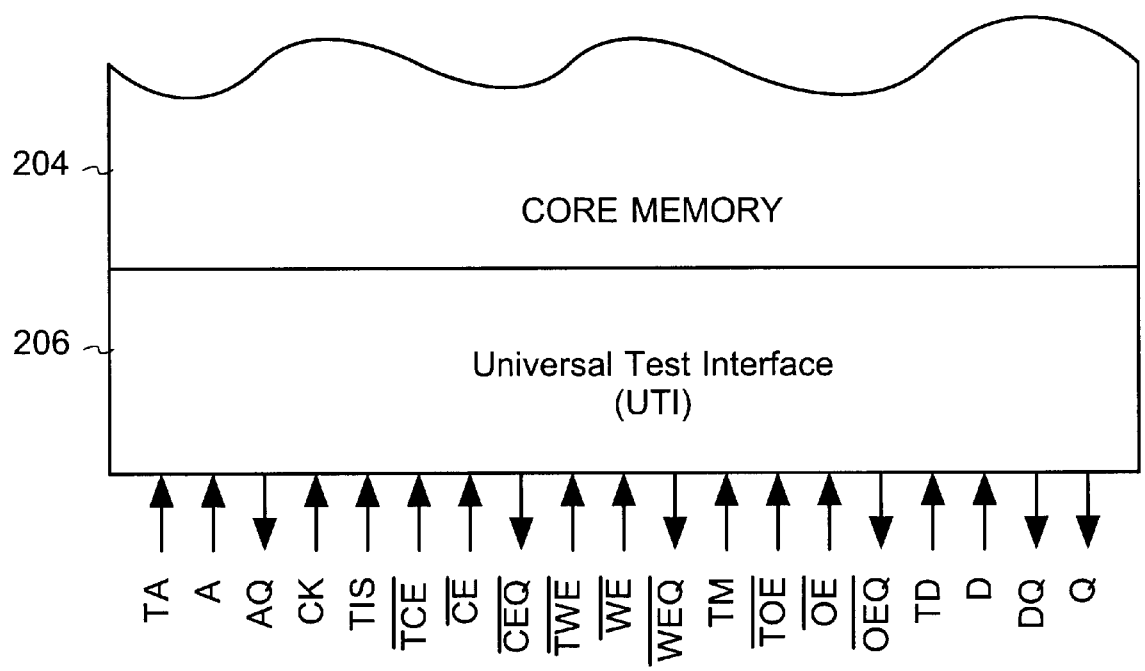
FIG. 2C is a more detailed view of a core memory being integrated with the universal test interface having input/output pins in accordance with one embodiment of the present invention.

FIG. 2C is a more detailed view of core memory 204 being in integrated communication with UTI 206 in accordance with one embodiment of the present invention. It should be understood that core memory 204 may be any type of read/write memory, which may include a DRAM, an SRAM, a CAM, a register file or an SDRAM. Of course, other memory devices such as read-only memories and FPGAs may also benefit from the inventive programmability and modularity of UTI 206. The following is an overview pin description identifying the signals, buses and pins that define the preferred input/output pins of the UTI 206 in accordance with one embodiment of the present invention.

From left to right, TA is a test address input bus which leads into UTI 206, and is used to address memory core 204 during a read or a write operation. As described in Table 1 below, when a test input select "TIS" pin is driven high, TA is the address applied to the memory core during a read or a write operation. The next pin "A" is a mission mode address input bus that is applied to the memory core during a read or write operation when TIS is driven low. The next pin is "AQ," which is an output bus for the address scan flip flops (i.e., flip flops 212 described below). In this embodiment, when TIS is driven low, AQ is a latched version of the mission mode address input bus "A". On the other hand, when TIS is driven high, AQ is the latched version of the test address input bus "TA". The next pin "CK" is the clock pin that is preferably pulsed during any memory mission mode operation as well as test mode operation. In general, CK signifies the beginning of a memory mission mode or test operation. As mentioned above, the next pin "TIS" is a MUX select that is used to select the test inputs when TIS is high, and the mission mode inputs when TIS is low.

Continuing with the pin descriptions, the next pin to the right is a test chip enable pin "/TCE", which is used to disable a memory operation when the test input select "TIS" pin is driven high, and /TCE is high. Conversely, /TCE will enable a memory operation when TIS is driven low, and /TCE is low. The next pin is a mission mode chip enable "/CE" pin that has substantially the same functionality as the test chip enable "/TCE" pin when TIS is driven low. The next pin is a chip enable scan flip flop output "/CEQ" pin, which represents a latched version of mission mode chip enable "/CE", when TIS is low. Conversely, when TIS is high, /CEQ will represent the latched version of /TCE. The next pin is a test write enable "/TWE" pin that enables a write when /TWE is low and TIS is high, and will enable a read when /TWE is high and TIS is high.

The next pin is a mission mode write enable "/WE" pin that enables a read when it is high and TIS is low, and enables a write when it is low and TIS is low. The next pin is a write enable scan flip flop output "/WEQ" pin, which represents the latched version of the mission mode write enable "/WE" pin when TIS is low. When TIS is high, /WEQ represents the latched version of the test write enable "/TWE." The next pin is a test mode "TM" pin that, when driven high, the output Q of the UTI 206 interface represents the latched version of D (mission mode data bus) or TD (test data bus), as determined by TIS (depending on the state of /OE). On the other hand, when TM is driven low, the Q output of the UTI 206 interface represents the core memory 204 outputs (depending on the state of /OE).

Still further, the next pin is a test output enable "/TOE" pin that enables the output drive of the memory Q outputs when /TOE is low and TIS is high. On the other hand, when /TOE is high, this will disable the memory output drive on the Q outputs. The next pin is a mission mode output enable "/OE" pin, which will disable the memory output drive on the Q outputs when /OE is high and TIS is low, and enable the memory when both /OE and TIS are low. The next pin is an output enable scan flip flop output "/OEQ" pin, which represents the latched version of /TOE when TIS is high. Conversely, when TIS is low, /OEQ will represent the latched version of /OE. The next pin is a test data bus "TD" pin that represents the input to the core memory 204 and the data scan flip flops (i.e., 212), when TIS is high. The next pin is a mission mode data bus "D", that represents the input to the core memory and the data scan flip flops when TIS is low.

Further yet, the next pin is a data scan flip flop output "DQ" pin that represents the latched version of the mission mode data bus "D" when TIS is low. When TIS is high, DQ will represent the latched version of test data bus TD. The final pin at the rightmost portion of UTI 206, is an output bus "Q", which represents the output of the UTI 206 interface determined by the state of the pins TIS, TM, /TOE, and /OE. Specifically, if TM is low, the state of the output bus "Q" is determined by the output of the MUX 210 between /TOE and /OE. If TM is high, the state of the output bus "Q" is determined by the state of the signal /OE.

Although a detailed pin description has been provided in one specific order, it should be understood that the particular order or arrangement may be modified to any other suitable arrangement as well. Further yet, although specific names have been assigned to each pin for ease of description and illustration, other names may be applied to each pin, or pins may be combined or eliminated by implementing additional logic that may be internal or external to UTI 206. For ease of reference, Table 1 below identifies each of the exemplary pins and their preferred functionality in accordance with one embodiment of the present invention.

TABLE 1

Exemplary Pin Description

| | |
|---|---|
| (TA) Test Address In utBus | When TIS is high, TA is the address applied to the memory core during a read or a write operation. |
| (A) Mission Mode Address Input Bus | When TIS is low, A is the address applied to the memory core during a read or write operation. |
| (AQ) Output Bus of Address Scan Flip Flop | When TIS is low, AQ is a latched version of A. When TIS is high, AQ is a latched version of TA. |
| (CK) Clock | Clock (CK) is always pulsed during any memory mission mode or test operation. Clock (CK) signifies the beginning of a memo mission mode or test o eration. |
| (TIS) Test Input Select | TIS is a MUX select which selects the test inputs when it is high, and selects the mission mode inputs when it is low. |
| (/TCE) Test Chip Enable | When TIS is high, /TCE will disable a memory operation when /TCE is high. /TCE will enable a memory operation when /TCE is low. |
| (/CE) Mission Mode Chip Enable | When TIS is low, /CE has substantially the same functionality of /TCE. |
| (/CEQ) Chip Enable Scan Flip Flop Output | When TIS is low, /CEQ is the latched version of /CE. When TIS is high, /CEQ is the latched version of /TCE. |
| (/TWE) Test Write Enable | When TIS is high, /TWE being low will enable a write, and /TWE being high will enable a read |
| (/WE) Mission Mode Write Enable | When TIS is low, /WE being high will enable a read, and /WE being low will enable a write. |
| (/WEQ) Write Enable Scan Flip Flop Output | When TIS is low, /WEQ represents the latched version of /WE; when TIS is high, /WEQ represents the latched version of /TWE. |
| (TM) | When TM is high, the output Q of the UTI interface |

TABLE 1-continued

Exemplary Pin Description

| | |
|---|---|
| Test Mode | represents the latched version of D or TD as determined by TIS, depending on the state of /OE. When TM is low, the Q output of the UTI interface represents core memory outputs, also depending on the state of /OE. |
| (/TOE) Test Output Enable | When TIS is high, /TOE being low will enable the output drive of the memory Q outputs. /TOE being high will disable the memory output drive on the Q outputs. |
| (/OE) Mission Mode Output Enable | When TIS is low or TM is high, /OE being high will disable the memory output drive on the Q outputs. When /OE is low it will enable the output drive on the Q outputs. |
| (/OEQ) Output Enable Scan Flip Flop Output | When TIS is high, /OEQ represents the latched version of /TOE; when TIS is low, /OEQ represents the latched version of /OE. |
| (TD) Test Data Bus | When TIS is high, TD represents the input to the core memory and the data scan flip flops. |
| (D) Mission Mode Data Bus | When TIS is low, D represents the input to the core memory and the data scan flip flops. |
| (DQ) Data Scan Flip Flop Output | When TIS is low, DQ represents the latched version of D; when TIS is high, DQ represents the latched version of TD. |
| (Q) Output Bus | Q represents the output of the UTI interface determined by the functionality of the /OE, /TOE, TIS, and the TM pins. |

Figure 2D:
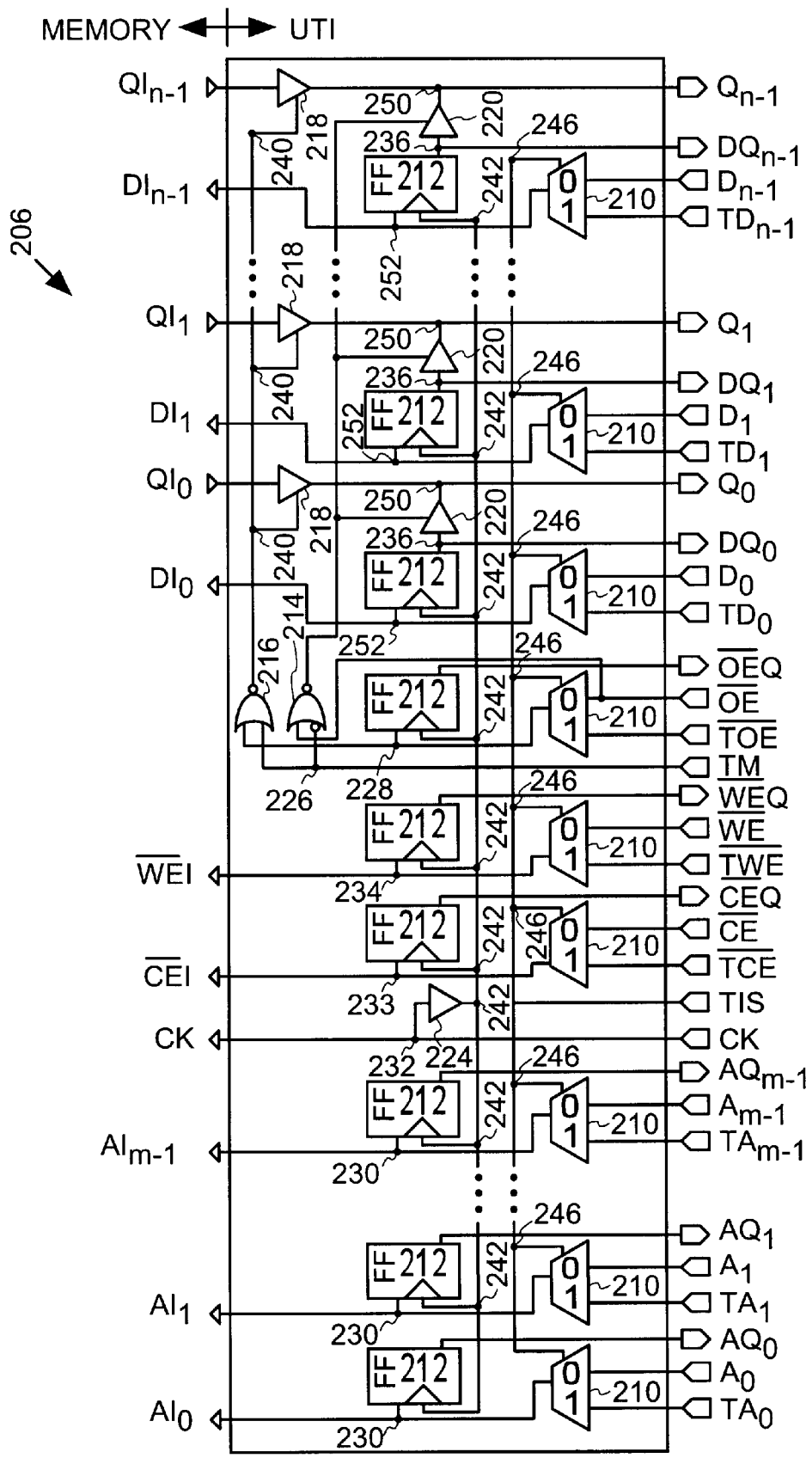
FIG. 2D shows one preferred detailed logic circuitry implementation contained within the universal test interface in accordance with one embodiment of the present invention.

FIG. 2D shows a preferred detailed logic circuit implementation contained within UTI 206 in accordance with one embodiment of the present invention. In the arrangement of this embodiment, the top portion of the interface has a plurality of memory core interconnections that provide clock signals, addressing signals and data signals to and from a memory core. It should be understood that the exemplary logic is configured to operate in a non-registered mode (i.e., no pipeline), however, with simple logic modifications, the UTI of this embodiment may be configured to operate in a registered manner as well. For completeness, the following pin connections are either directed in or out of a memory core, and may ultimately be integrated with UTI 206. Thus, pin connections $A_{I0}$, $A_{I1}$, $A_{im-1}$, CK, /$CE_I$, /$WE_I$, $D_{I0}$, $Q_{I0}$, $D_{I1}$, $Q_{I1}$, $D_{in-1}$, and $Q_{in-1}$ are preferably directly interfaced with a memory core. In this embodiment, UTI 206 includes a combination of input multiplexors 210 that are shown coupled to a plurality of input pins of UTI 206.

By way of example, pin $TA_0$ and pin $A_0$ both feed into a first MUX 210 that has an output leading to a node 230. Node 230 is preferably coupled to a flip flop 212 and pin $A_{I0}$ that leads to a memory core. This MUX 210 is shown having a select line coupled to a node 246 that is in turn coupled to the test input select "TIS." The next MUX 210 to the right defines the next bus input pins $TA_1$ and $A_1$, and has an output leading to node 230 that is also coupled to a flip flop 212 and pin $A_{I1}$ that leads to the core memory. All flip flops 212 are also coupled to a node 242 that is configured to receive a buffered clock "CK" signal, this is accomplished by buffer 224.

In this embodiment, pin $AQ_0$ is an output from the first flip flop 212, and $AQ_1$ is an output from the second flip flop 212. It should be understood that the first two flip flops 212 and the first two multiplexors 210 from the left of UTI 206, may be replicated any number of times, depending on the number of bits associated with the test and mission mode address bus, and the output bus of the address scan flip flops 212. The third MUX 210 has input pins $TA_{m-1}$ and $A_{m-1}$, and an output coupled to node 230 leading to flip flop 212, as well as to a pin $A_{im-1}$ which leads to the core memory. This flip flop 212 is also coupled to node 242, and an output leads to a pin $AQ_{m-1}$.

The next input pin into UTI 206 is the clock (CK) input pin which is coupled to a node 232 that leads to the memory core connection CK, and node 232 also defines the input to buffer 224, which has an output coupled to node 242 as described above. The next pin is the test input select (TIS) pin that is used to drive node 246 in order to select the test inputs or the mission mode inputs. By way of example, when TIS is driven high, the test inputs are selected, and when TIS is driven low, the mission mode is selected. The next MUX 210 to the right of pin TIS has input pins /TCE and /CE, and MUX 210 has an output leading to a node 233 that defines an input to flip flop 212, as well as a pin /$CE_I$ leading to the memory core. The MUX 210 also receives a select signal from node 246, which is driven by the aforementioned TIS pin. The next pin of UTI 206 is an output pin /CEQ which is an output of flip flop 212.

The next MUX 210 has input pins /TWE and /WE, and has an output coupled to a node 234, which defines an input to flip flop 212, and a connection to a memory core pin /$WE_I$. This flip flop 212 also shows an output leading to output pin /WEQ which defines the write enable scan flip flop output. The next pin of UTI 206 is the test mode "TM" pin, which is coupled to a node 226. Node 226 defines an input to a NOR gate 216 and a NOR gate 214. In this example, NOR gate 214 receives the test mode signal from node 226 and inverts it before being processed by NOR gate 214. In an alternative embodiment, NOR gates 214 and 216 may be replaced with NAND gates, or any other suitable circuitry. Of course, when the gates of UTI 206 are actually laid out in silicon using well known software layout tools, the transistor layouts may differ from the exact pictorial logic gate designs.

The next MUX 210 has input pins /TOE and /OE. In this example, signal /OE represents the mission mode output enable signal, and is coupled to both MUX 210 and an input of NOR gate 214. Further, MUX 210 has an output leading to a node 228, which is coupled to flip flop 212, and defines an input to NOR gate 216. Flip flop 212 is also coupled to node 242 as described above. Further, this flip flop 212 also has an output leading to output pin /OEQ of UTI 206. Pins TD₀ and D₀ are also coupled to a MUX 210 that has an output leading to a node 252, which defines an input to flip flop 212, and is coupled to a pin D_{I/O} leading to the memory core. This flip flop 212 is also coupled to node 242, and has an output coupled to a node 236. Node 236 leads to an output pin DQ₀, as well as defining an input to a tristate buffer 220, which has an output defined at a node 250. In this embodiment, tristate buffer 220 is shown receiving a control input from NOR gate 214.

Node 250 is shown coupled to an output pin Q₀, as well as defining an output node for a tristate buffer 218. In this embodiment, tristate buffer 218 has a control input driven by NOR gate 216 at a node 240, and has an input being received from pin Q_{I/O} that is received from the memory core. Still further, pin TD represents the test data bus, pin D represents the mission mode data bus, and Q represents the output bus. It should be appreciated that pins TD, D and Q may be replicated any number of times depending on the bus width and therefore, MUX 210, flip flop 212, tristate buffer 220, and tristate buffer 218, may likewise be replicated any number of times, and driven accordingly by NOR gates 214 and 216 to complete the desired test.

As will be appreciated by those skilled in the art, UTI 206 provides a logic MUX 210 on all inputs to allow all test operations to occur outside of the critical paths of a mission mode operation. Therefore, this enables the inclusion of a memory test bus without impacting the operating speed of a memory core that includes UTI 206 integrated thereon. It is further noted that UTI 206 includes D-type flip flops 212 in parallel with the inputs, which advantageously enables full scan testing capabilities in designs that incorporate scan testing methodologies. Furthermore, the preferred combination of input multiplexors 210 and embedded flip flops 212 provide all of the critical path logic necessary for implementing, among others, serial test methodologies, and BIST memory testing methodologies.

Because of UTI 206 provides a powerful logic interface that is modular in many respects, designers are provided with an interface that is programmable to meet their preferred testing methodologies. In this manner, a designer can simply perform minor electrical interconnections among the UTI 206 input/output pins, and/or simply connect the UTI 206 to the designer's most preferred test controller. The following examples are provided to illustrate the programmability and modularity of UTI 206 when configured to operate under exemplary testing methodologies, however, it should be understood that UTI 206 may be configured to operate in more than one test methodology at one time, as well as in other testing methodologies not described herein. By way of example, UTI 206 is typically wired to operate under one specific memory testing methodology in addition to enabling scan testing.

Figure 3A:
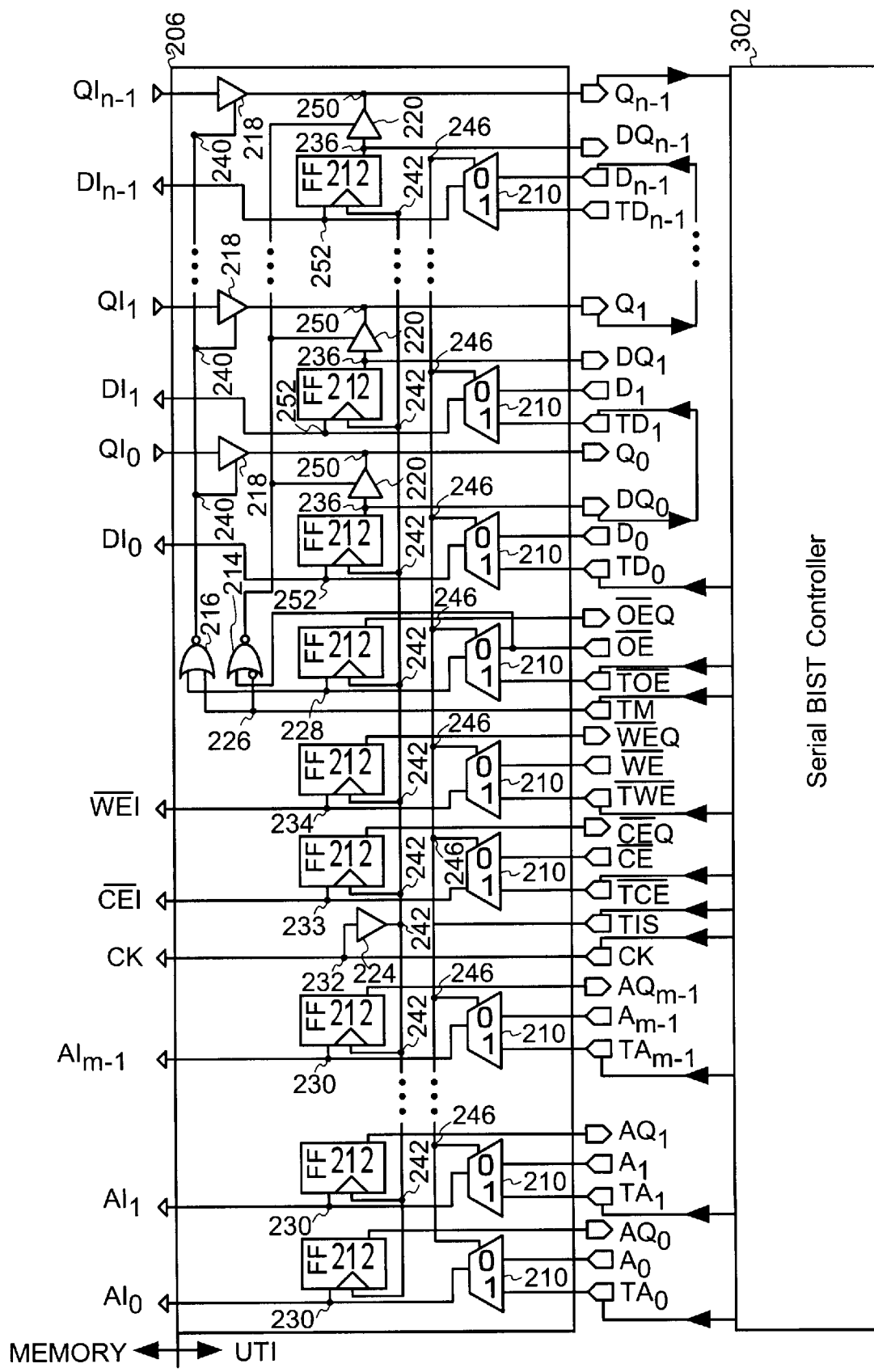
FIG. 3A shows the universal test interface being wired to perform a serial BIST memory test in accordance with one embodiment of the present invention.

With this in mind, FIG. 3A shows UTI 206 being wired to perform a serial BIST memory test in accordance with one embodiment of the present invention. As described above, UTI 206 may be used to perform any number of testing methodologies, and in this example, a serial BIST test methodology may be performed by coupling a serial BIST controller 302 to the illustrated input/output pins to drive the logic circuitry contained within UTI 206 during testing. For ease of reference, table 2 below provides the exemplary wiring descriptions for performing a serial BIST when UTI 206 is integrated into a desired integrated circuit application. Although UTI 206 may be integrated in any number of integrated circuit applications, UTI 206 will find particular usefulness in application specific integrated circuits (ASICs) of all types.

TABLE 2

SERIAL BIST
Exemplary Wiring Description

CONTROLLED INPUTS: TA(0:m-1), TCE_, TWE_, TOE_, TIS, CK, TM, TD(0)

| STROBED OUTPUTS: | Q(n-1)(only the most significant bit) |
| OTHER INPUTS: | ignored during Serial BIST test |
| OTHER OUTPUTS: | ignored during Serial BIST test |

Starting at Q(0), connect Q(i) to TD(i+1), continuing until TD(n-1). TD(0) is the serial data input point for the Serial BIST controller to drive. Q(n-1) is the effective serial output.

Inputs TCE_, TWE_, TOE_, TIS, CK, TM, TA(0:m-1) are driven "in parallel" by the Serial BIST controller.

In this example, pins TA₀, TA₁, TA_{m-1}, CK, TIS, /TCE, /TWE, TM, /TOE, and TD₀ all receive inputs driven by serial BIST controller 302. To complete the wiring for serial BIST testing methodologies, Q₀ is coupled to TD₁, and this is repeated for the entire bus up to the example of Q₁, which is coupled to D_{n-1}. Finally, pin Q_{n-1} provides an output which is received by the serial BIST controller 302.

Figure 3B:
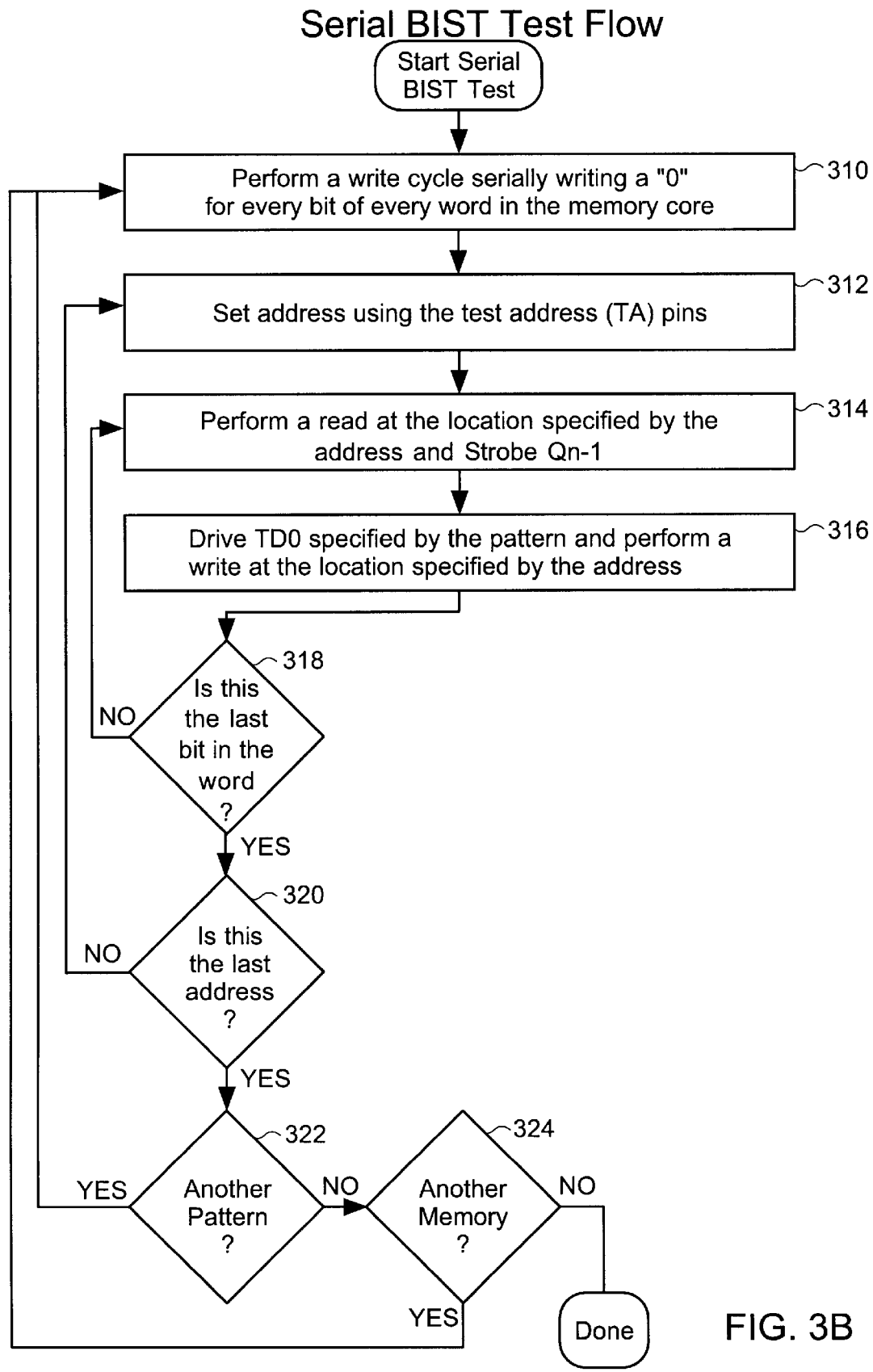
FIG. 3B is a flowchart illustrating the method operations that may be carried out in performing a serial BIST testing methodology, using the universal test interface in accordance with one embodiment of the present invention.

FIG. 3B is a flowchart illustrating the method operations that may be carried out in performing a serial BIST testing methodology using UTI 206 in accordance with one embodiment of the present invention. The method beings at an operation 310 where a write cycle is performed serially writing a "0" for every bit of every word in a memory core. Once every bit of every word has been serially written with "0" data, the method will proceed to an operation 312 where the address is set using the TA pins of the UTI 206 in accordance with one embodiment of the present invention. Next, the method will proceed to an operation 314 where a read at the location specified by the address and the strobe Q_{n-1} is performed. After the read is performed, the method proceeds to an operation 316 where TD₀ is driven by the pattern, and a write at the location specified by the address is performed.

The method then proceeds to a decision operation 318 where it is determined if the current bit is the last bit in the word. If the current bit is not the last bit in the word, the method will revert back to operation 314 where a read at the location specified by the address and the strobe Q_{n-1} is again performed. At this point, the method will proceed through operation 316 as described above, and then proceed back to operation 318, where it is again determined if the current bit is the last bit in the word. When the last bit is reached, the method will proceed to another decision operation 320, where it is determined if the current address is the last address in the memory. If it is not the last address in the memory, the method will proceed back through operations 312, 314, 316, 318, and then back to operation 320.

Once it is determined in operation 320 that the current address is the last address in the memory, the method will proceed to a decision operation 322 where it is determined if the user/designer desires to test the current memory with another test pattern. If other test pattern testing is desired, the method will proceed back through operations 310, 312, 314, 316, 318, 320, and then back to operation 322. When the number of desired test patterns have been run, the method will proceed to an operation 324, where it is determined if the user/designer desires to test other memories. If other memory testing is desired, the method will again proceed through operations 310, 312, 314, 316, 318, 320, 322 and 324 until all desired memories have been tested, and the method will end. For another more detailed illustration of one exemplary serial BIST testing operation, reference may be made to Appendix A provided below.

Figure 4A:
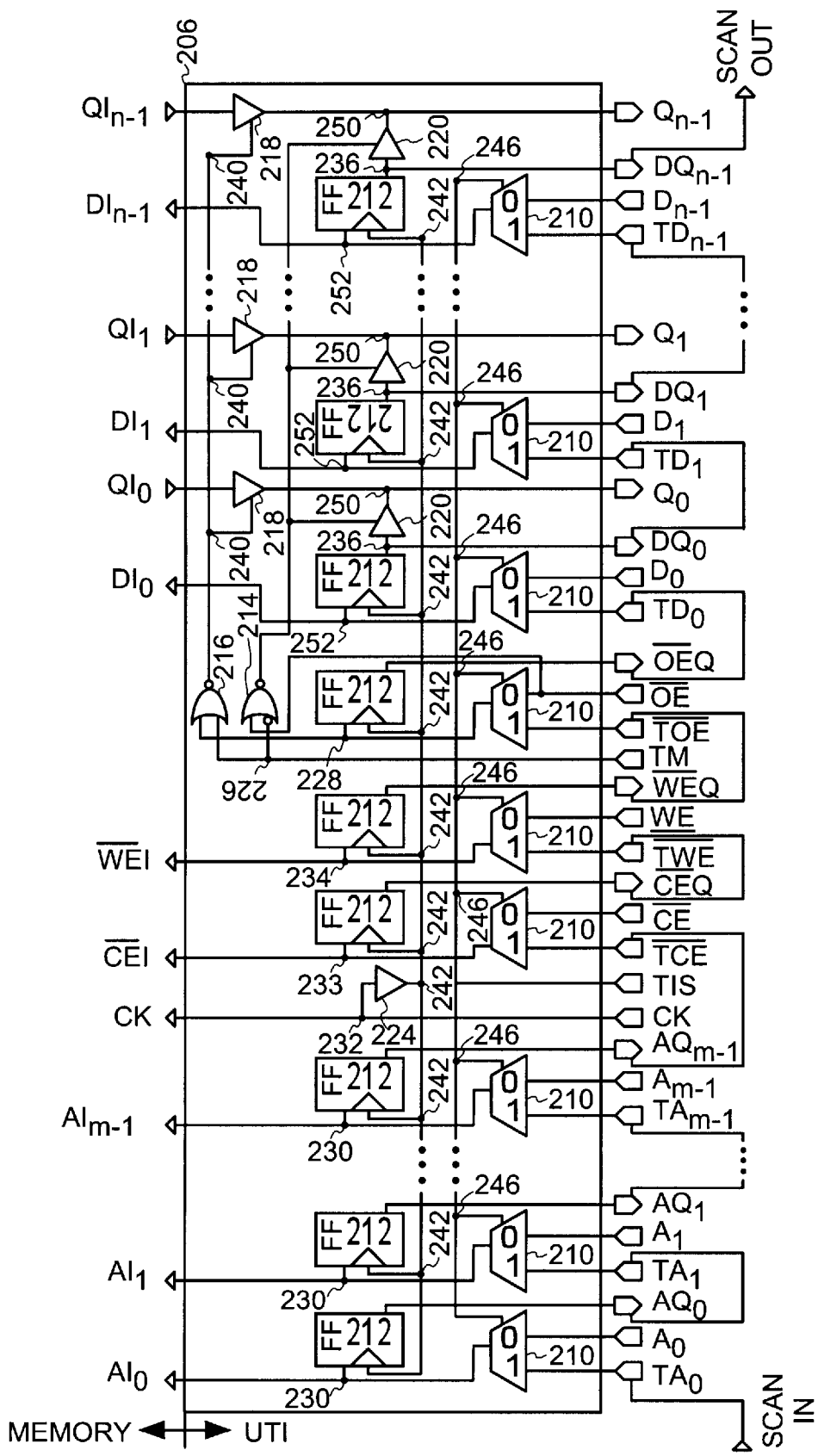
FIG. 4A is a detailed illustration of the preferred wiring interconnections that may be performed to implement the universal test interface for scan testing in accordance with one embodiment of the present invention.

FIG. 4A is a detailed illustration of the preferred wiring interconnections that may be performed to implement UTI 206 for scan testing in accordance with one embodiment of the present invention. In this example, a scan vector pattern is typically provided through a "scan in" node (e.g., the "scan in" node is typically connected to a pad on the ASIC chip) that leads into pin $TA_0$. Therefore, pin $TA_0$ defines the effective "scan in" for the memory. Next, pin $AQ_0$ is coupled to pin $TA_1$. Pin $AQ_1$ is coupled to a pin $TA_{m-1}$. Pin $AQ_{m-1}$ is coupled to pin /TCE. Pin /CEQ is coupled to pin /TWE. Pin /WEQ is coupled to pin /TOE. Pin /OEQ is coupled to pin $TD_0$. Pin $DQ_0$ is coupled to pin $TD_1$. Pin $DQ_1$ is coupled to pin $TD_{n-1}$. Finally, pin $DQ_{n-1}$ defines the effective output of the scan chain that leads to a "scan out" pin. In general, inputs TIS, CK, and TM are driven in parallel during load and shift out cycles. Further, all mission mode inputs are driven in parallel during a functional cycle.

As is well known in the art, the function of a scan test is not to test the actual memory core that is integrated to UTI 206, but is to test the wire routing and chip logic preceding the core memory inputs and following the core memory outputs. In addition, all storage elements inside a particular application specific integrated circuit (ASIC) also typically have "scan in" and "scan out" pins that may also be serially chained to form one long uninterrupted scan chain which is used during the scan test operation. As shown in table 3 below, the exemplary wiring description for a scan test is provided for ease of reference.

TABLE 3

SCAN TEST
Exemplary Wiring Description

CONTROLLED INPUTS: TA(0) TM, TIS, CK, A(0:m-1), CE__, WE__, OE__, D(0:n-1)

STROBED OUTPUTS: DQ(n-1), Q(0:n-1)
OTHER INPUTS: All inputs should be listed above or wired as shown below.
OTHER OUTPUTS: All outputs should be listed above or wired as shown below.

Connect serial input to TA(0), this input is the effective "scan in" for the memory.
Starting at AQ(0), connect AQ(i) to TA(i+1) continuing until TA(m-1).
Connect AQ(m-1) to TCE__
Connect CEQ__ to TWE__
Connect WEQ__ to TOE__
Connect OEQ__ to TD(0)
Starting at DQ(0), connect DQ(i) to TD(i+1) continuing until TD(n-1)
DQ(n-1) is the effective "scan out" pin for the memory.
Inputs TIS, CK, TM are driven "in parallel" during load shift out cycles.
All mission mode inputs are driven "in parallel" during the functional cycle.

Figure 4B:
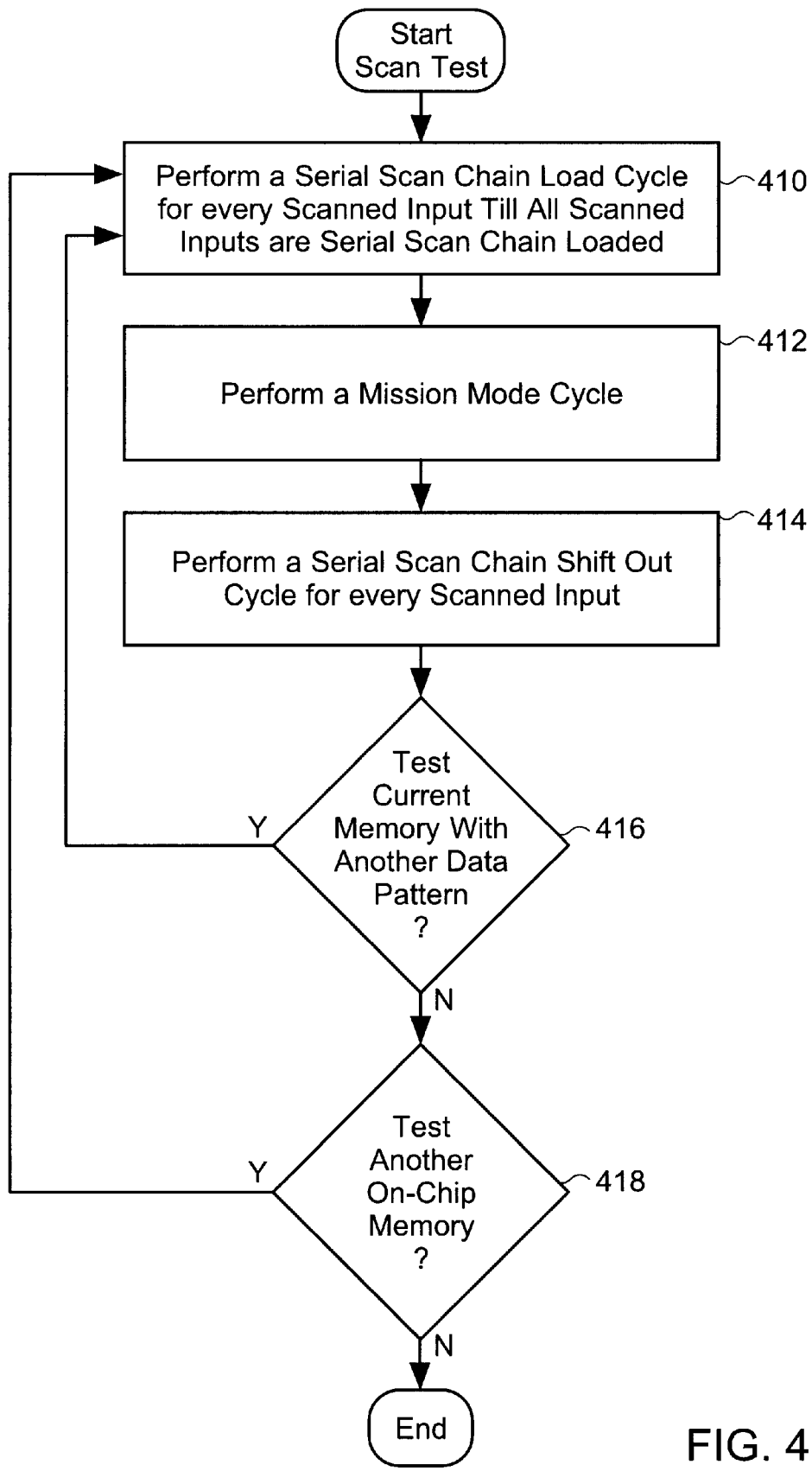
FIG. 4B is a flowchart illustrating the method operations that may be performed during a scan test implemented through the universal test interface in accordance with one embodiment of the present invention.

FIG. 4B is a flowchart illustrating the method operations that may be performed during a scan test implemented through UTI 206 in accordance with one embodiment of the present invention. The clock is "CK" pulsed for the entire scan test. The output enable pin "/OE" is set valid which enables only one memory at a time when the output bus is a shared bus. Also, test mode "TM" is set to "1", which requires it to be high for the entire scan test. Once these parameters are set, the scan test method will begin at an operation 410 where a serial scan chain load cycle is performed for every scanned input until all scan inputs are serial scan chain loaded. In general, this operation loads the memory scan chain elements with data.

Because scan element outputs are meant to supply stimulus to other elements in parallel during a functional phase (i.e., mission mode), the scan flip flops 212 are loaded with special values provided by a scan test controller (not shown). Once the load cycle in operation 410 is complete, the method will proceed to an operation 412 where a mission mode cycle is performed. By way of example, when the clock CK rises, all of the scan flip flops 212 will slave, and the stages will be overwritten. Further, the Q outputs will also disappear, and their special scan vector will have been captured by whatever storage elements are down stream of the Q outputs.

Once the mission mode cycle is complete in operation 412, the method will proceed to an operation 414 where a serial scan chain "shift out" cycle is performed for every scanned input. In general, the shift out operation generally verifies the functional cycle performed in operation 412. Once the shift out cycle has been performed for every scanned input in operation 414, the method will proceed to a decision operation 416 where it is determined if the user/designer desires to test the current memory with another data pattern. If it is determined that another data pattern will be implemented to test the current memory, the method will again proceed through operations 410, 412, 414, and 416.

When the user/designer no longer desires to test the current memory with additional data patterns, the method will proceed to decision operation 418 where it is determined if another on-chip memory is to be tested. If scan testing is desired for additional on-chip memories, the method will proceed back through operations 410, 412, 414, 416, and then back to operation 418. When the user/designer no longer desires to test other on-chip memories with a scan test, the method will end. For a more detailed illustration of the method operations that may be performed when carrying out a scan test in accordance with one embodiment of the present invention, reference may be made to Appendix B provided below.

Figure 5A:
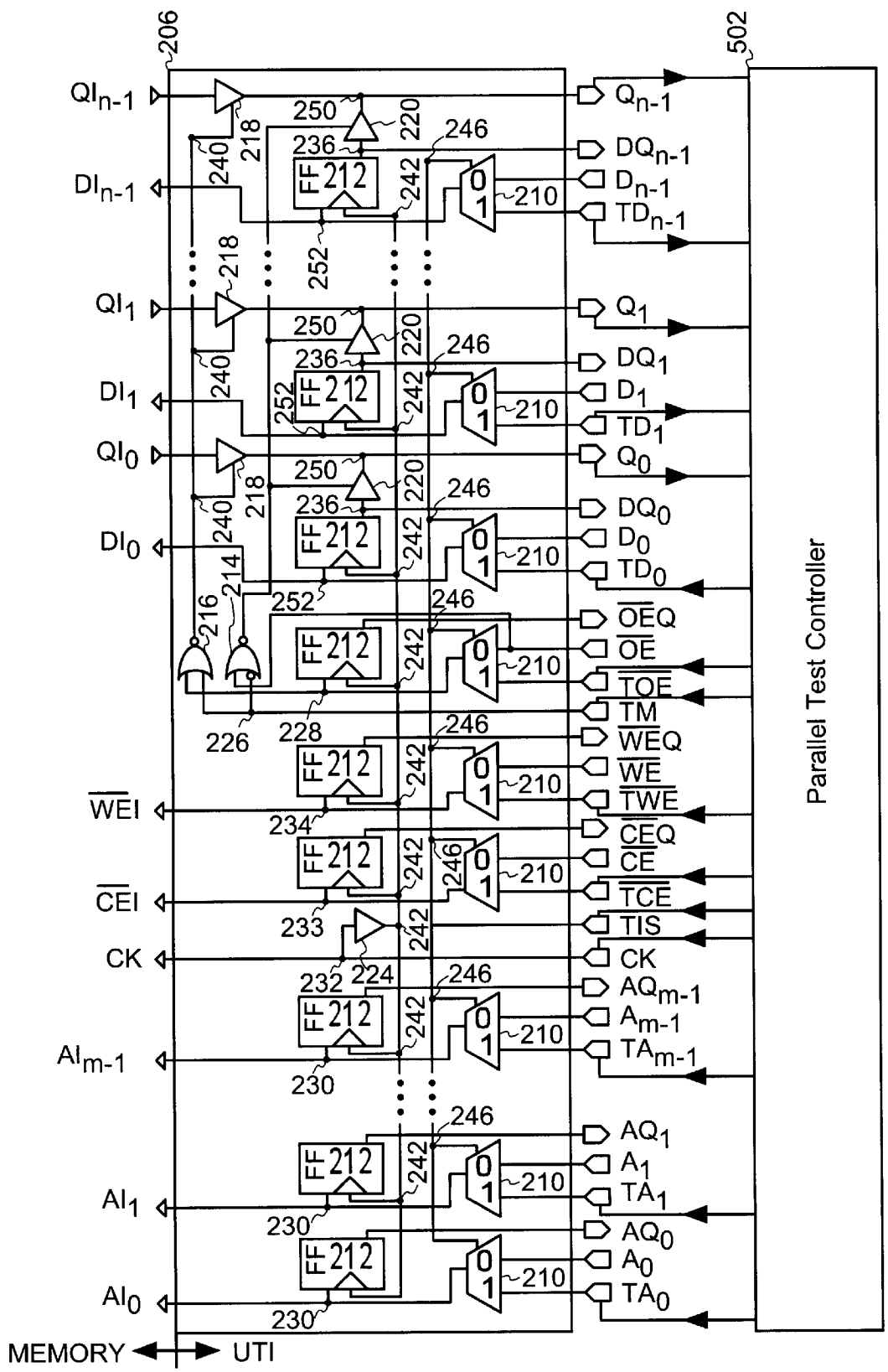
FIG. 5A shows the exemplary interconnections performed to configure the universal test interface to perform a parallel test methodology in accordance with one embodiment of the present invention.

FIG. 5A shows the exemplary interconnections performed to configure UTI 206 to perform a parallel testing methodology with a parallel test controller 502 in accordance with one embodiment of the present invention. As shown, pins $TA_0$, $TA_1$, $TA_{m-1}$, CK, TIS, /TCE, /TWE, TM, /TOE, $TD_0$, $TD_1$, and $TD_{n-1}$ are all driven as inputs from parallel test controller 502. In a like manner, pins $Q_0$, $Q_1$, and $Q_{n-1}$ are all shown as outputs from UTI 206 leading to parallel test controller 502 where testing analysis may be performed. For more information on the exemplary wiring implemented for performing a parallel testing methodology with UTI 206, reference may be made to table 4 below which provides a more detailed exemplary wiring description.

TABLE 4

PARALLEL TEST/MUX ISOLATION
Exemplary Wiring Description

| CONTROLLED INPUTS: | TA(0:m-1), TCE__, TWE__, TOB__, TIS, CK, TM, TD(0:n-1) |
|---|---|
| STROBED OUTPUTS: | Q(0:n-1) |
| OTHER INPUTS: | ignored during parallel test |
| OTHER OUTPUTS: | ignored during parallel test |

Connect (test circuit or stimulus) to controlled inputs and strobed outputs above.

Figure 5B:
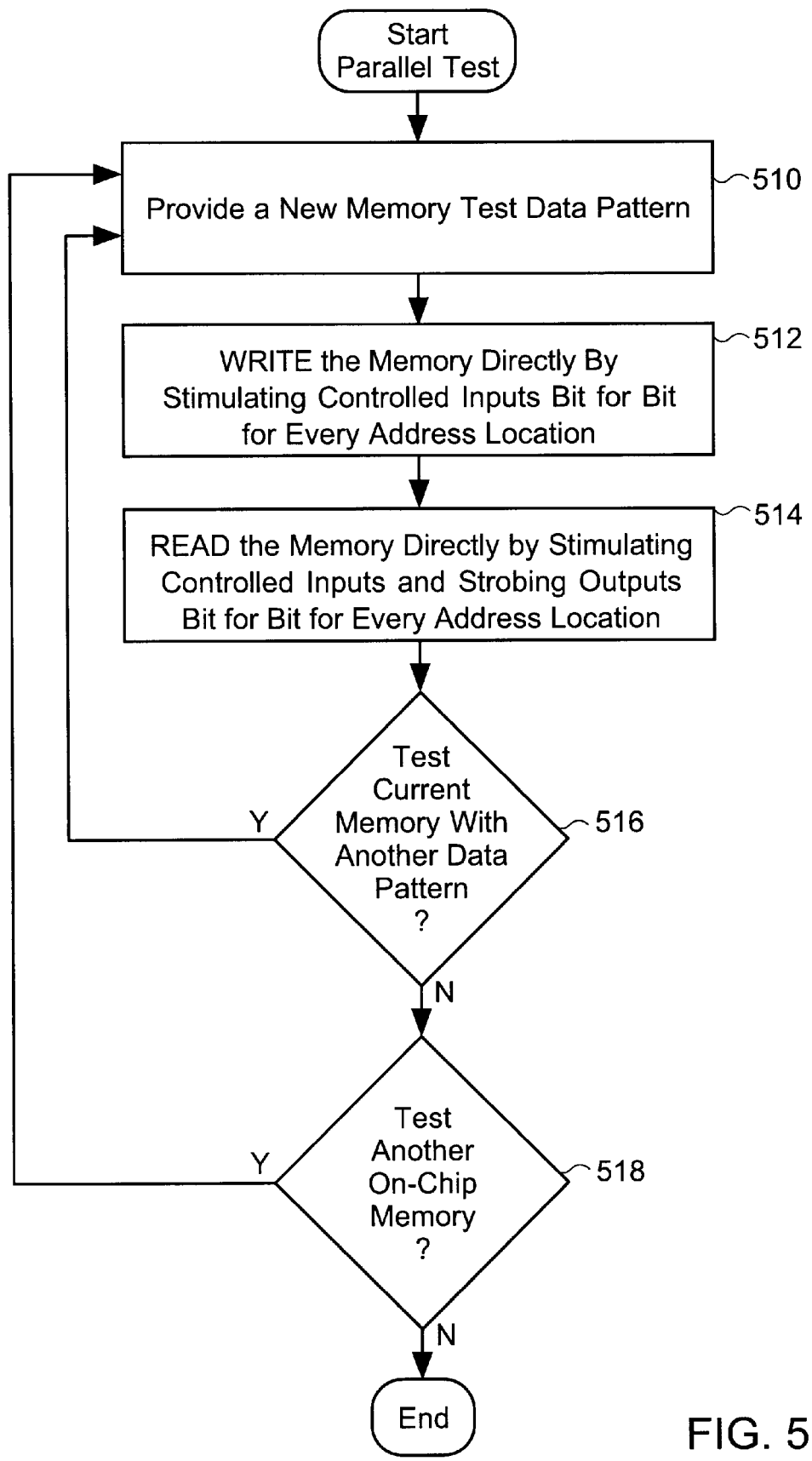
FIG. 5B is a flowchart illustrating the method operations that may be performed when implementing the universal test interface in a parallel test methodology in accordance with one embodiment of the present invention.

FIG. 5B is a flowchart illustrating the method operations that may be performed when implementing UTI 206 in a parallel test methodology in accordance with one embodiment of the present invention. For a parallel test, pin TM is preferably set to "0," which indicates that the Q's are not driven by the data scan flip flops 212. Pin TIS is set to "1," which indicates that the test inputs are selected for the entire parallel test. Further, CK is pulsed for the entire test. /TOE is set to "0" which enables the outputs of only the memory under test, all other memories or elements that share the bus with the memory must be disabled. Finally, /TCE is set to "0," which enables the selected memory for the entire test.

Once the above parameters are set, the method begins at an operation 510 where a new memory test data pattern is provided by the parallel test controller 502 of FIG. 5A. After the memory test data pattern has been provided, the method will proceed to an operation 512 where the memory is written directly by stimulating controlled inputs bit for bit for every address location in the memory under test. After the memory has been written bit for bit for every address location in operation 512, the method will proceed to an operation 514 where the memory is read directly by stimulating controlled inputs and strobing outputs bit for bit for every address location. The strobing therefore checks the memory contents that were previously written in operation 512. Once the memory has been read bit for bit for every address location in operation 514, the method will proceed to a decision operation 516 where it is determined if the user/designer desired to test the current memory with another data pattern.

If it is determined that testing is desired with another data pattern, the method will revert back to operation 510 where the memory is provided with a new test data pattern. Once the new test data pattern has been provided in operation 510, the method will proceed through operations 512, 514, and then back to operation 516. When the user/designer no longer desires to test the current memory with further data patterns, the method will proceed to a decision operation 518 where it is determined if the user/designer desires to test another on-chip memory with the parallel testing methodology. If testing other on-chip memories with the parallel test methodology is desired in operation 518, the method will proceed through operations 510, 512, 514, 516, and then back to 518. When the user/designer no longer desires to test additional on-chip memories, or no on-chip memories remain to be tested, the method for parallel testing methodology will end. For a more detailed example of a parallel testing methodology, reference may be made to Appendix C provided below.

In yet anther embodiment, the parallel test methodology described with reference to the flowchart of FIG. 5B may also be used to perform a "parallel BIST" testing methodology, provided that the controlling and strobing is performed by on-chip circuitry that is external to UTI 206.

Figure 6A:
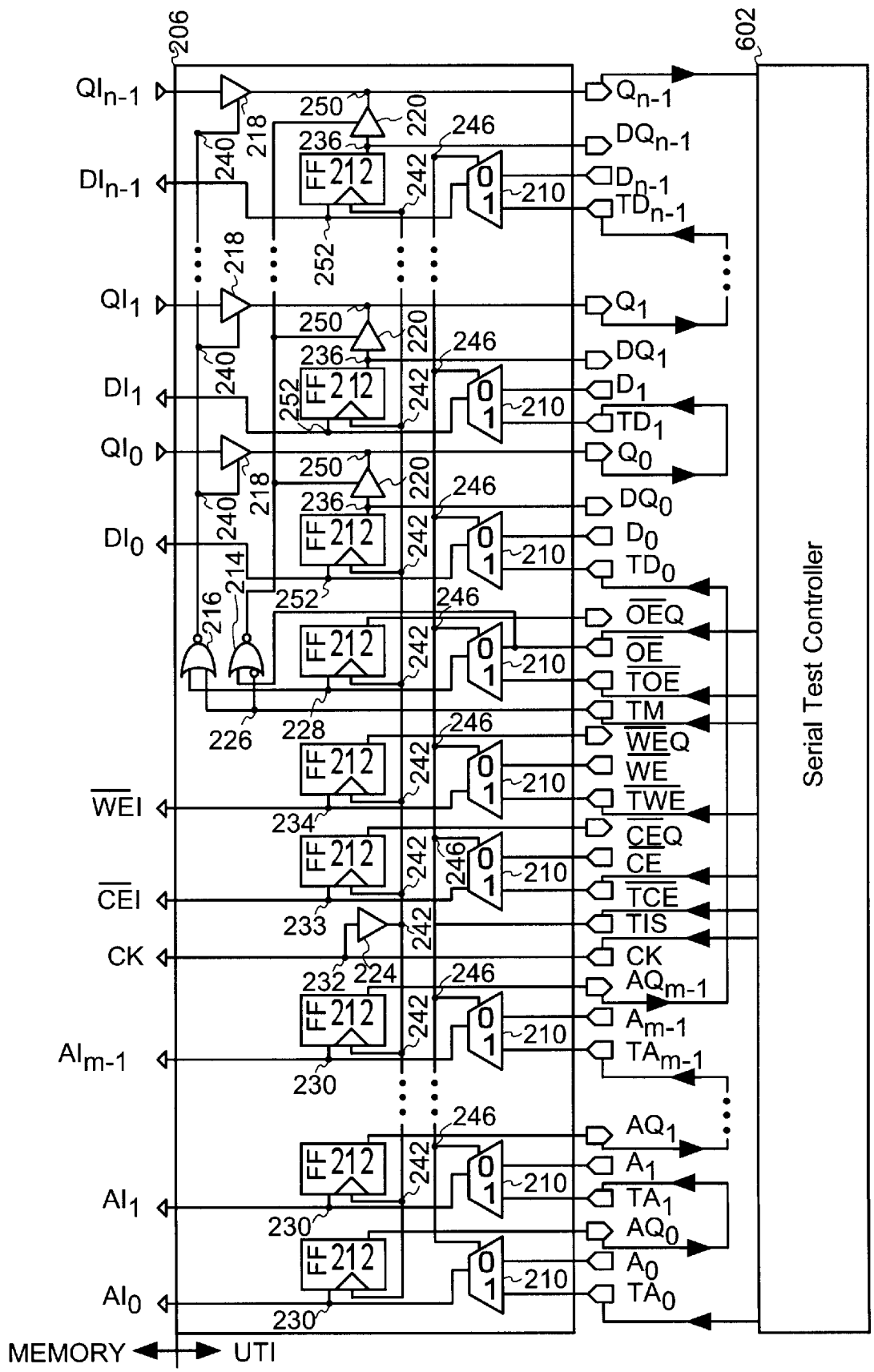
FIG. 6A shows the exemplary wiring configuration of the universal test interface for conducting a serial test methodology in accordance with one embodiment of the present invention.

FIG. 6A shows the exemplary wiring configuration of UTI 206 for conducting a serial test when coupled to a serial test controller 602 in accordance with one embodiment of the present invention. In this example, pins $TA_0$, CK, TIS, /TCE, /TWE, TM, /TOE, and /OE are all provided as inputs into UTI 206 from the serial test controller 602. Further, to perform a serial test methodology with UTI 206, pin $AQ_0$ is coupled to pin $TA_1$. Pin $AQ_1$ is coupled up to pin $TA_{m-1}$. Pin $AQ_{m-1}$ is coupled to $TD_0$. Pin $Q_0$ is coupled to $TD_1$. $Q_1$ is coupled up to pin $TD_{n-1}$, and $Q_{n-1}$ is the output provided by UTI 206 leading to serial test controller 602. For a more detailed description of the exemplary wiring of UTI 206, reference may be made to table 5 below.

TABLE 5

SERIAL TEST
Exemplary Wiring Description

| | |
|---|---|
| CONTROLLED INPUTS: | TA(0), TCE_, TWE_, TOE_, OE_, TIS, CK, TM |
| STROBED OUTPUTS: | Q(n−1) - just the last bit |
| OTHER INPUTS: | ignored during serial test |
| OTHER OUTPUTS: | ignored during serial test |

Connect serial input (test circuit or stimulus) to TA(0).
Starting at AQ(0), connect AQ(i) to TA(i+1), continuing until TA(m−1).
Connect AQ(m−1) to TD(0).
Starting at Q(0), connect Q(i) to TD(i+1), continuing until TD(n−1).
TA(0) is the effective serial address and data input.
Q(n−1) is the effective serial output (test circuit or strobe point).
Inputs TCE_, TWE_, TOE_, OE_, TIS, TM, and CK are controlled "in parallel"

Figure 6B:
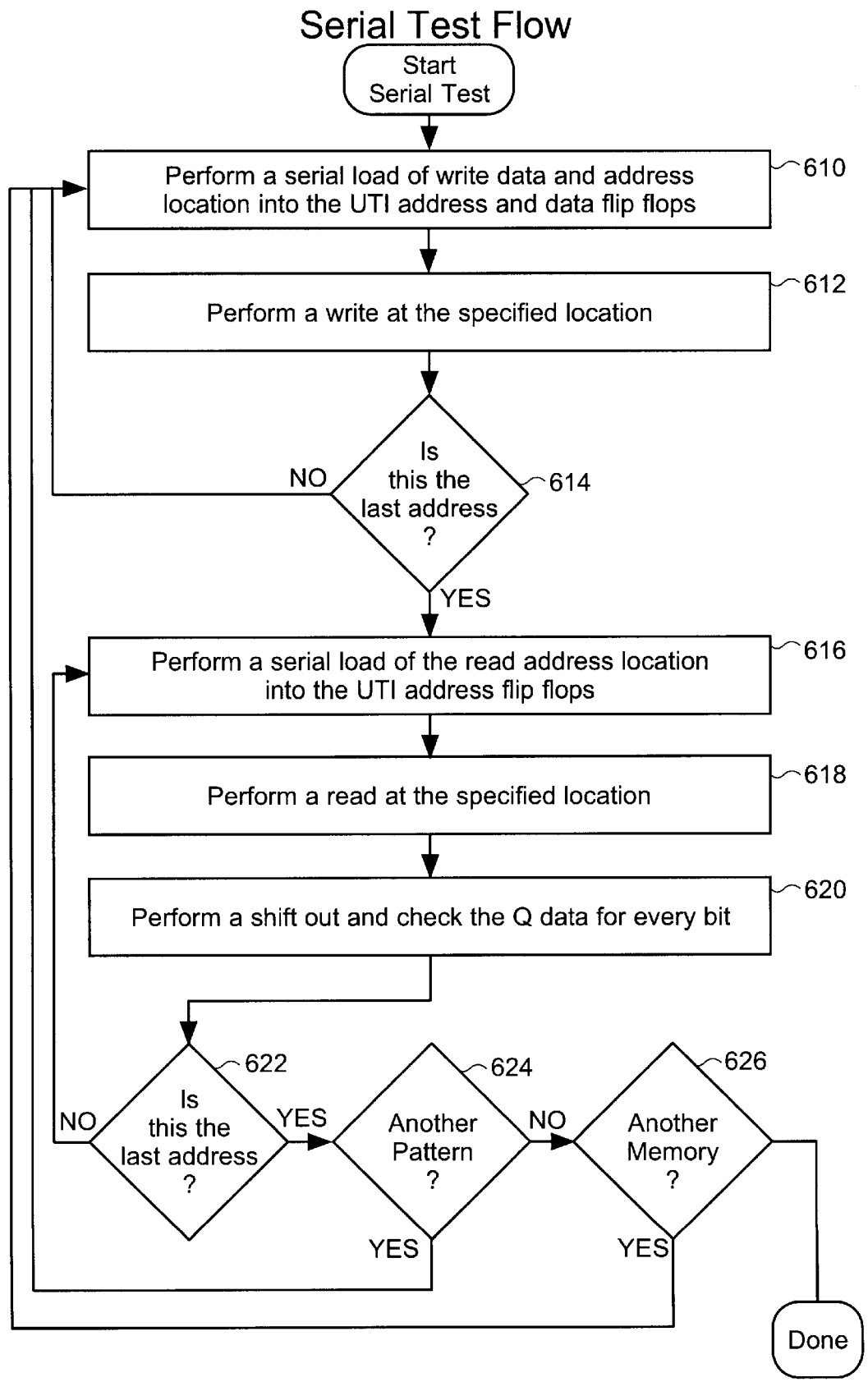
FIG. 6B is a flowchart illustrating the method operations that may be implemented when the universal test interface is used for serial testing methodologies in accordance with one embodiment of the present invention.

FIG. 6B is a flowchart illustrating the method operations that may be implemented when UTI 206 is used for serial testing methodologies in accordance with one embodiment of the present invention. Initially, pin TIS is set to "1," which requires the test inputs to be selected for the entire serial test. CK is pulsed for the entire serial test. Finally, output enable "/OE" is set to "0," which enables only the current memory under test to be tested for the serial test when the Q bus is a shared bus (e.g., all other elements that share bus must be disabled).

In this embodiment, the serial test begins at an operation 610 where a serial load of write data and address location is performed into the UTI address and data flip flops. After the write data and address has been loaded during operation 610, the memory location specified by the address, that has been shifted in, is written during an operation 612. The method then proceeds to a decision operation 614 where it is determined is the entire memory contains valid data. If the memory is full, the method will proceed to a read phase that includes operations 616, 618 and 620 as will be described below.

On the other hand, if the memory is not full, the method will proceed back through operations 610 and 612, and then back to operation 614. Once the write phase is complete, the method will proceed to the read phase. Initially, the read phase begins at an operation 616 where the read address location is shifted into the UTI 206 address flip flops 212. The method then proceeds to an operation 618 where the data from the location specified by the address location, and loaded into the address flip flops, is read and loaded into the UTI 206 data flip flops 212. After the UTI 206 flip flops 212 are loaded with the memory read data, a serial shift operation is performed at an operation 620 to check the memory contents.

The method then proceeds to an operation 622 where it is determined if all address locations in the memory have been read. Therefore, if the entire memory has been read, the method will proceed to an operation 624, where it is determined if the user/designer desires to test with further memory patterns. On the other hand, if it is determined in operation 622 that there are more addresses to be read, the method will proceed back through operations 616, 618, and 620. Referring back to operation 624, if it was determined that testing with further patterns was desired, the method will proceed back through operations 610, 612, 614, 616, 618, 620, 622, and then back to 624. Once all desired patterns have been run, the method will proceed to an operation 624 where it is determined if the user/designer desires to test other on-chip memories with the serial test. If the user/designer does desire to test other on-chip memories, the method will again proceed through operations 610, 612, 614, 616, 618, 620, 622, 624 and then back to 626. When no further on-chip memory testing is desired, the method will end. For a more detailed example of a serial test performed using UTI 206, reference may be made to Appendix D provided below.

Figure 7:
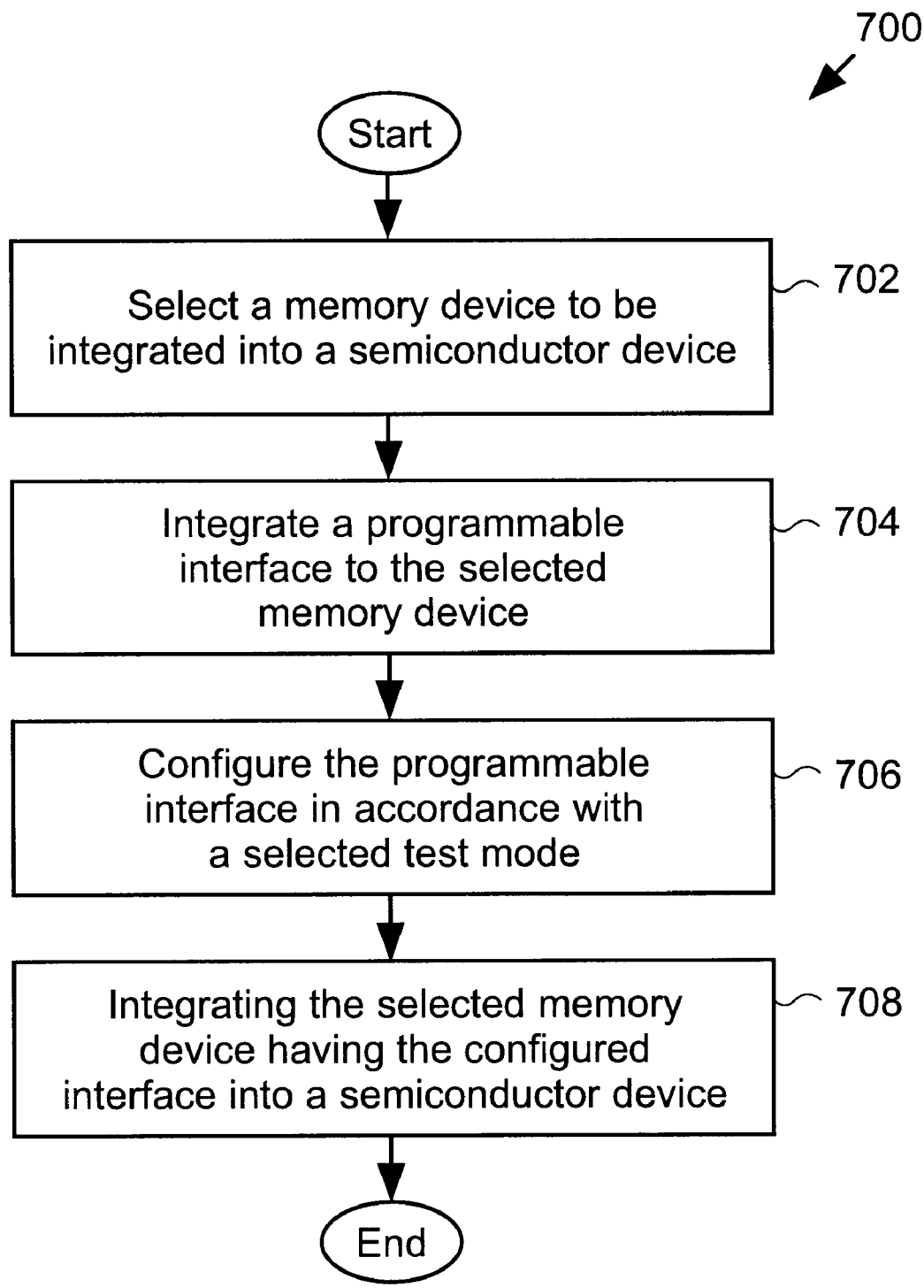
FIG. 7 is a flowchart illustrating the method operations that may be implemented in integrating the universal test interface into a semiconductor chip in accordance with one embodiment of the present invention.

FIG. 7 is a flowchart 700 illustrating the method operations that may be implemented to integrate the universal test interface into a semiconductor chip in accordance with one embodiment of the present invention. The method begins at an operation 702 where a designer selects a memory device to be integrated into a semiconductor device. By way of example, the semiconductor device may be in the form of an application specific integrated circuit (ASIC), or any other integrated circuit design. Next, the method proceeds to operation 704 where a programmable interface (e.g., UTI 206) may be integrated to the selected memory device. Once integrated, the method proceeds to an operation 706 where the programmable interface is configured in accordance with one or more selected test modes. As described above, the selected test modes may include, but are not limited to, a serial built-in-self-test (BIST), a parallel BIST, a parallel test, a serial test and a scan test.

The method then proceeds to an operation 708 where the selected memory having the configured interface is integrated into a semiconductor device. Once integrated, the semiconductor device may be packaged and subsequently tested by way of one or more input/output pads leading to internal logic circuitry designed on the semiconductor device.

Figure 8:
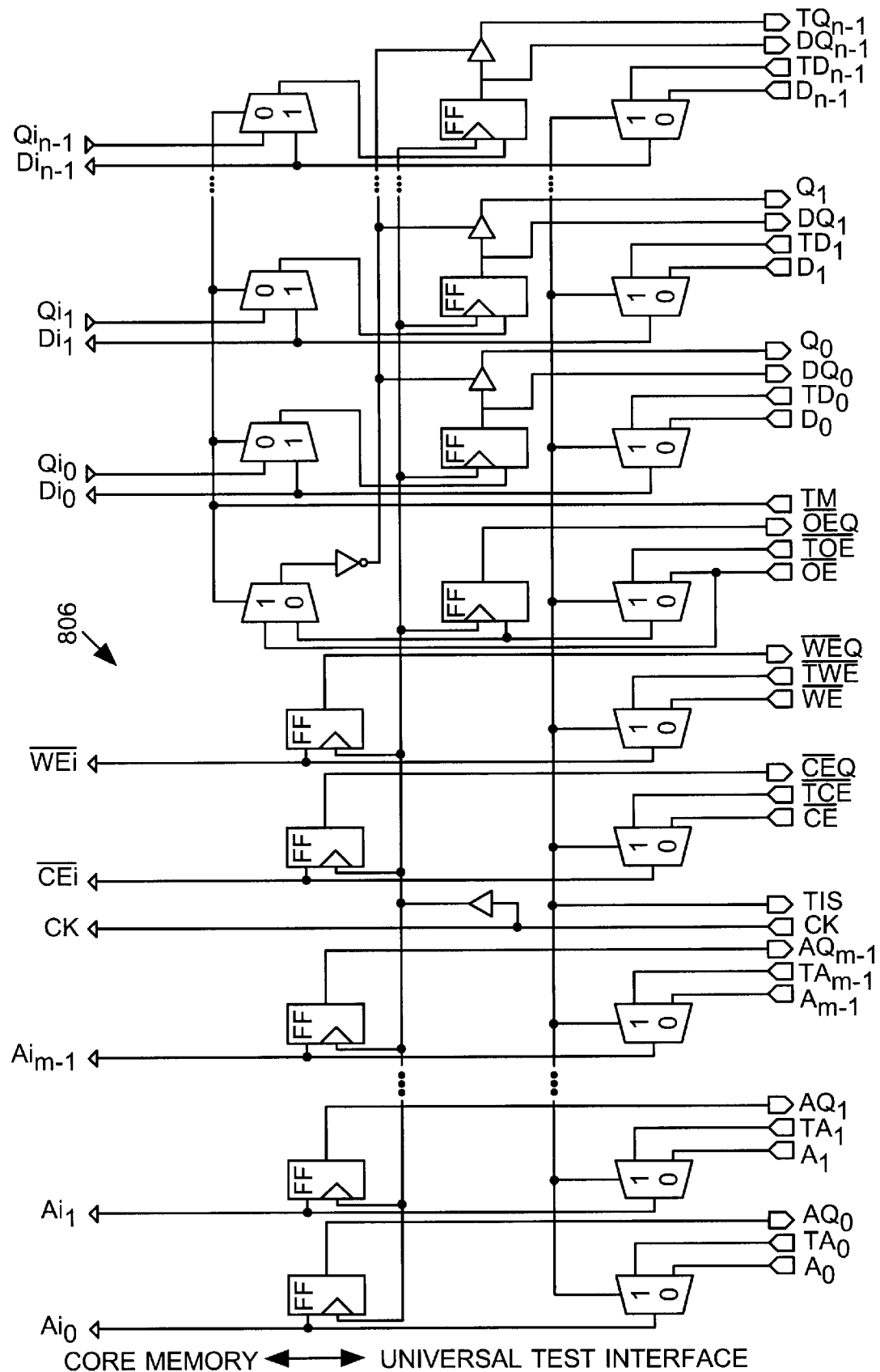
FIG. 8 is a general logic diagram for a pipeline universal test interface in accordance with one alternative embodiment of the present invention.

FIG. 8 is a general logic diagram for a pipeline universal test interface 806 in accordance with one alternative embodiment of the present invention. In this embodiment, for those desiring to achieve fast access time with respect to the clock signal, flip flops may be placed immediately after the core memory output. In this manner, the flip flop registers will provide data from a read or write operation soon after the clock pulse, following the pulse in which the operation was triggered. Accordingly, the memory outputs in this embodiment are advantageously accessed with only one clock cycle of latency.

With only minor modifications to UTI 206, the UTI 806 may be optimized to update the memory outputs in a pipelined fashion, while only experiencing one clock cycle of latency. To save area and lower performance impact, the pipeline stage (i.e., also called register stage) flip flops may be embedded into the UTI 806 as shown.

Furthermore, the pipeline stage flip flops may have their inputs multiplexed between the effective data input or the core memory output. With this input multiplexing feature, the UTI 806 pipeline flip flop may be advantageously re-used to perform serial operations, such as, for example, scan and serial test load and shift out, as well as parallel and mission mode operations.

Figure 9:
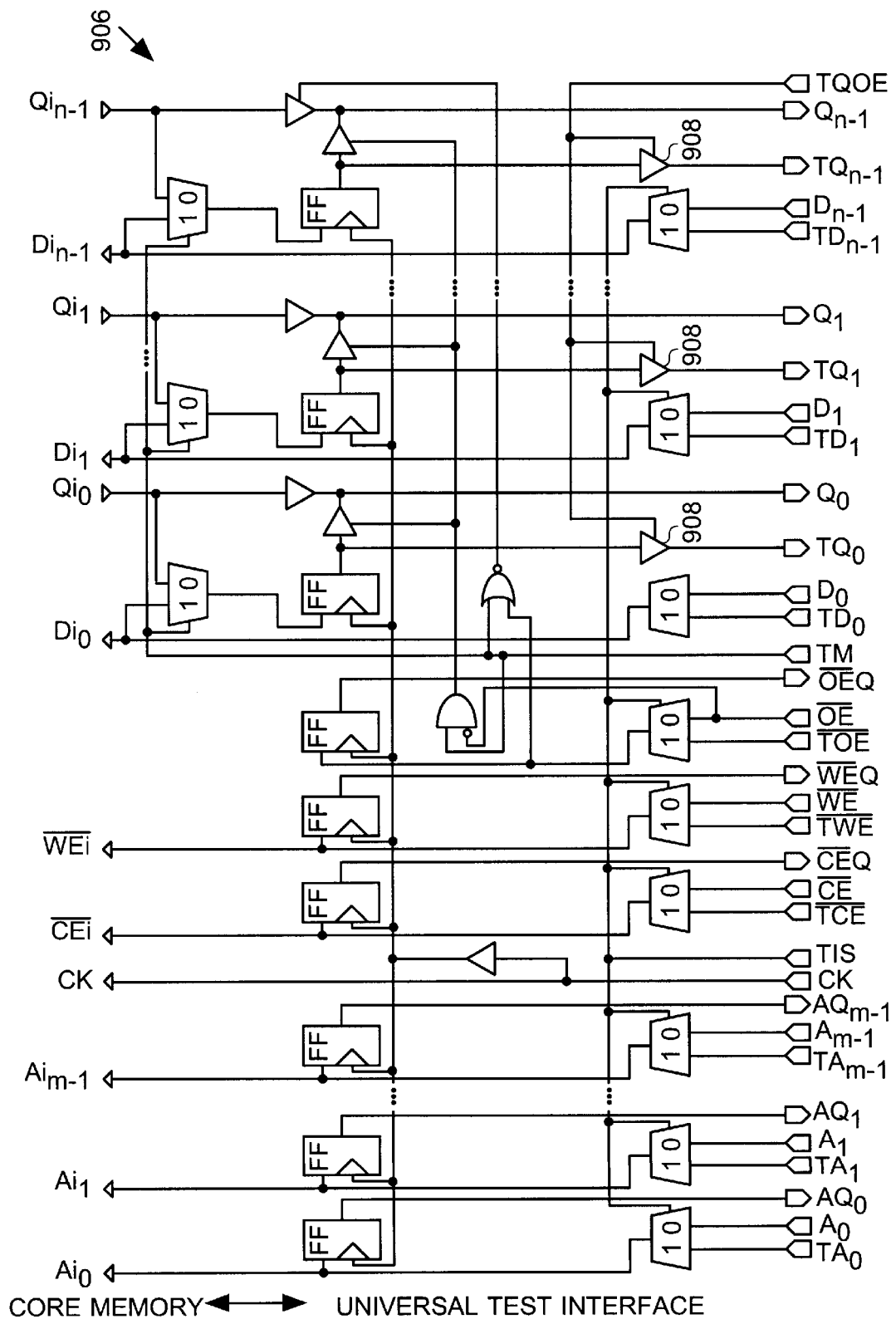
FIG. 9 is a general logic diagram for a dedicated test output universal test interface in accordance with another alternative embodiment of the present invention.

FIG. 9 is a general logic diagram for a dedicated test output universal test interface 906 in accordance with another alternative embodiment of the present invention. In this embodiment, in order to achieve independence of a chip test output bus and mission mode output bus, a dedicated test output bus, TQ, may be added to UTI 906 as shown. For example, TQ may have its own tristate enable input pin, /TQOE. However, it should be understood that /TQOE is not part of the scan chain since it is not a mission mode signal.

In this embodiment, the output bus tristate buffer 908 may follow a flip flop that may have its input multiplexed between the effective data input or the core memory output, as described above with respect to the pipelined operation of FIG. 8. Therefore, the DQ pin of UTI 206 may be redundant for certain tests, and may be removed if desired.

Figure 10:
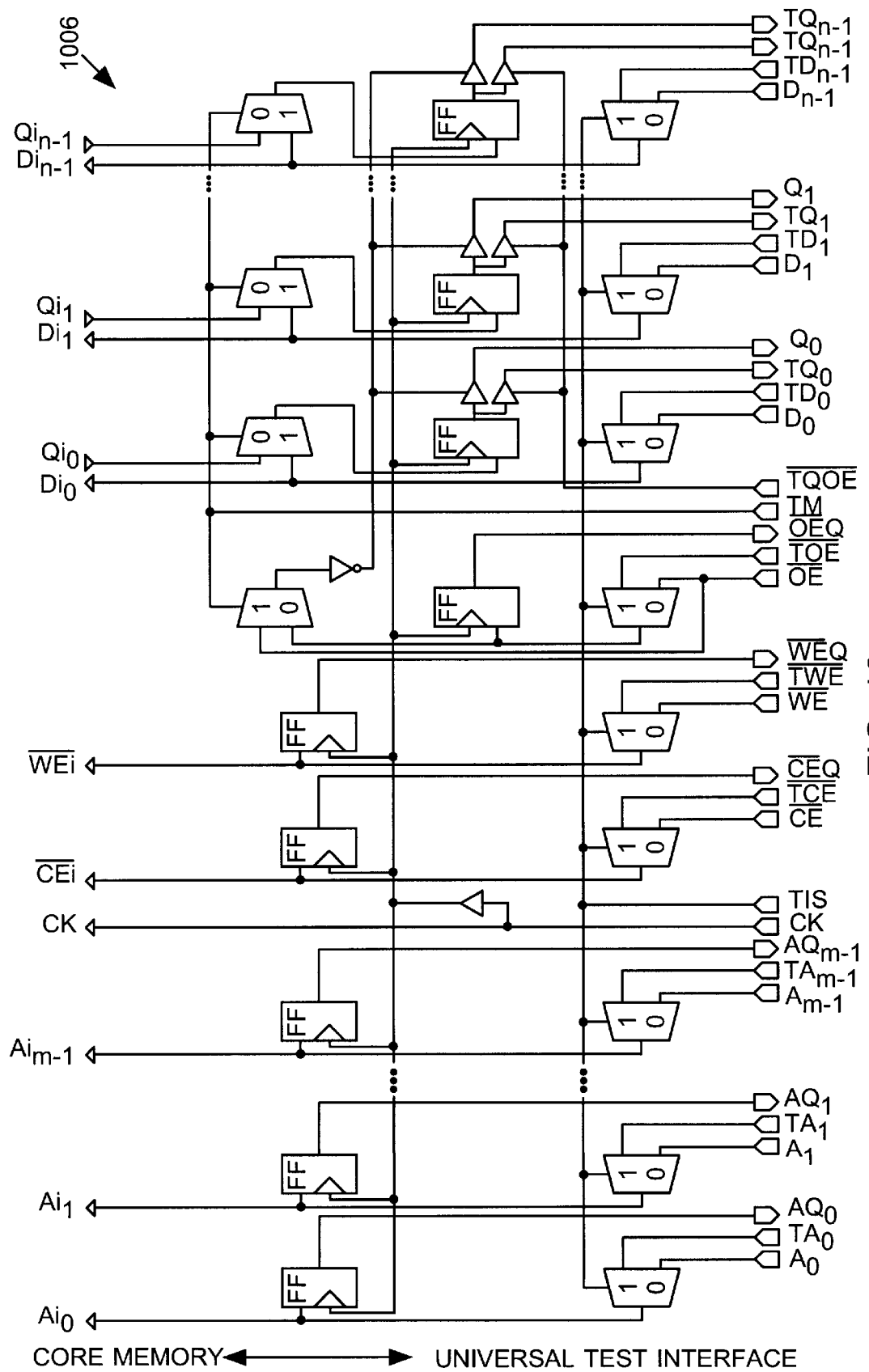
FIG. 10 is a general logic diagram illustrating a universal test interface in accordance with yet another alternative embodiment of the present invention.

FIG. 10 is a general logic diagram illustrating a universal test interface 1006 in accordance with yet another alternative embodiment of the present invention. In this embodiment, UTI 1006 enables testing in both a pipeline operation as described with reference to FIG. 8, as well as testing under a dedicated test output as described with respect to FIG. 9. Accordingly, it should be appreciated that UTI 1006 provides a powerful testing interface that is modular enough to perform a multitude of testing methodologies while reducing the amount of space needed to layout the test interface.

Figure 11:
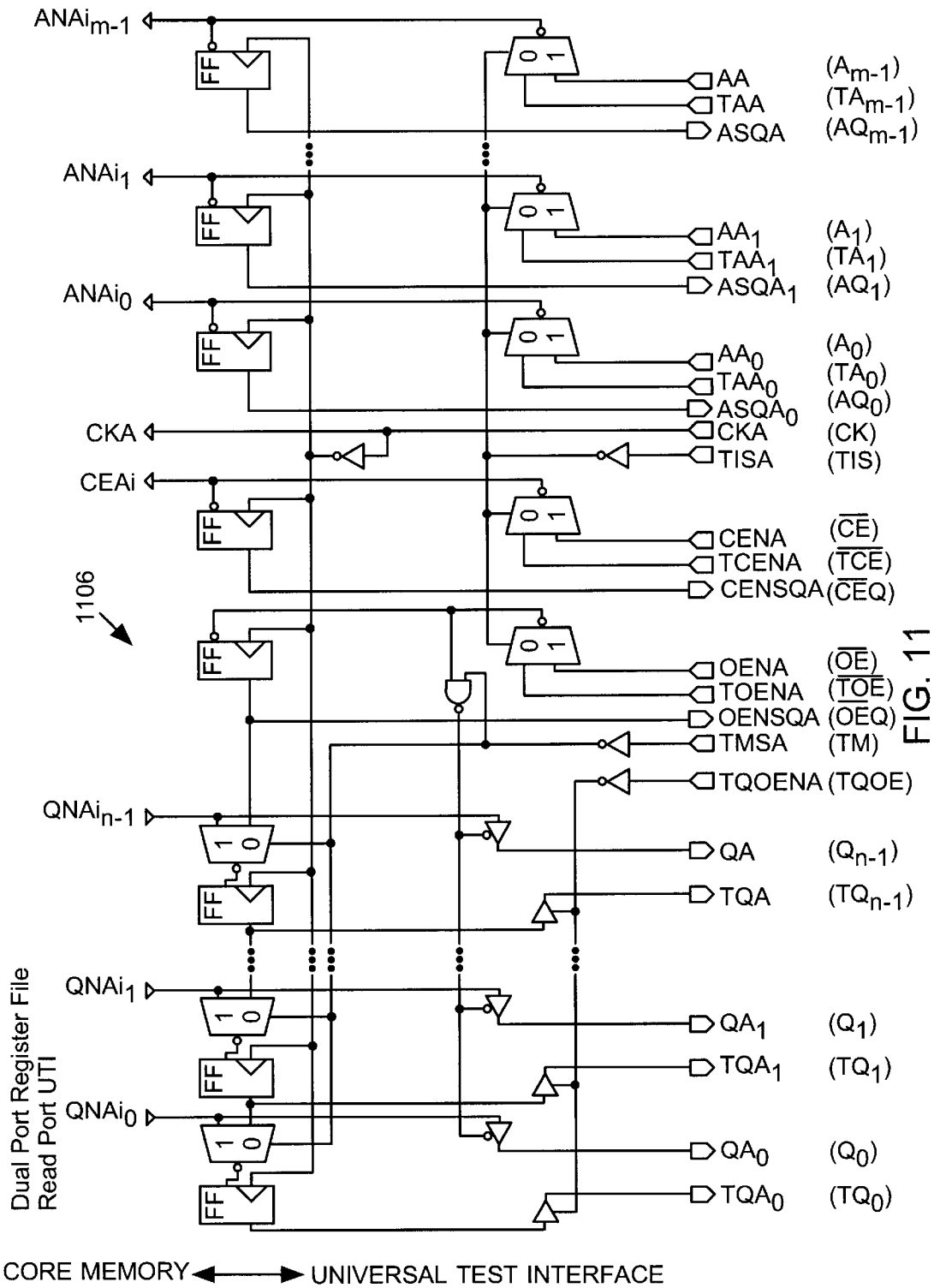
FIG. 11 is a general logic diagram illustrating a universal test interface in accordance with still another alternative embodiment of the present invention.

FIG. 11 is a general logic diagram illustrating a universal test interface 1106 in accordance with still another alternative embodiment of the present invention. In this embodiment, UTI 1106 is used for testing a register file memory. However, it should be understood that UTI 1106 may be used for testing any type of memory having dedicated read and write ports. By way of example, the UTI 1106 is implemented for a register file with dedicated read ports, and therefore the read ports have independent clock and address inputs.

Therefore, the read port must have a data serial input pin (DSI), and a data serial out pin (DSO). In the following examples, new pin names have been assigned to the various input/output pins of the UTI 1106, however, the corresponding pin names associated with UTI 206 have been provided in parenthesis for ease of reference.

Figure 12:
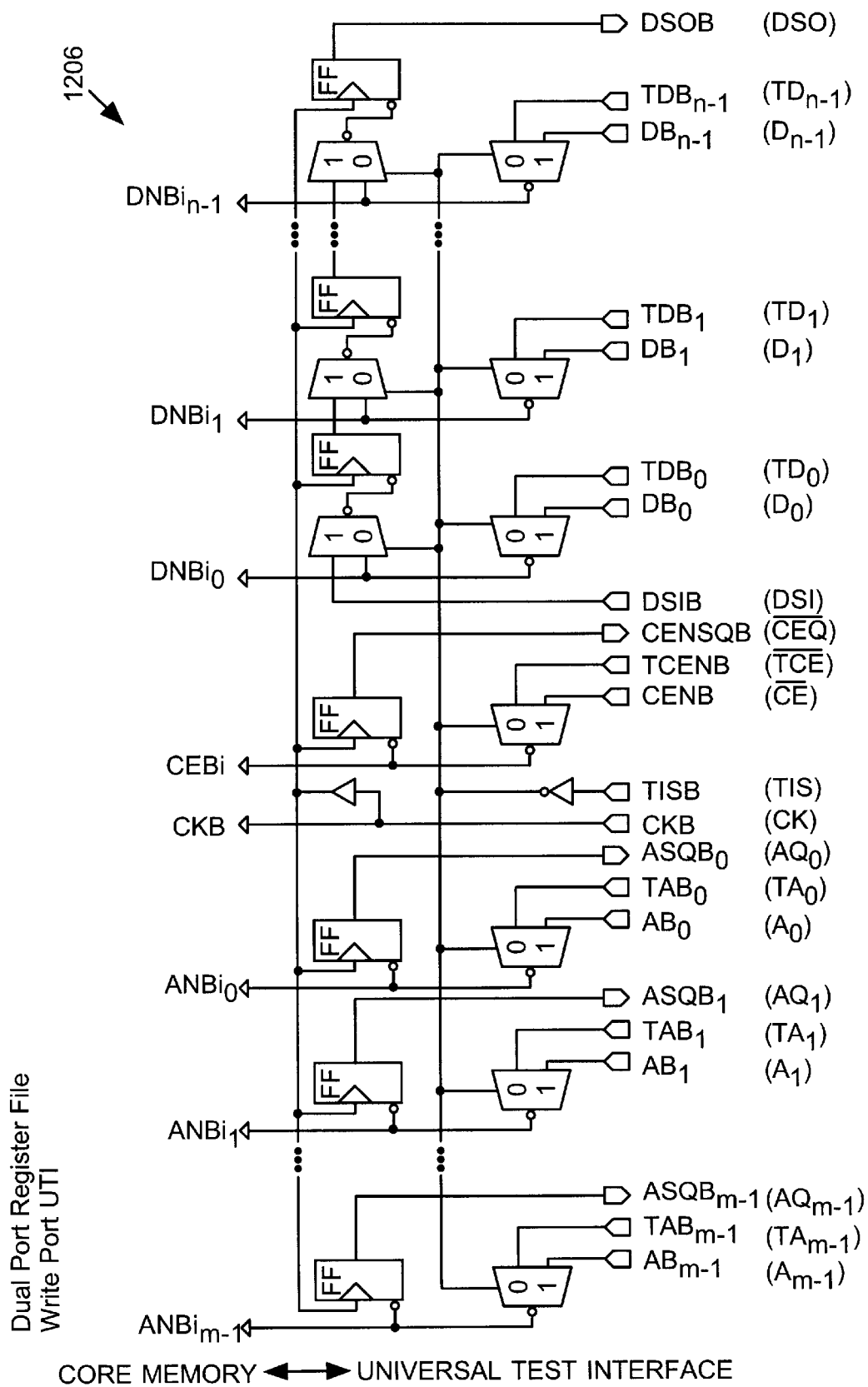
FIG. 12 is a general logic diagram illustrating a universal test interface in accordance with still yet another alternative embodiment of the present invention.

FIG. 12 is a general logic diagram illustrating a universal test interface 1206 in accordance with still yet another alternative embodiment of the present invention. In this embodiment, UTI 1206 is used for testing a register file memory having dedicated write ports, and therefore, the write ports have independent clock and address inputs. Preferably, the write ports include a method for loading the flip flops on the output bus with serial data, from the other flip flops in the scan chain.

To illustrate the universality of UTI 1106 and 1206, the following description will illustrate exemplary memory testing methodologies that may be implemented in accordance with one embodiment of the present invention. For example, the UTI may be configured for serial BIST by wiring between read and write ports, such that TD on the read port may be obtained from the Q output bus on the write port. Accordingly, during a serial BIST test, the read and write ports may receive the same address and clock stimulus. For scan testing, the read and write ports are preferably not chained together in any way. Therefore, the serial scan chains and clocking of those scan chains may be completely independent. For parallel testing, write cycles are enabled through the write port test inputs, and read cycles are enabled and evaluated through the read port test input and outputs. And for serial testing, write cycles are enabled through the write port serial chain, and read cycles are enabled and evaluated through the read port serial chain.

The following Figures and Tables will now be discussed to further exemplify the true modularity and ease of integration of the universal test interface to any type of memory device. Therefore, exemplary UTI circuit diagrams and associated wiring configurations are shown to illustrate ways in which the UTI pins can be interconnected to achieve a desired test methodology arrangement. Although in some instances a few custom logic gates are externally connected to the UTI pins in order to achieve a desired test methodology, the number of custom gates needed is minimal compared to those that would be required had the UTI not been provided as an interface.

For register file memories, the pin description provided in Table 6 may be referenced in conjunction with reference to FIGS. 13 through 31.

TABLE 6

Register File Pins

| Pin | Description |
| --- | --- |
| AA[m−1:0], AB[m−1:0] | Address |
| TAA[m−1:0], TAB[m−1:0] | Test-Mode Addresses |
| ASQA[m−1:0], ASQB[m−1:0] | Address Scan-Register Outputs |
| QA[n−1:0] | Data Output Bus |
| TQA[n−1:0] | Test-Mode Data Output Bus |
| QSQA | Data Output Scan-Register Output |
| DB[n−1:0] | Data Input Bus |
| TDB[n−1:0] | Test-Mode Data Input Bus |
| DSIB | Data Scan-Chain Input |
| DSOB | Data Scan-Chain Output |
| CENA, CENB | Chip Enables (Active Low) |
| TCENA, TCENB | Test-Mode Chip Enables (Active Low) |
| CSNSQB | Chip Enable Scan-Register Output |
| CLKA, CLKB | Clock Inputs |
| OENA | Output Drive Enable (Active Low) |
| TOENA | Test-Mode Output Drive Enable (Active Low) |
| OENSQA | Output Enable Scan-Register Output |
| TQOENA | Test Data Output Dirve Enable (Acitve Low) |
| SMBS | Serial Mode Select |
| TISA, TISB | Test Input Selects |
| TMSA, TMSB | Test Mode Selects |
| TASA (Read Port With Pipeline Only) | Test Address Select |
| PENA (Read Port With Pipeline Only) | Pipeline Enable |

Figure 13:
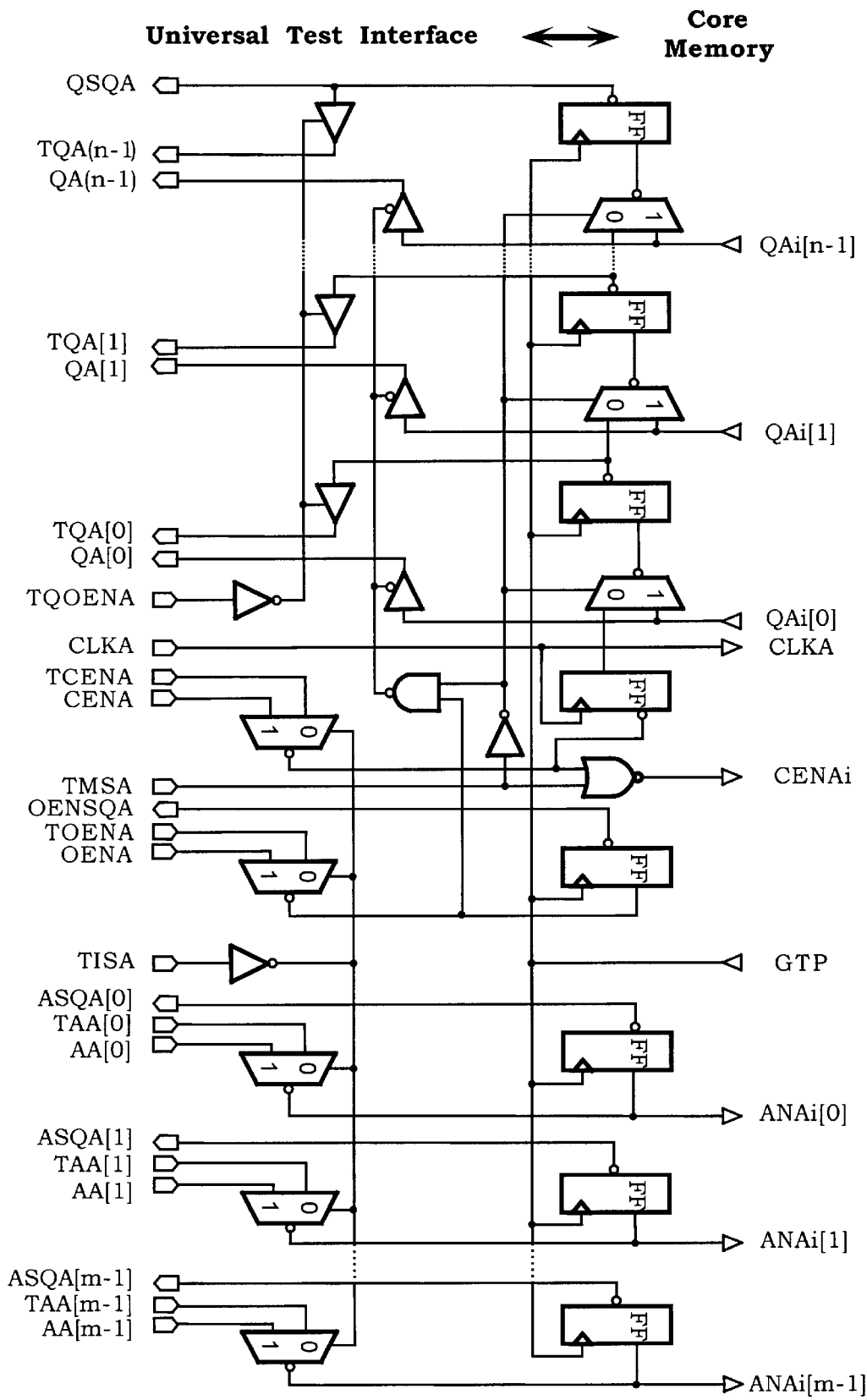
FIGS. 13 is a two-port register file circuit diagram of the UTI in accordance with one embodiment of the present invention.
Figure 14:
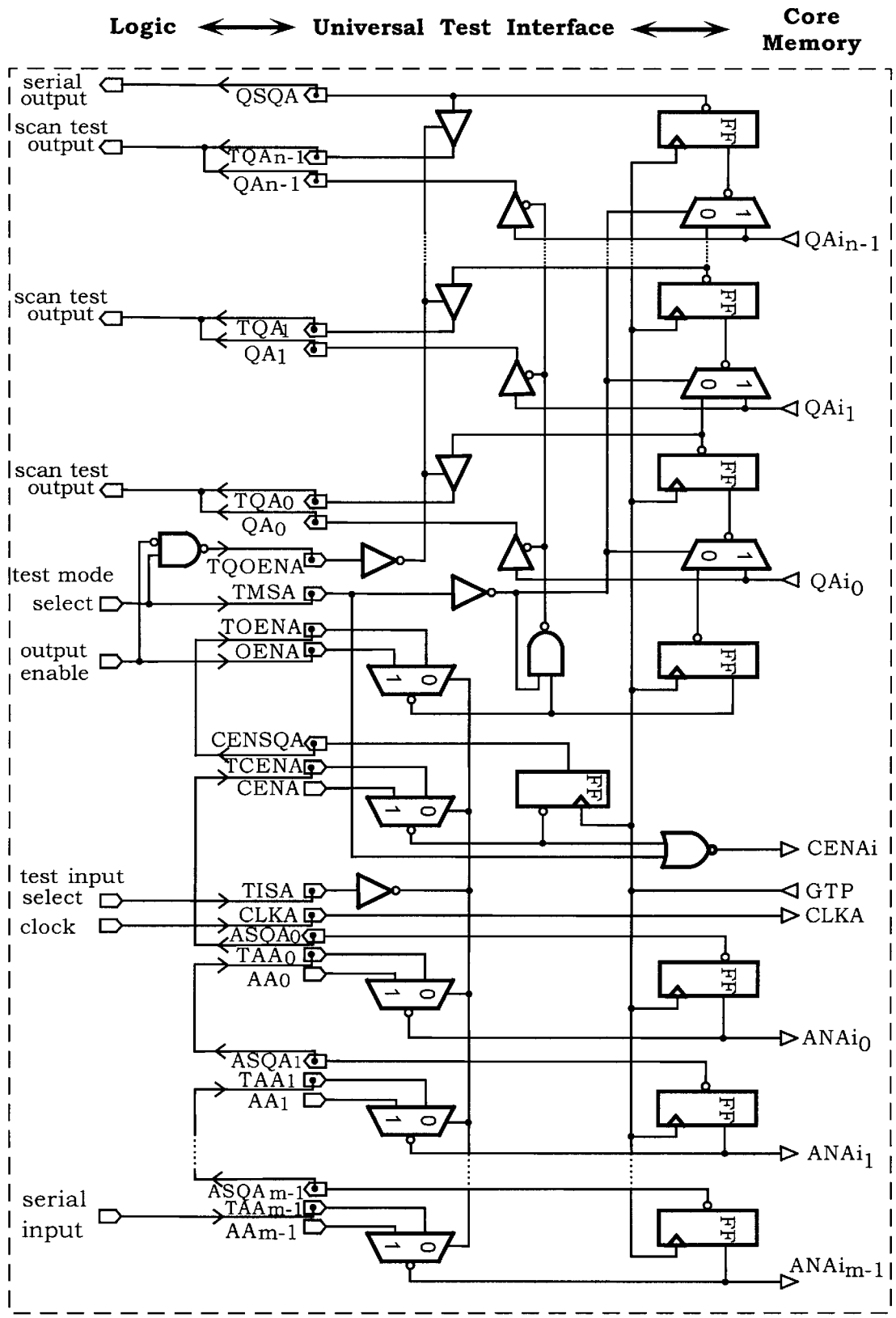
FIG. 14 shows a circuit diagram of the UTI being wired for scan test mode and a serial test mode operation in accordance with one embodiment of the present invention.
Figure 15:
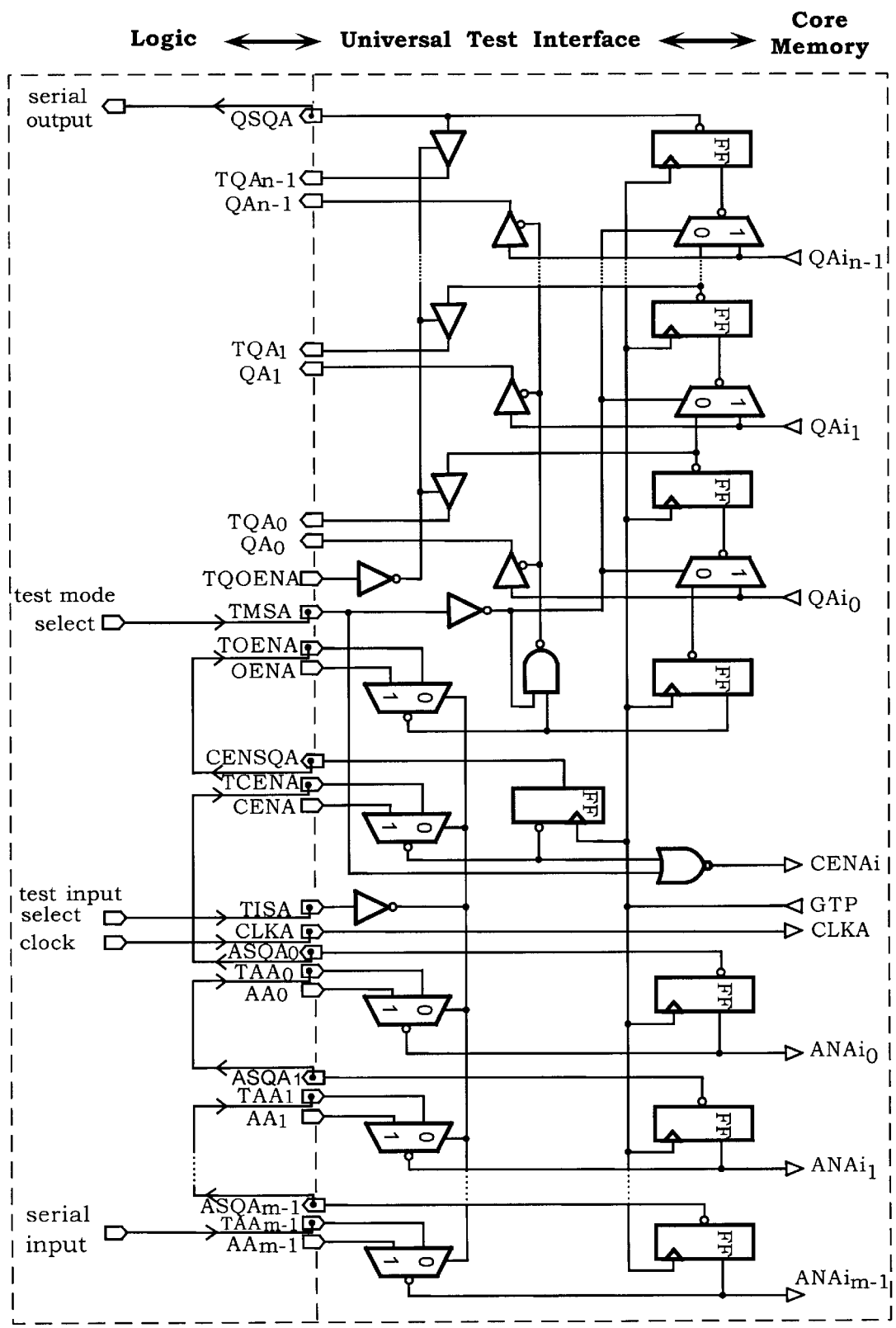
FIG. 15 shows a circuit diagram of the UTI being wired to enable testing under a serial test mode in accordance with one embodiment of the present invention.

FIG. 13 is a two-port register file circuit diagram of the UTI where a non-pipeline configuration is desired. Specifically, FIG. 13 shows a basic circuit diagram before any wiring or logic gates are interconnected to interface pins to the UTI. FIG. 14 shows the circuit diagram of the UTI after custom logic and wiring has been added in order to make the UTI capable of executing both scan test mode and a serial test mode methodologies. FIG. 15 shows a circuit diagram in which certain pins of the UTI have been interconnected in order to enable testing under a serial test mode methodology.

Table 7 below provides a list of the test procedure conventions and definitions that should be referenced when reviewing the truth tables of Tables 8–10.

TABLE 7

Test Procedure Convention For Truth Tables

| Convention | Definition |
| --- | --- |
| 1 | Clock signal: pulsed wavefonn All other input signals: DC high waveform |
| 0 | DC low waveform |
| x | Unknown, don't care |

Table 8 as shown below should be referenced in conjunction with FIGS. 16 through 21, which illustrate two-port register file UTI's that are write-port enabled.

TABLE 8

Truth Table (Write Port)

| TISB | SMSB | Effective Address | Effective Data & Data Flip-Flop Input | |
| --- | --- | --- | --- | --- |
| | | | DB[0] | DB[i], I > 0 |
| 0 | 0 | AB | DB[0] | DB[i] |
| 0 | 1 | AB | DSIB | D[I−1] FF output |
| 1 | 0 | TAB | TDB[0] | TDB[i] |
| 1 | 1 | TAB | DSIB | D[i−1] FF output |

Figure 16:
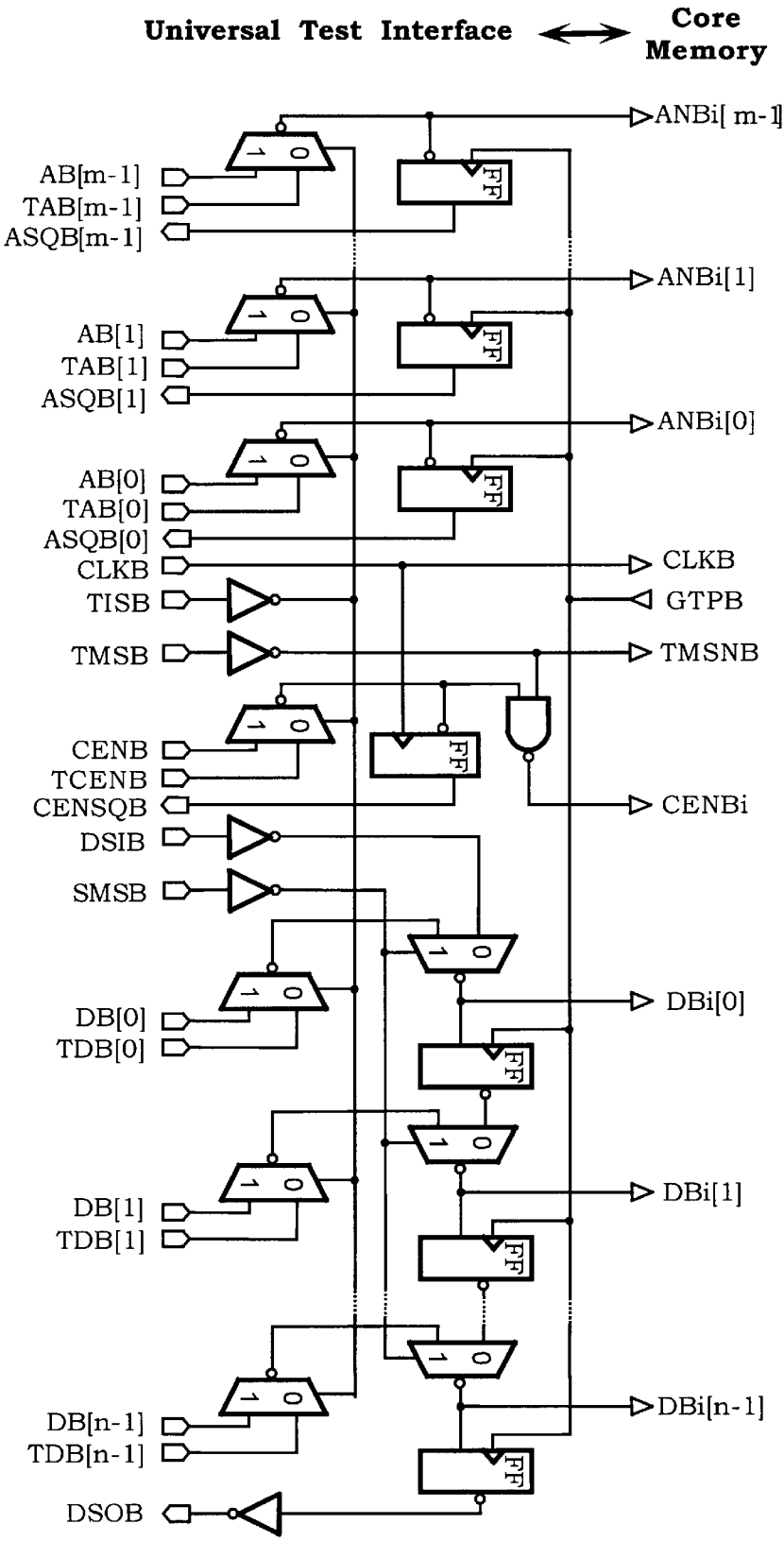
FIG. 16 shows a UTI that is configured to operate for two-port register file memories (write-port) in accordance with one embodiment of the present invention.
Figure 17:
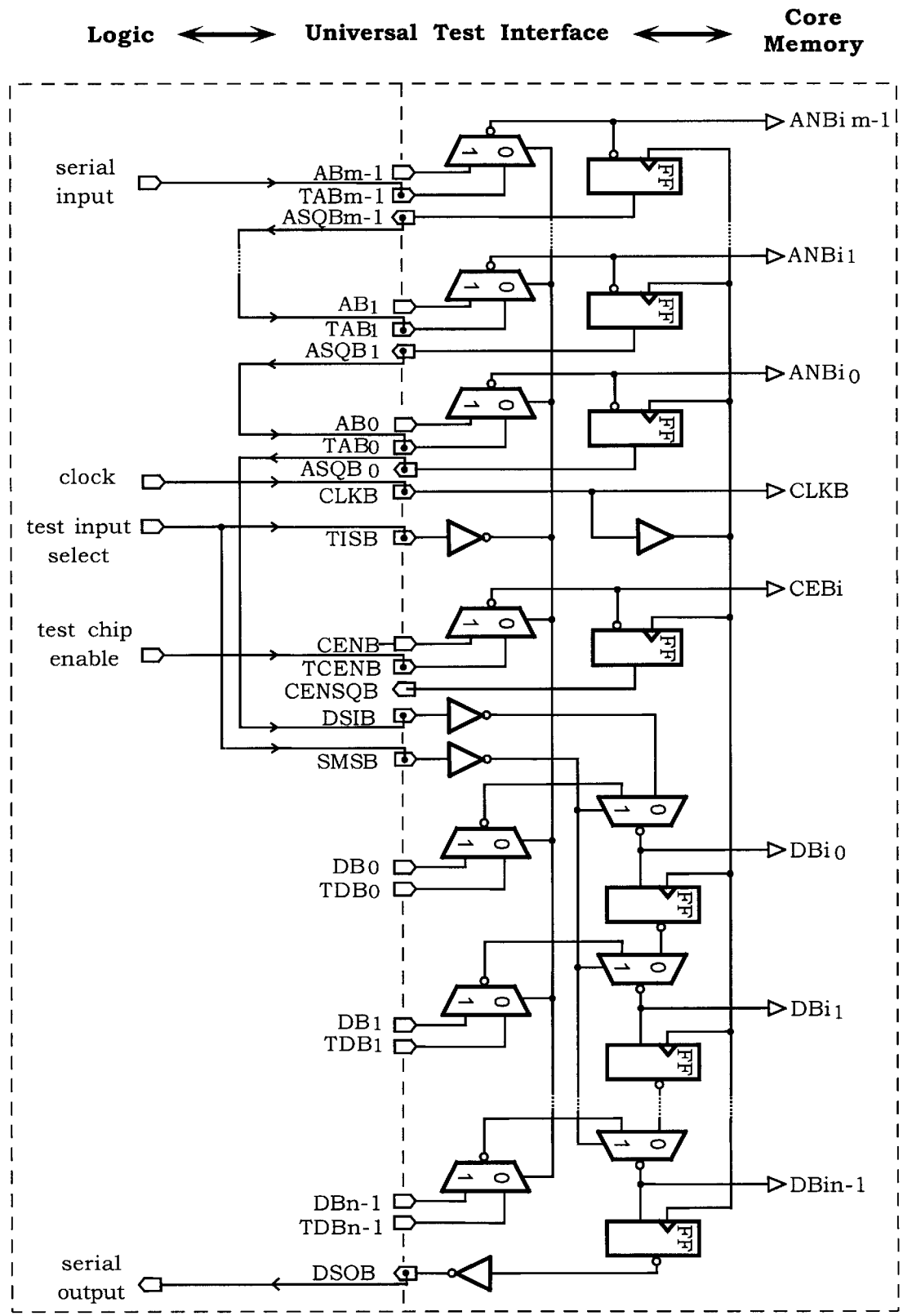
FIG. 17 shows the write-port UTI of FIG. 16 after custom wiring is performed to enable serial test mode operation in accordance with one embodiment of the present invention.
Figure 18:
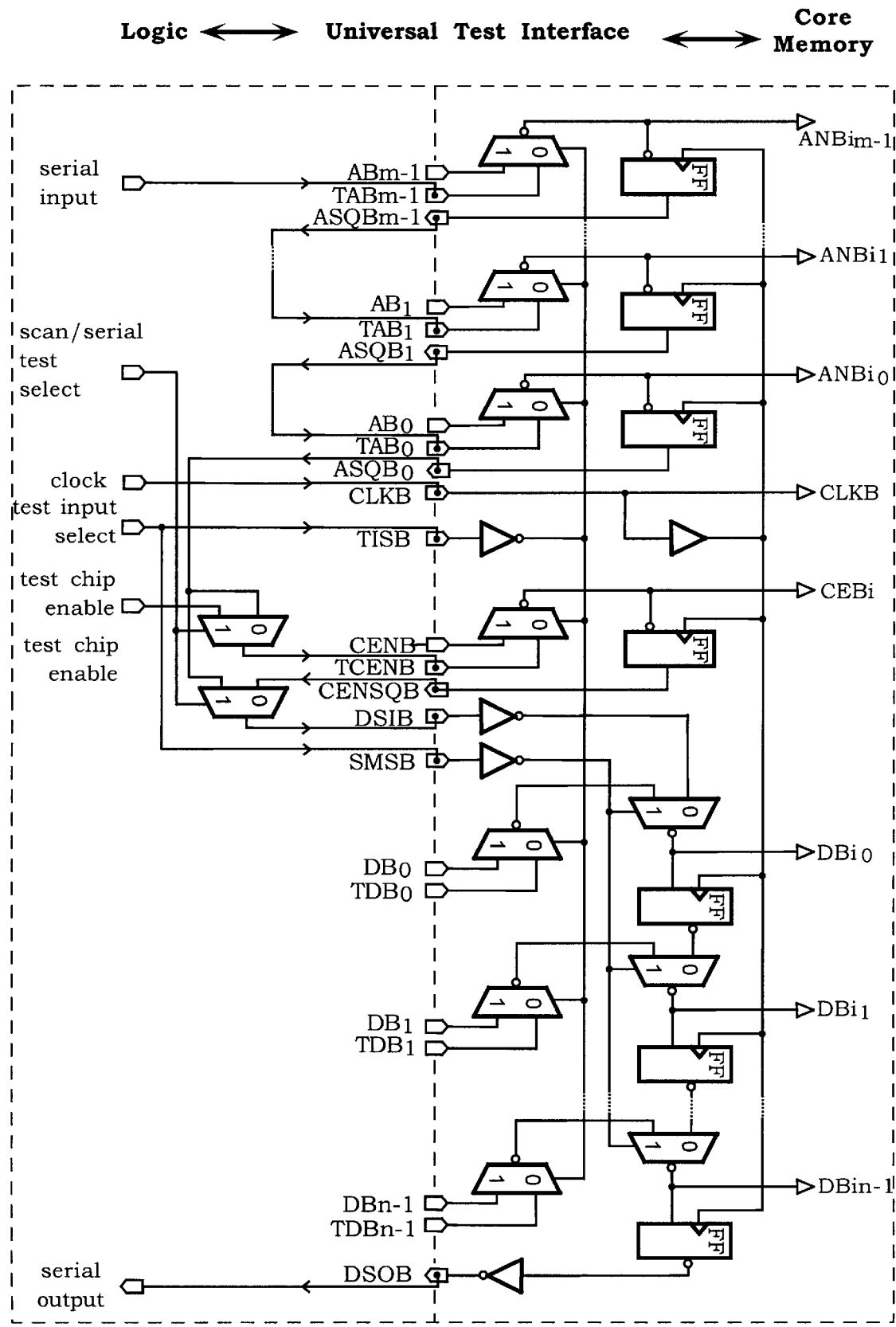
FIG. 18 shows the write-port UTI of FIG. 16 after being wired with appropriate logic gates to enable both scan test mode and serial test mode operation in accordance with one embodiment of the present invention.
Figure 19:
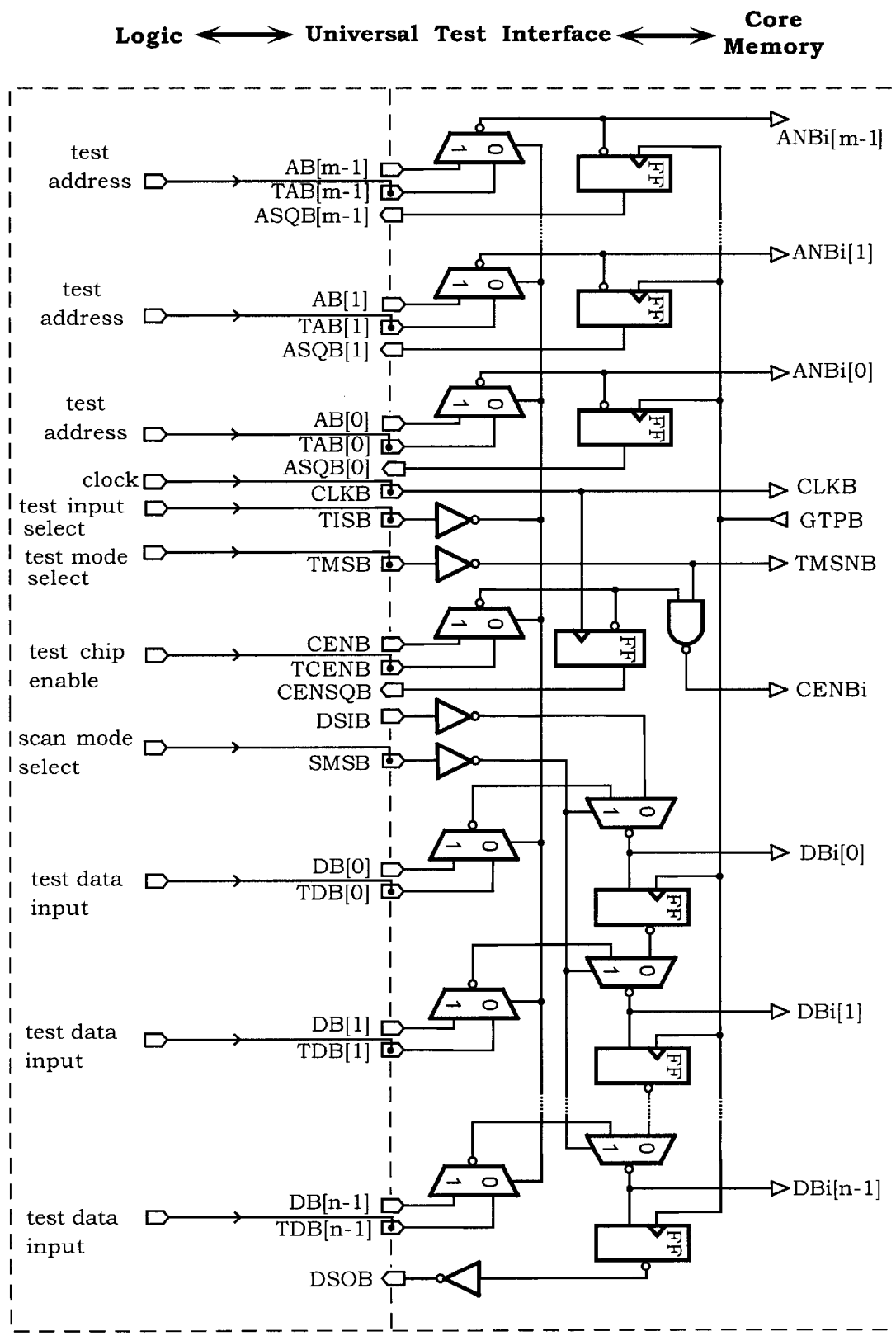
FIG. 19 shows the write-port UTI after being wired to enable parallel test mode operation in accordance with one embodiment of the present invention.
Figure 20:
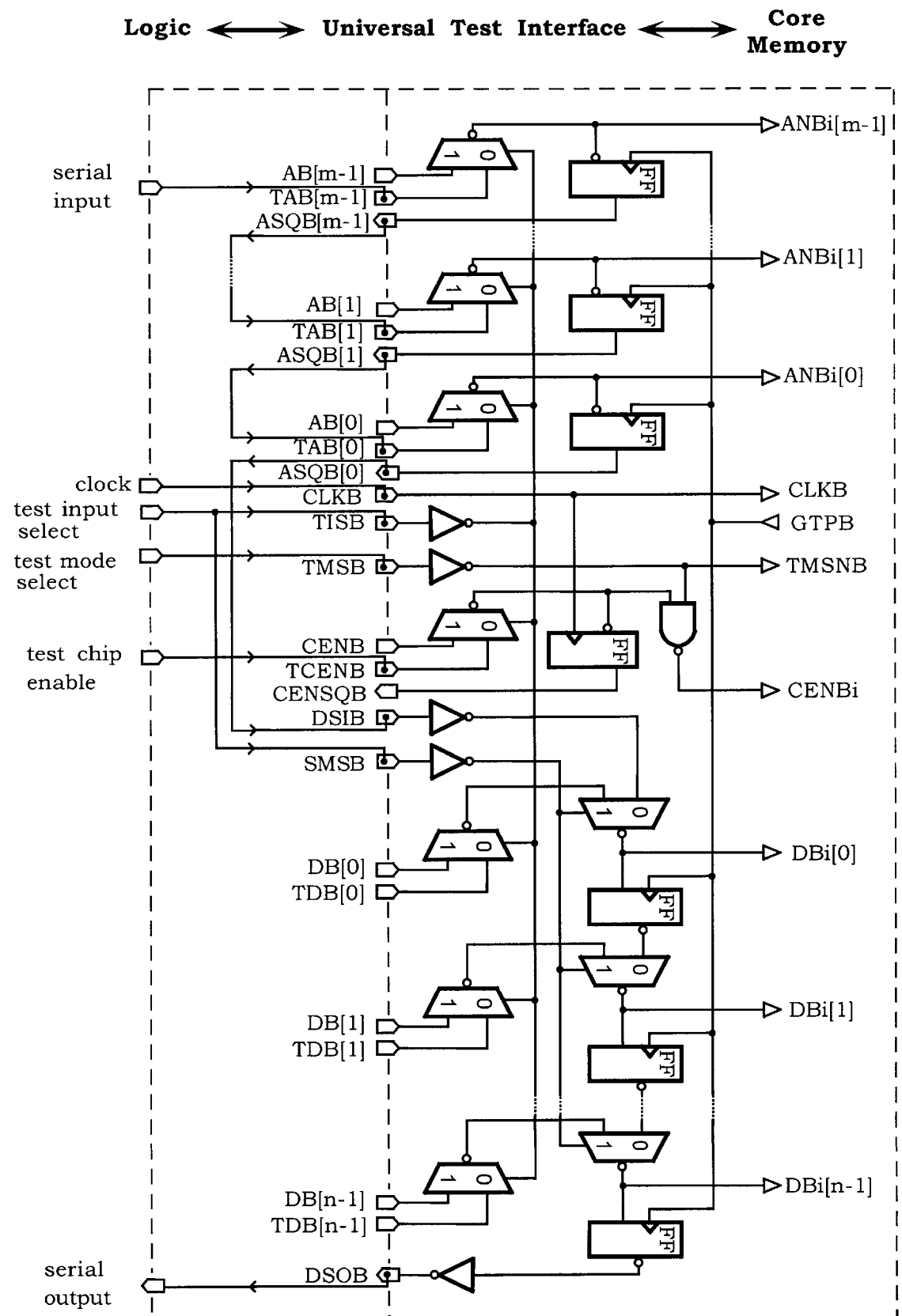
FIG. 20 shows the write-port UTI after being wired to enable serial test mode operation in accordance with one embodiment of the present invention.
Figure 21:
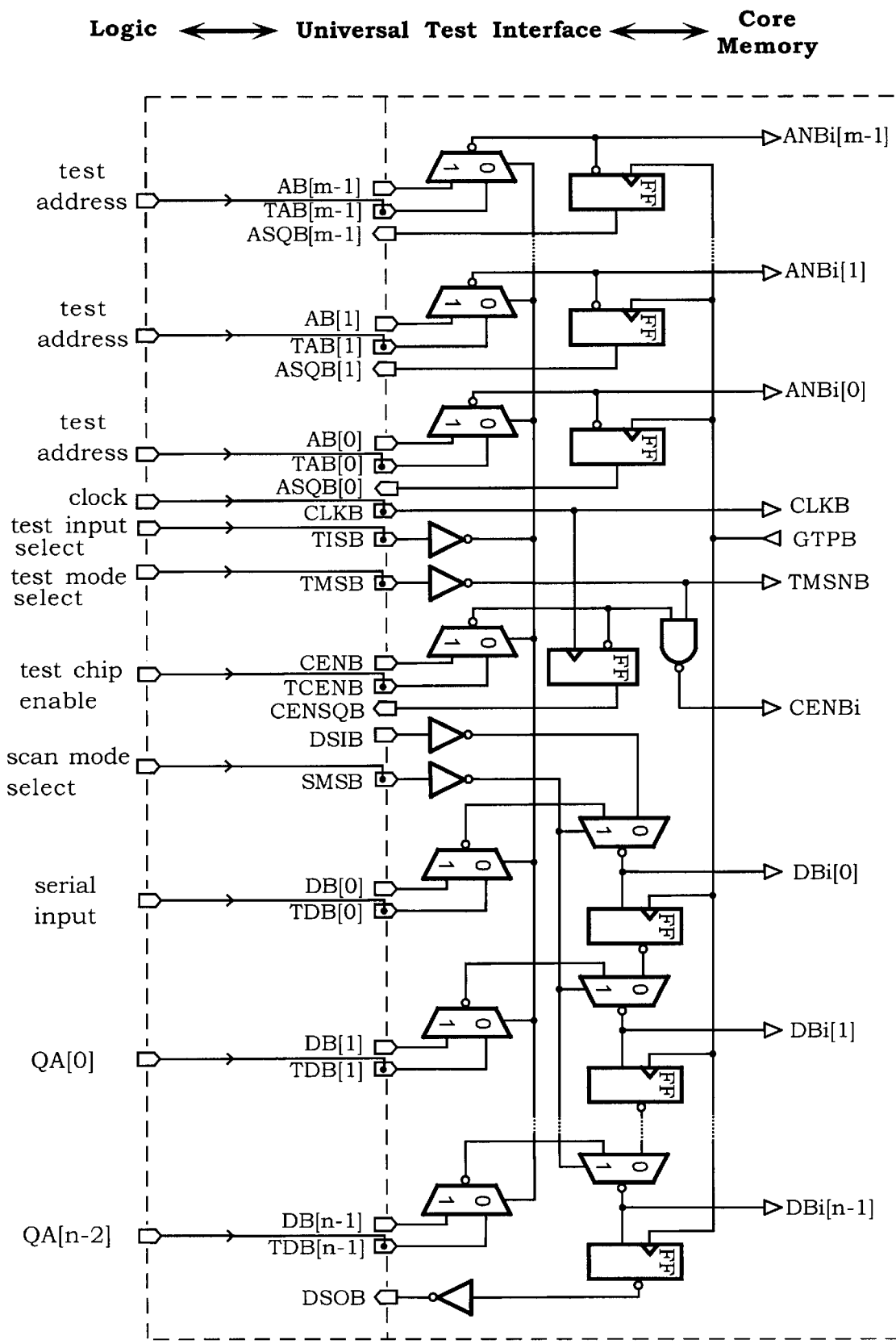
FIG. 21 shows the write-port UTI after being wired to enable serial BIST mode operation in accordance with one embodiment of the present invention.

FIG. 16 shows a simplified circuit diagram of a UTI that is configured to operate for two-port register file memories, which are write-port enabled. FIG. 17 shows the write-port UTI of FIG. 16 after custom wiring is performed to enable serial test mode functionalities. FIG. 18 shows the write-port UTI of FIG. 16 after being wired with appropriate logic gates (i.e., multiplexors) to enable both scan test mode and serial test mode methodologies. FIG. 19 shows the write-port UTI after being wired to enable parallel test mode operations. FIG. 20 shows the write-port UTI after being wired to enable serial test mode operations. FIG. 21 shows the write-port UTI after being wired to enable serial BIST mode operations.

Table 9 as shown below should be referenced in conjunction with FIGS. 22 through 31, which illustrate two-port register file UTI's that are read-port enabled.

TABLE 9

Truth Table (Read Port Without Pipeline)

| TISA | TMSA | TOENA | OENA | Effective Address | QA [n−1:0] | Data Flip-Flop Input | |
| --- | --- | --- | --- | --- | --- | --- | --- |
| | | | | | | QA[0] | Q[i], i > 0 |
| 0 | 0 | X | 0 | AA | active | QiA[0] | QiA[i] |
| 0 | 0 | X | 1 | AA | hi-Z | QiA[0] | QiA[i] |
| 0 | 1 | X | X | AA | hi-Z | CENA FF output | QA[i−1] FF output |
| 1 | 0 | 0 | X | TAA | active | QiA[0] | QiA[i] |
| 1 | 0 | 1 | X | TAA | hi-Z | QiA[0] | QiA[i] |
| 1 | 1 | X | X | TAA | hi-Z | CENA FF output | QA[i−] FF output |

Figure 22:
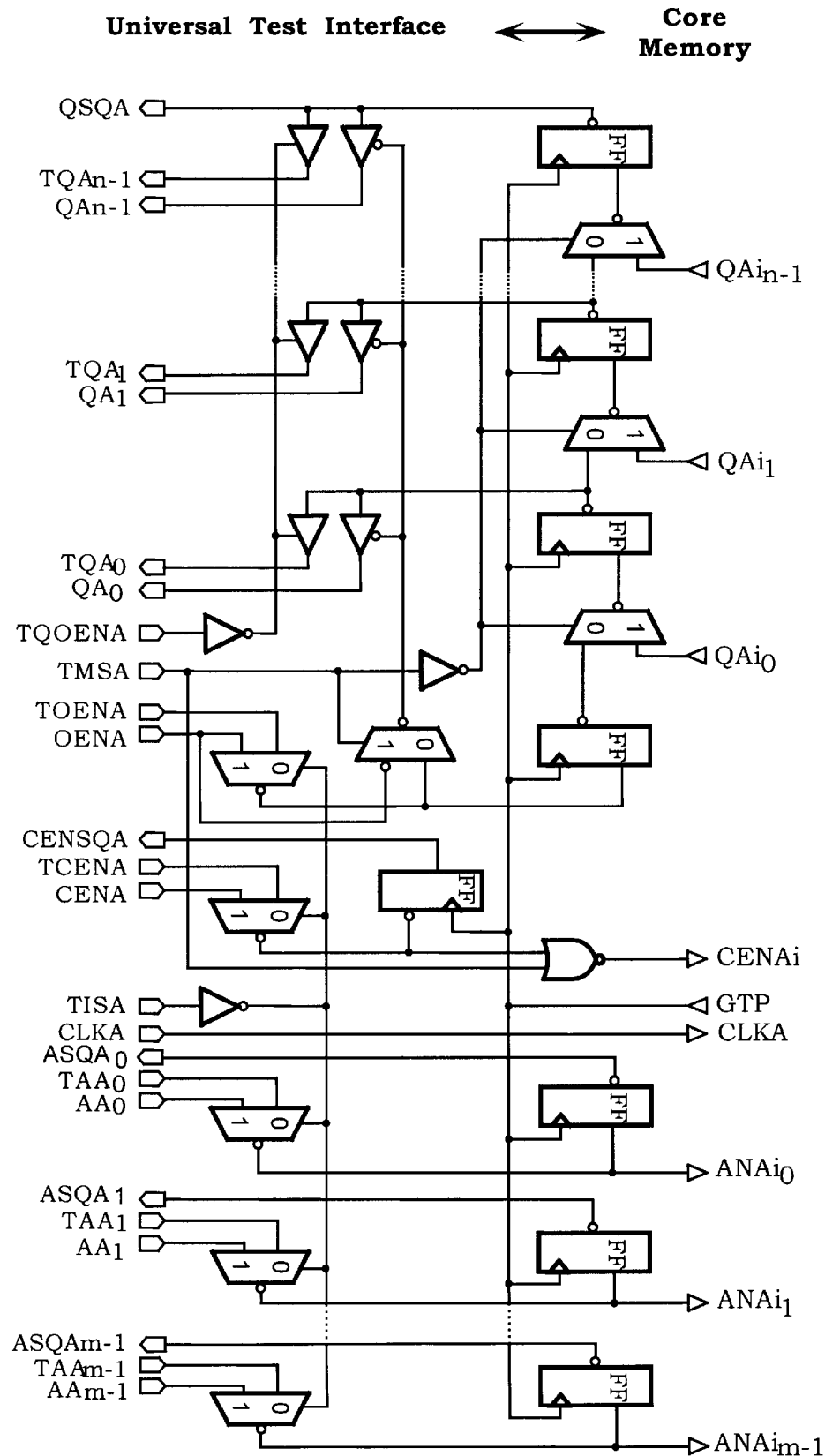
FIG. 22 shows the universal test interface (UTI) being arranged as a general read-port UTI for two-port register file memories in accordance with one embodiment of the present invention.
Figure 23:
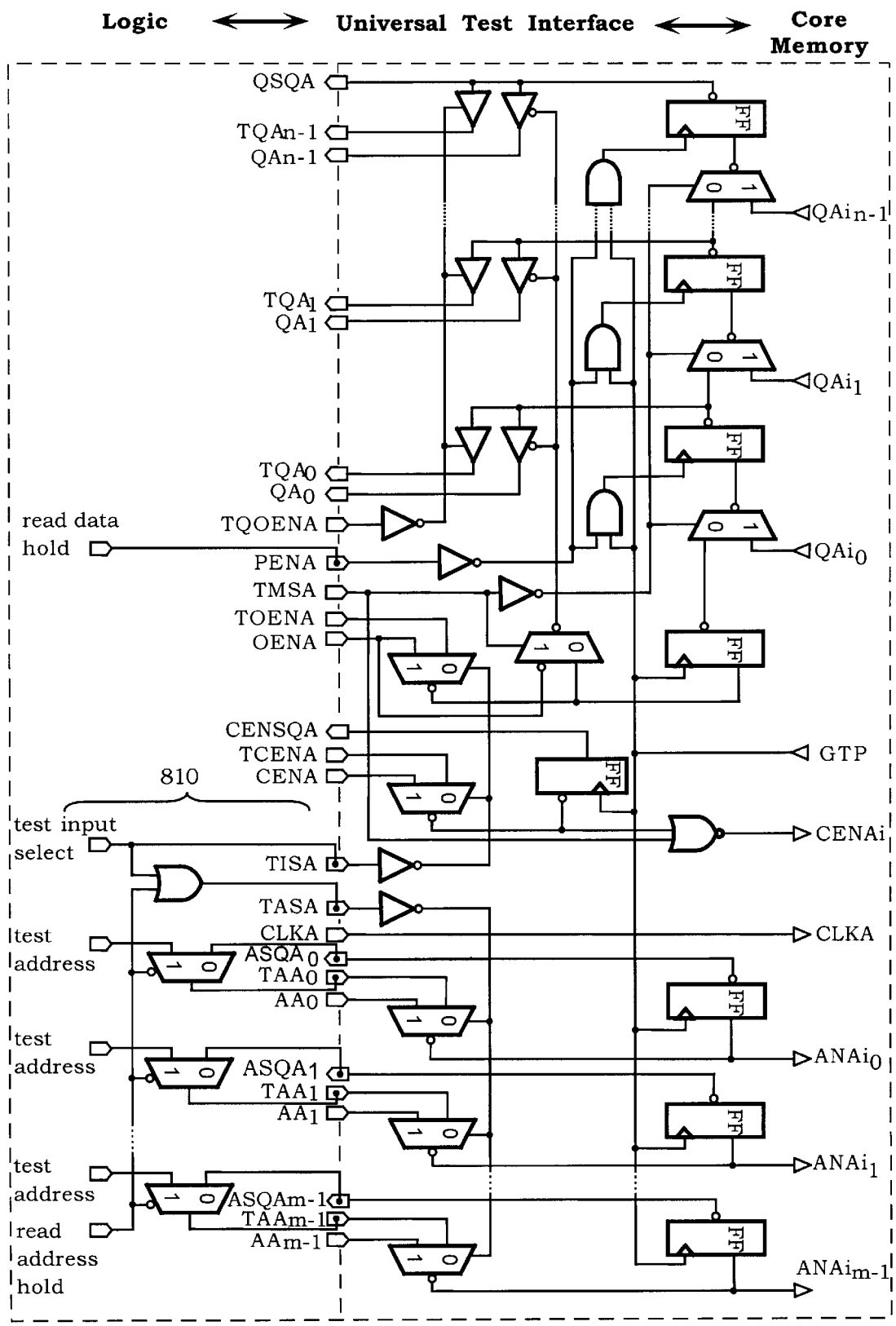
FIG. 23 shows the read-port UTI of FIG. 22 after custom logic is provided to enable memory updates and stall capabilities in accordance with one embodiment of the present invention.
Figure 24:
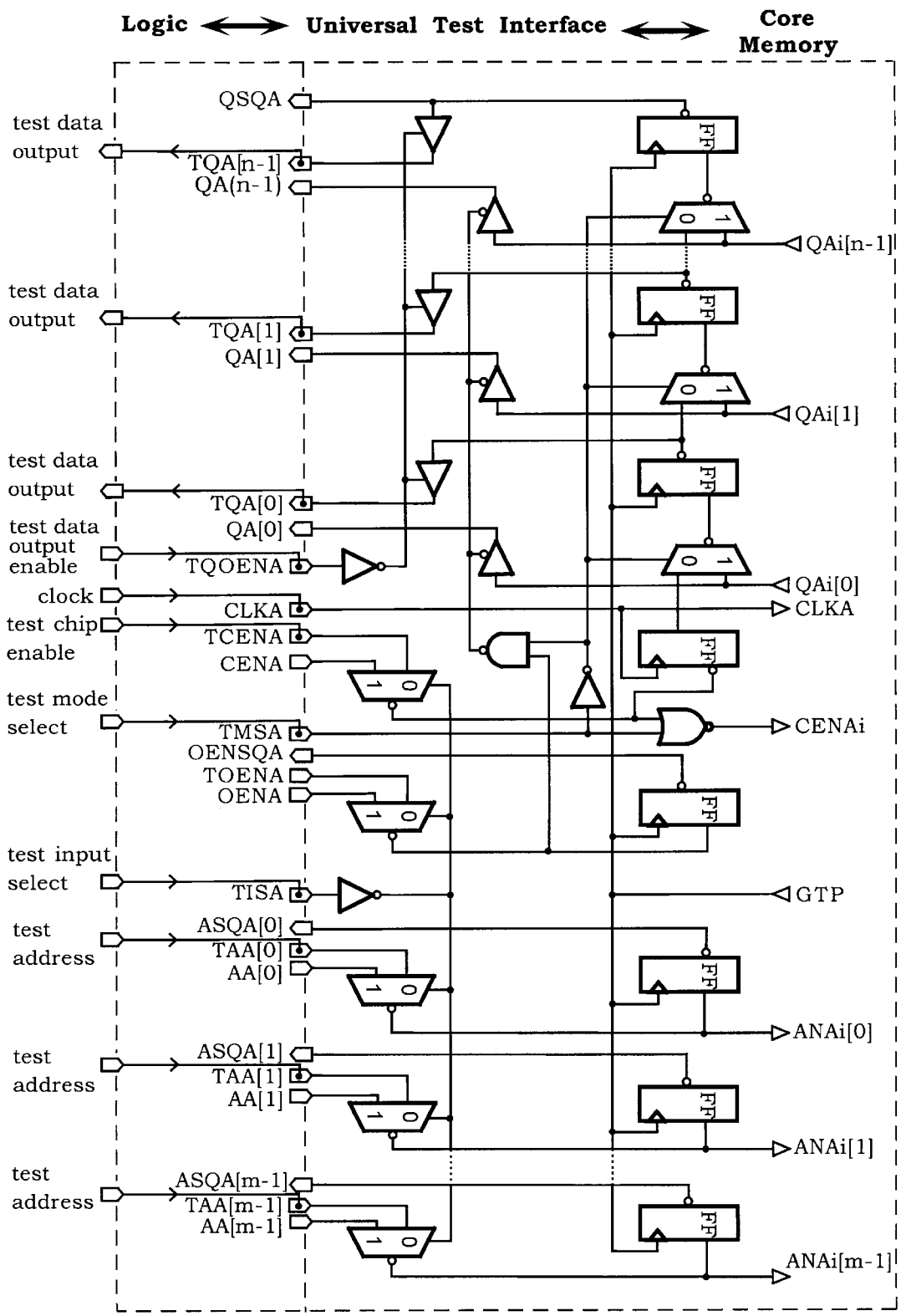
FIG. 24 shows a read-port UTI arranged without pipeline capabilities and being wired to enable parallel test mode operation in accordance with one embodiment of the present invention.
Figure 25:
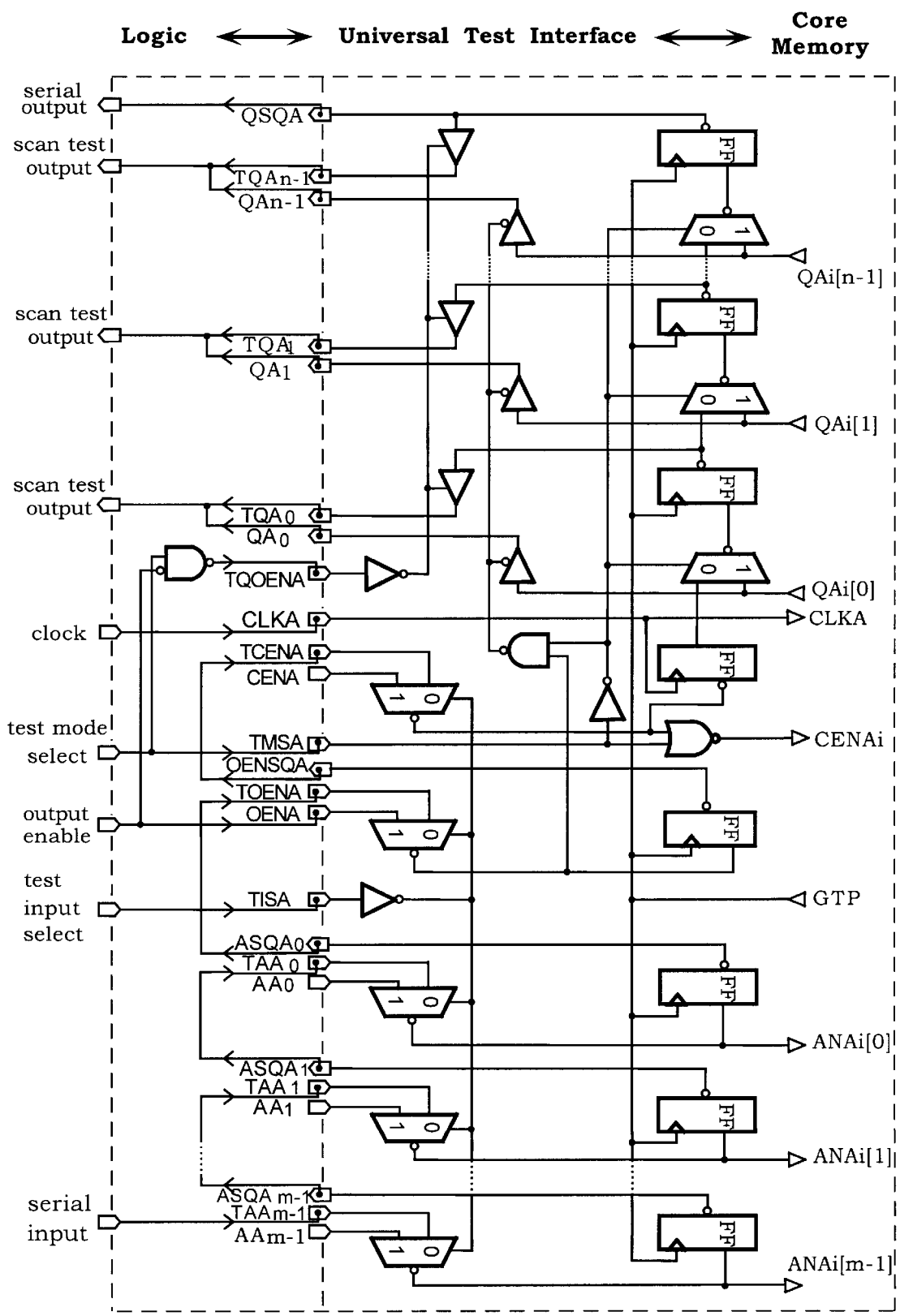
FIG. 25 shows a read-port UTI without pipeline capabilities, and being wired to enable scan test operation in accordance with one embodiment of the present invention.
Figure 26:
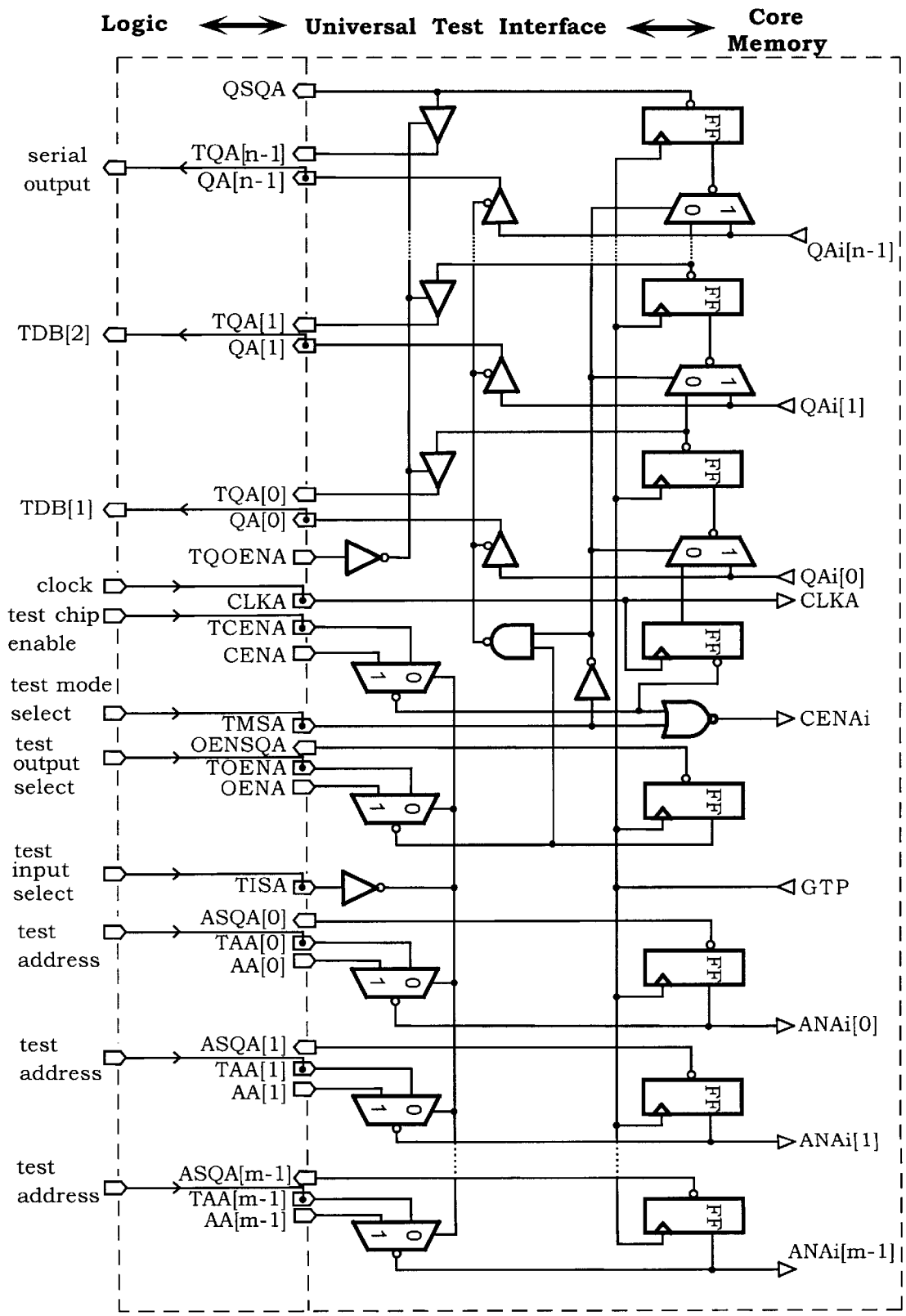
FIG. 26 shows a read-port UTI without pipeline capabilities and being wired to enable serial BIST mode operation in accordance with one embodiment of the present invention.

FIG. 22 shows the circuitry of the universal test interface (UTI) arranged as a general read-port UTI for two-port register file memories. FIG. 23 shows the read-port UTI of FIG. 22 after custom logic 810 is provided to enable memory updates. In addition, the read-port of FIG. 23 is also able to provide stall capabilities. FIG. 24 shows a read-port UTI arranged without pipeline capabilities and being wired to enable parallel test mode operation. FIG. 25 shows a read-port UTI without pipeline capabilities, and being wired to enable scan test operations. The read-port of FIG. 25 also includes a custom gate that has pins TMSA and OENA as inputs and an output that leads into pin TQOENA. FIG. 26 shows a read-port UTI without pipeline capabilities and being wired to enable serial BIST mode operation.

TABLE 10

Truth Table
(Read Port With Pipeline)

| TISA/ TASA | TMSA | TOENA | OENA | Effective Address | QA [n−1:0] | Data Flip-Flop Input QA[0] | Q[i], i > 0 |
|---|---|---|---|---|---|---|---|
| 0 | 0 | X | 0 | AA | active | QiA[0] | QiA[i] |
| 0 | 0 | X | 1 | AA | hi-Z | QiA[0] | QiA[i] |
| 0 | 1 | X | 0 | AA | active | CENA FF output | QA[i−1] FF output |
| 0 | 1 | X | 1 | AA | hi-Z | CENA FF output | QA[i−1] FF output |
| 1 | 0 | 0 | X | TAA | active | QiA[0] | QiA[i] |
| 1 | 0 | 1 | X | TAA | hi-Z | QiA[0] | QiA[i] |
| 1 | 1 | X | 0 | TAA | active | CENA FF output | QA[i−1] FF output |
| 1 | 1 | X | 1 | TAA | hi-Z | CENA FF output | QA[i−1] FF output |

Figure 27:
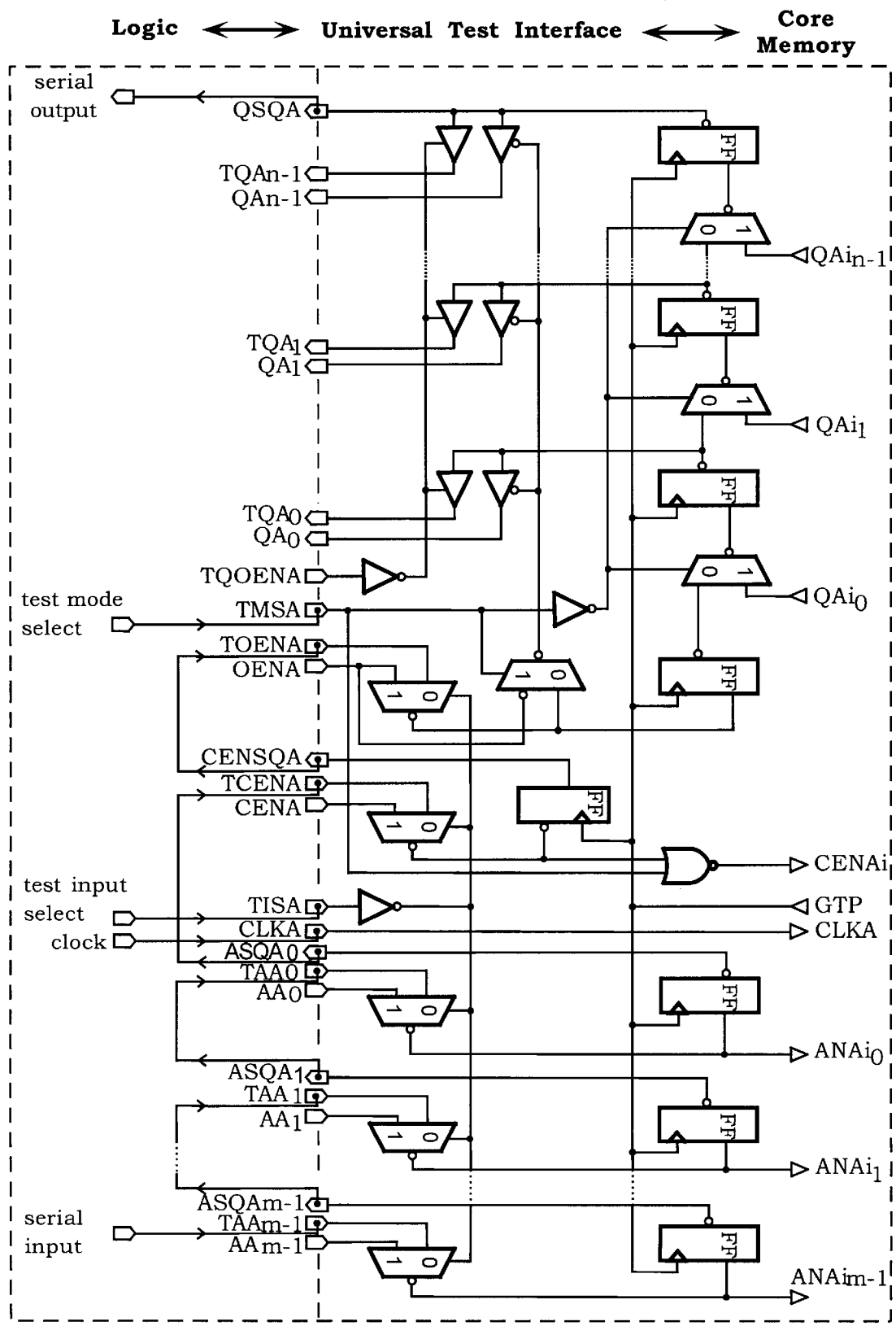
FIG. 27 shows a read-port UTI that is wired to enable both scan test mode and serial test mode operation in accordance with one embodiment of the present invention.
Figure 28:
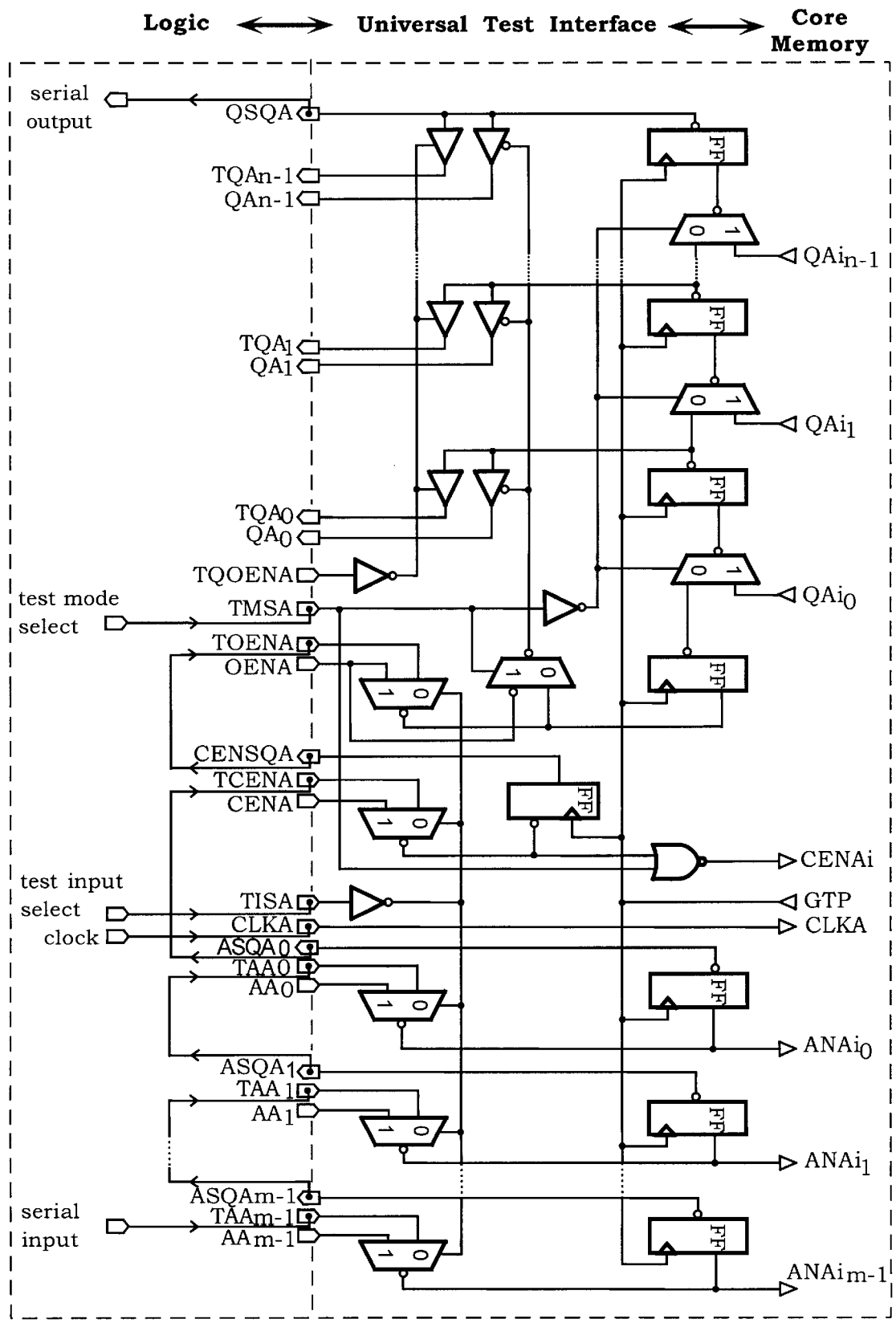
FIG. 28 shows a read-port UTI that is wired to enable serial test mode operation in accordance with one embodiment of the present invention.
Figure 29:
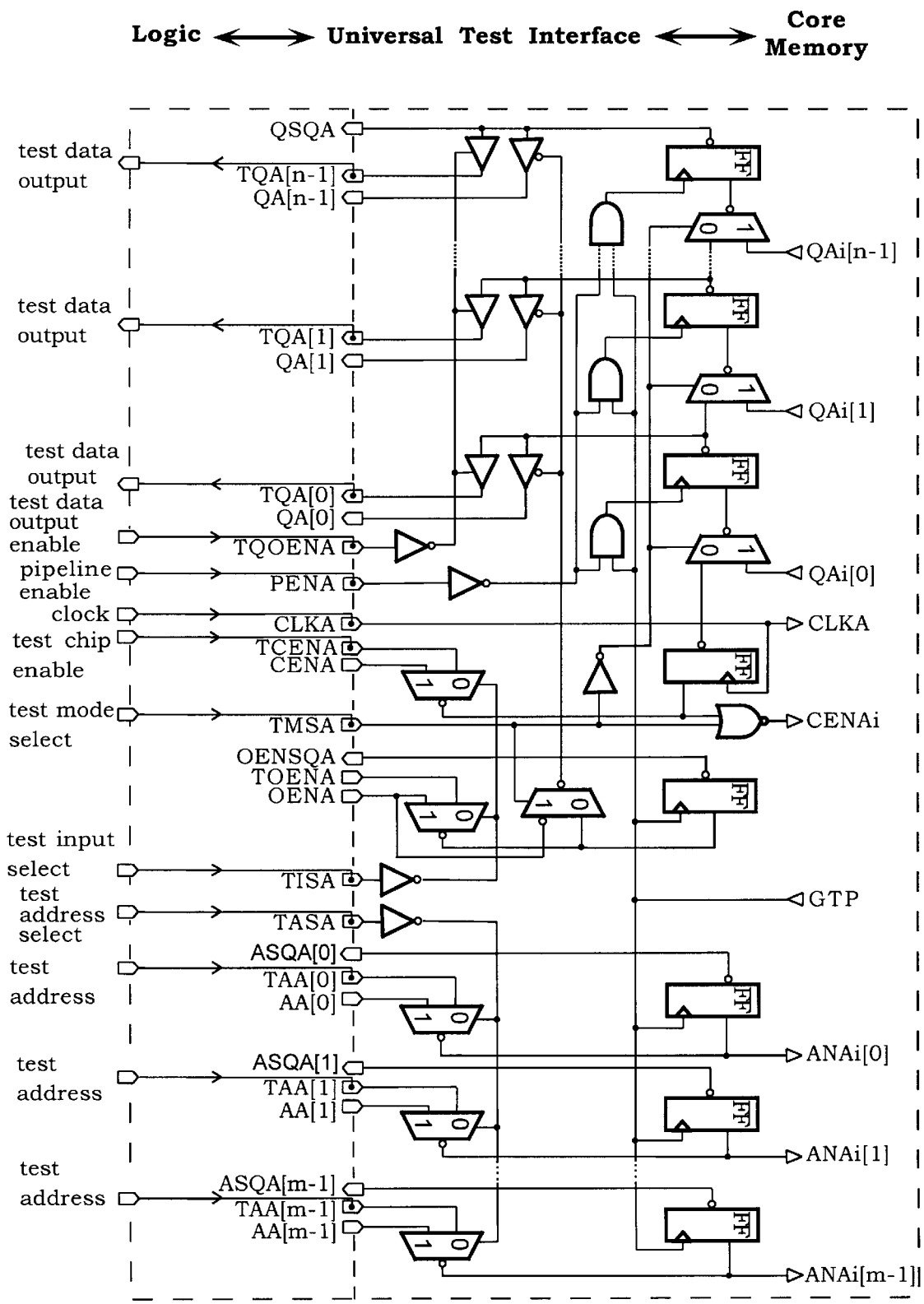
FIG. 29 shows a read-port UTI that is wired to enable parallel test mode operation in accordance with one embodiment of the present invention.
Figure 30:
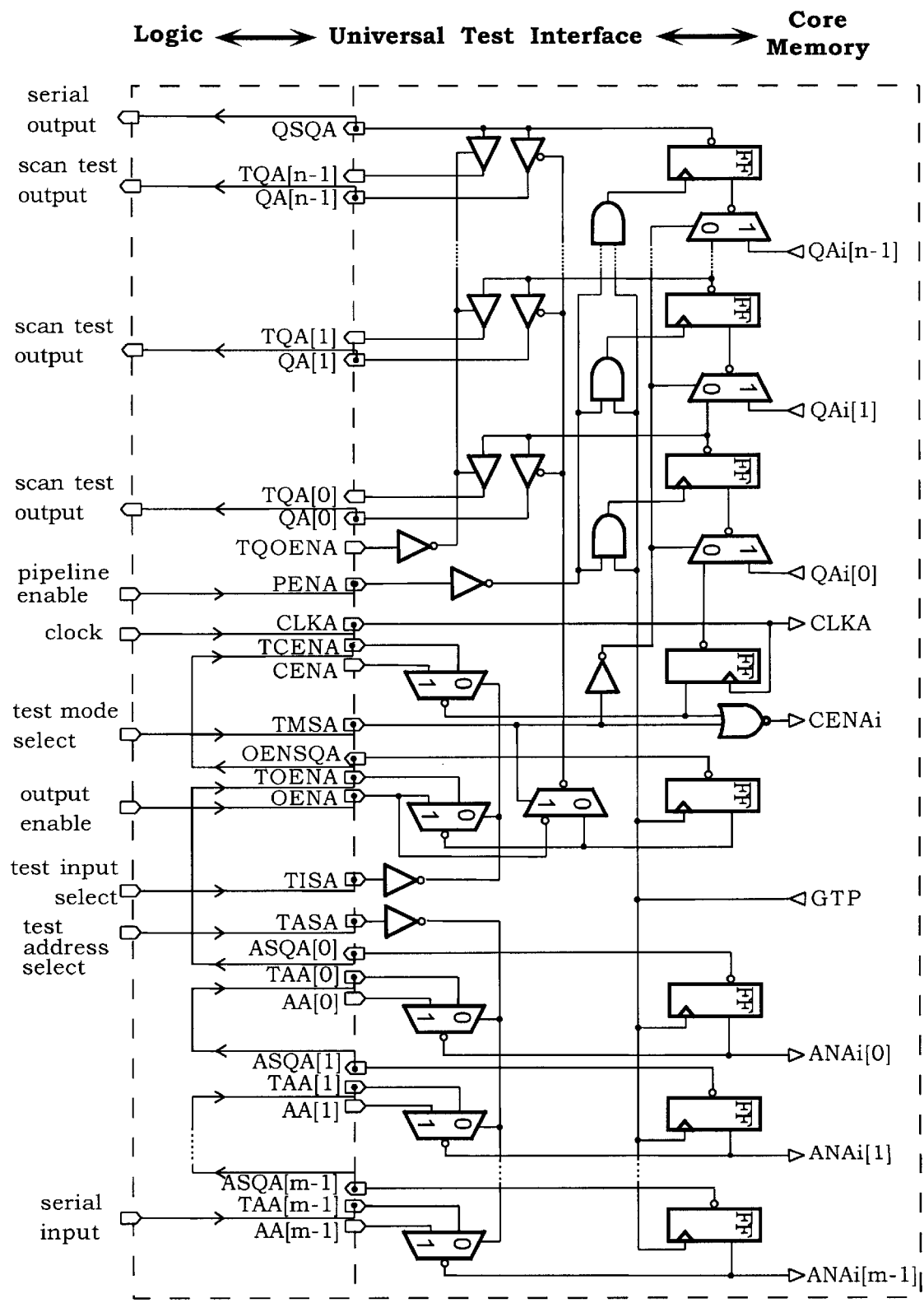
FIG. 30 shows a read-port UTI that is wired to enable scan test mode operation in accordance with one embodiment of the present invention.
Figure 31:
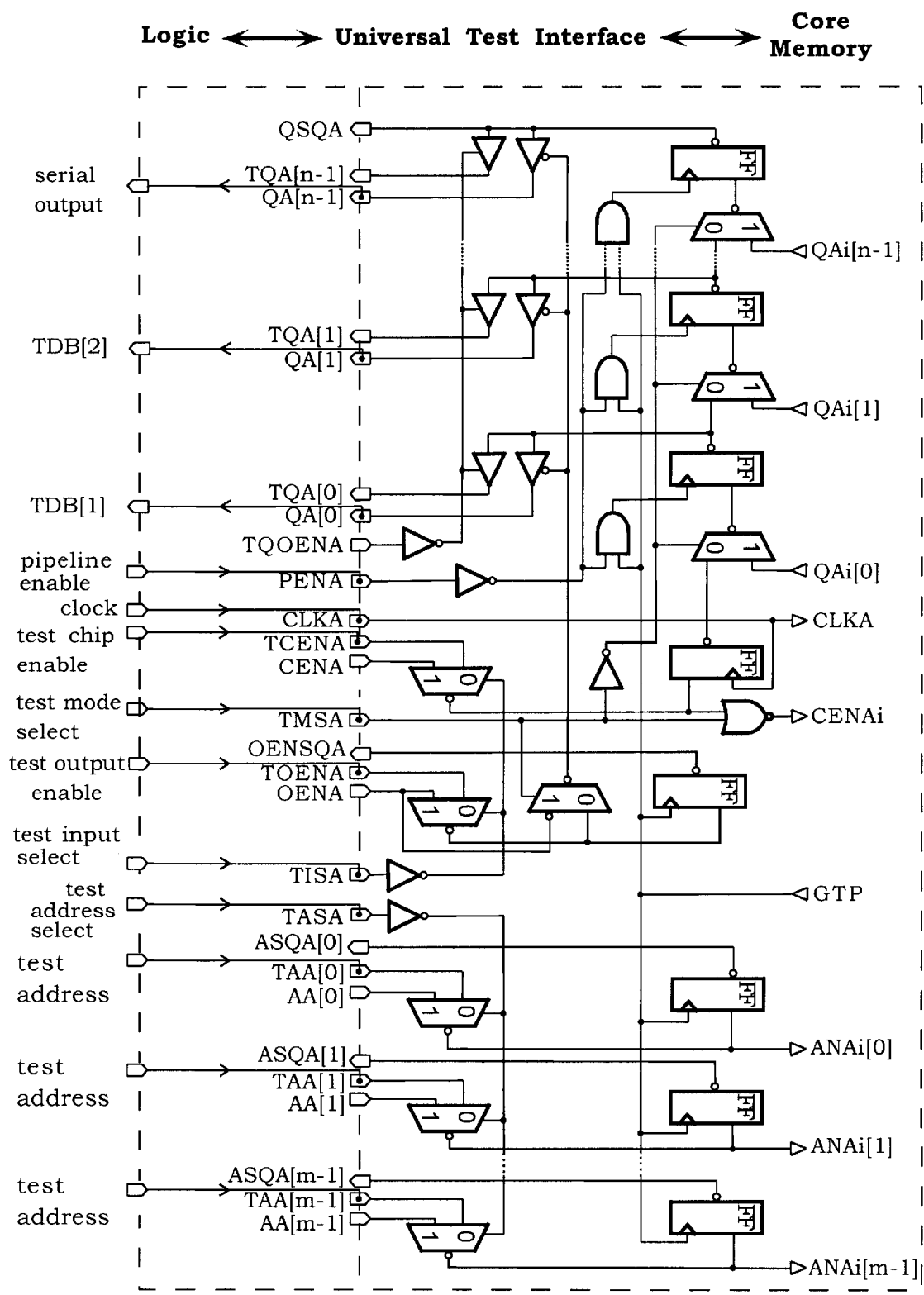
FIG. 31 shows a read-port UTI that is wired to enable serial BIST test mode operation in accordance with one embodiment of the present invention.

FIGS. 27 through 31 show examples of a read-port UTI that is pipeline enabled. FIG. 27 shows a read-port UTI that is wired to enable both scan test mode and serial test mode operation. FIG. 28 shows a read-port UTI that is wired to enable serial test mode operations. FIG. 29 shows a read-port UTI that is wired to enable parallel test mode operation. FIG. 30 shows a read-port UTI that is wired to enable scan test mode operation, and FIG. 31 shows a read-port UTI that is wired to enable serial BIST test mode operation.

Figure 32:
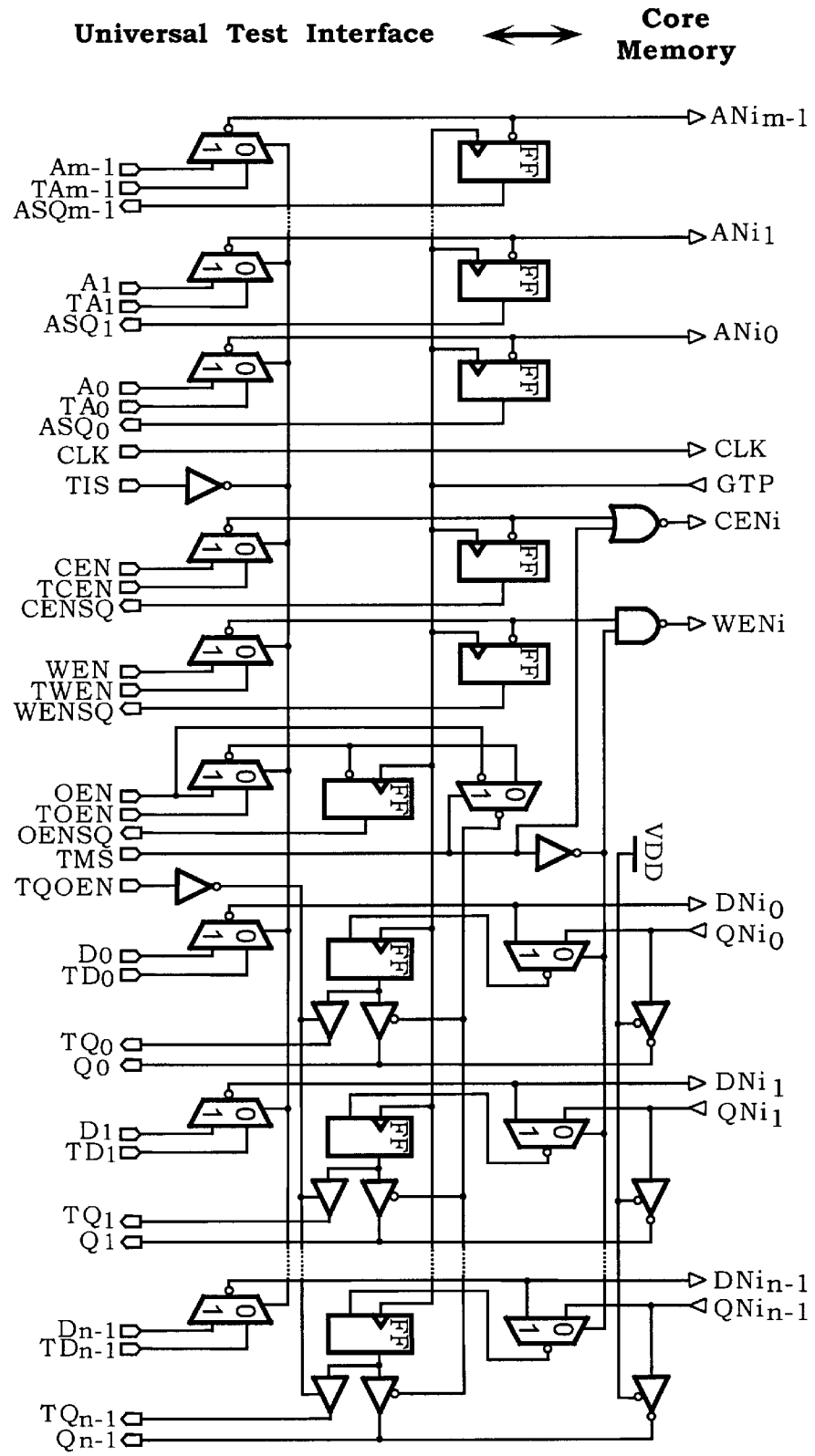
FIGS. 32 through 37 show examples of N-port UTI's that are configured for SRAM memories in accordance with one embodiment of the present invention.
Figure 33:
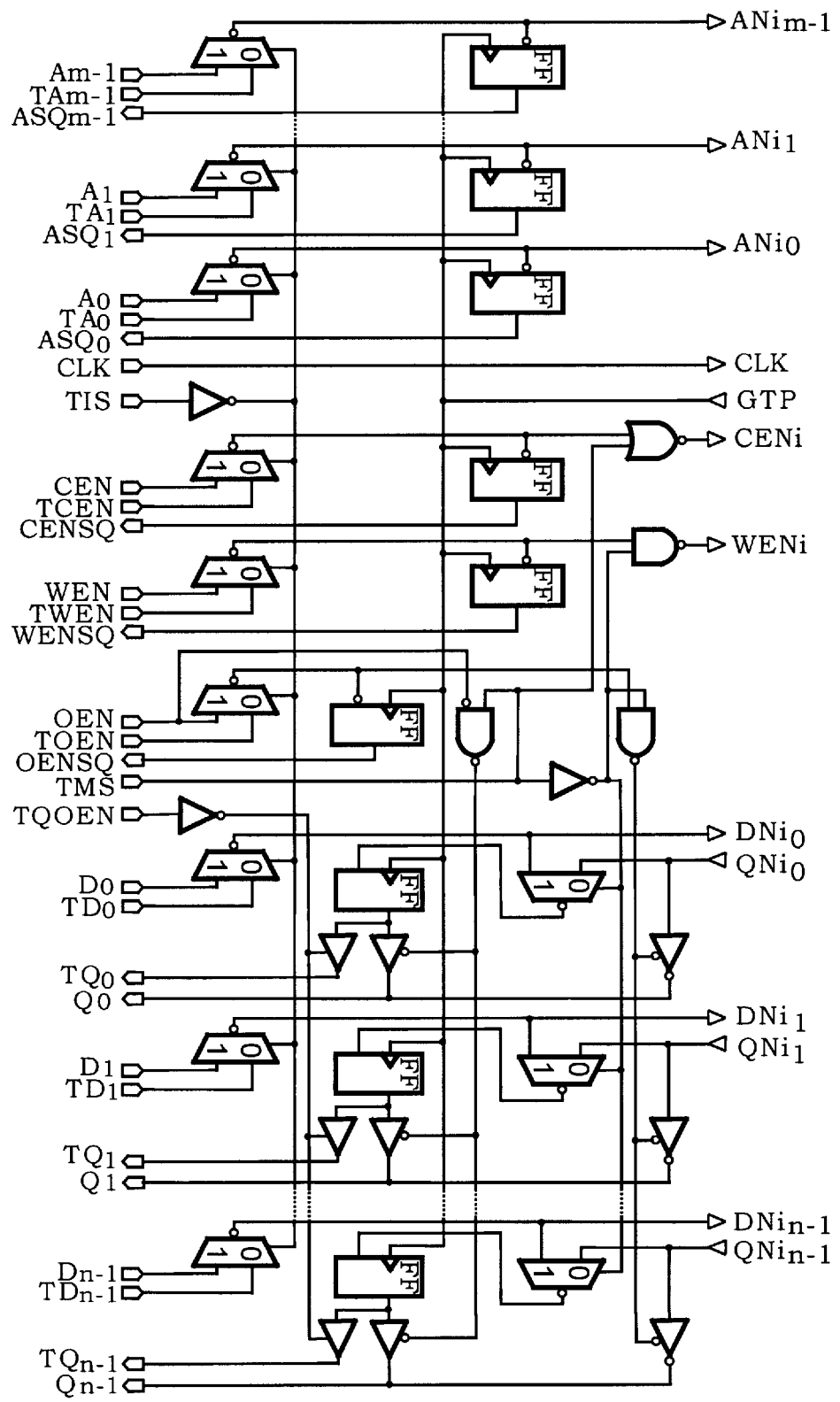
Figure 34:
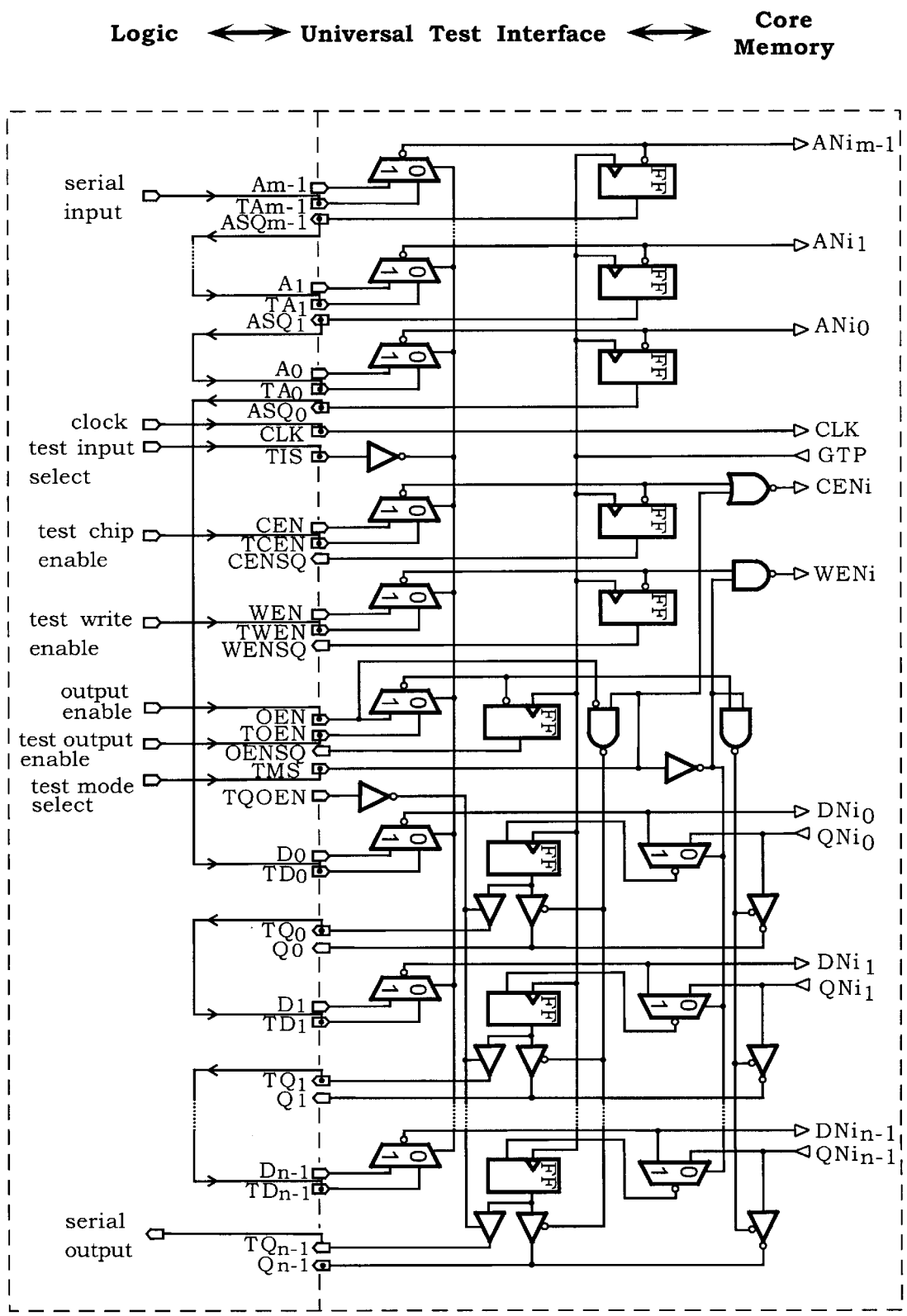
Figure 35:
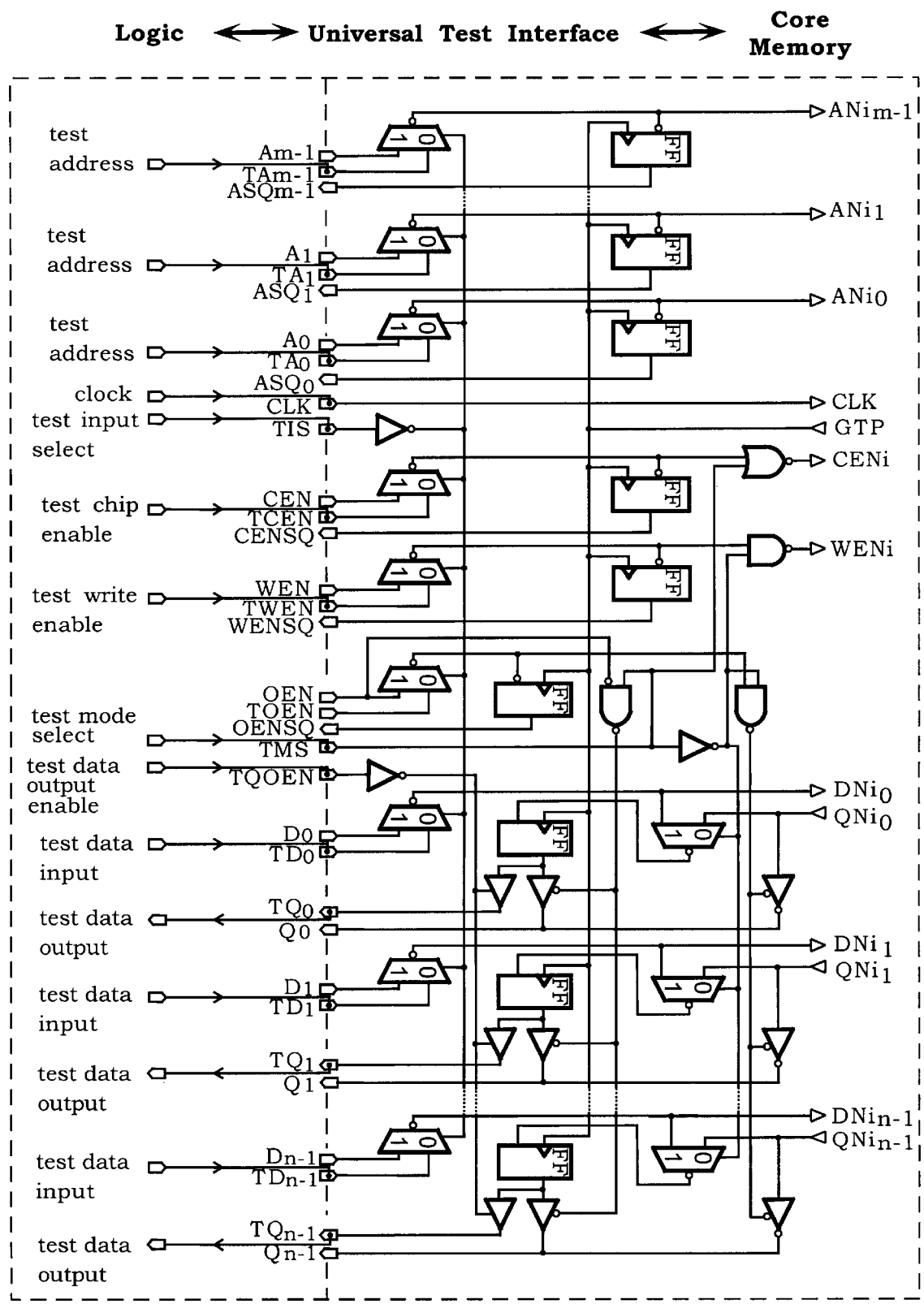
Figure 36:
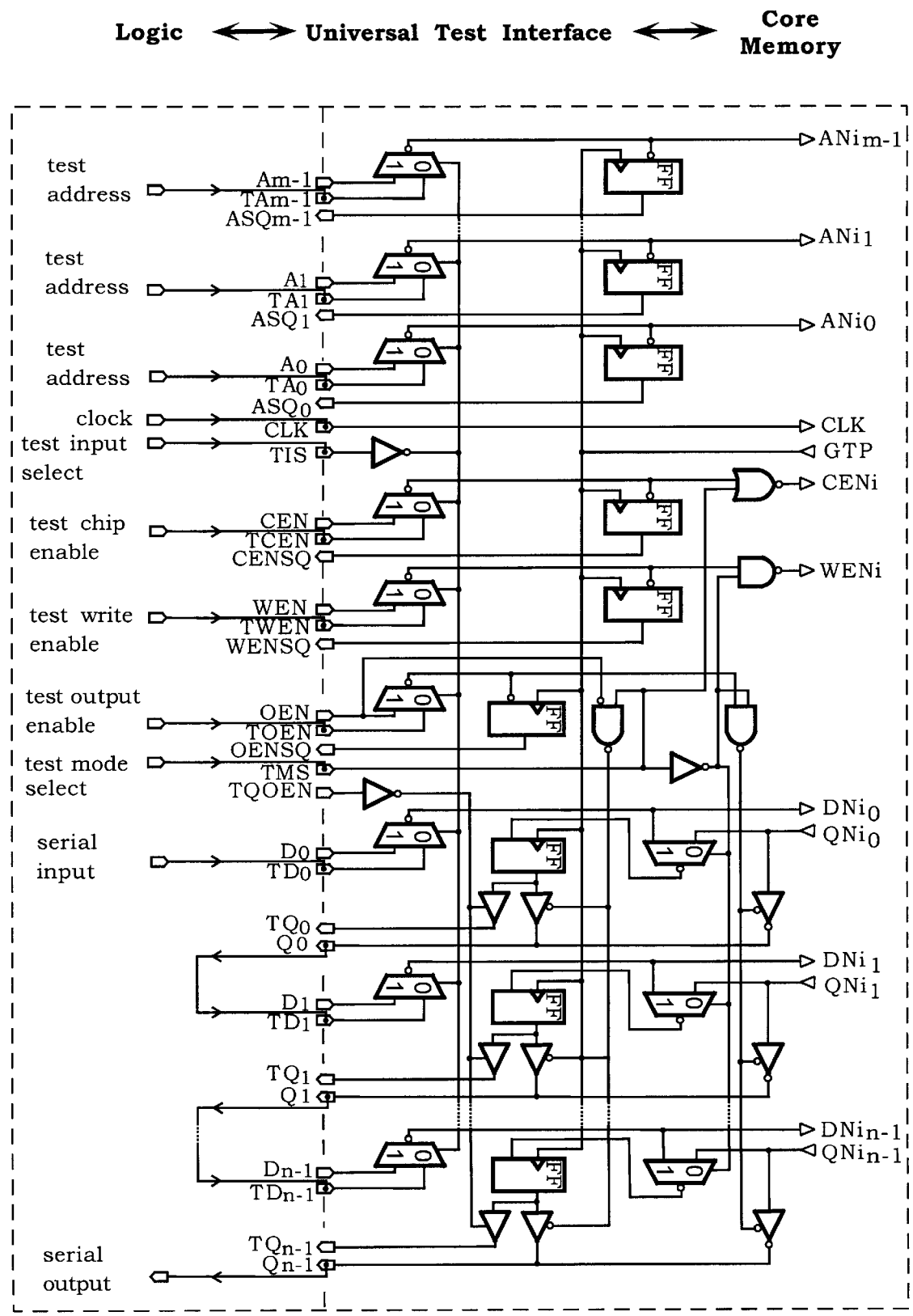
Figure 37:
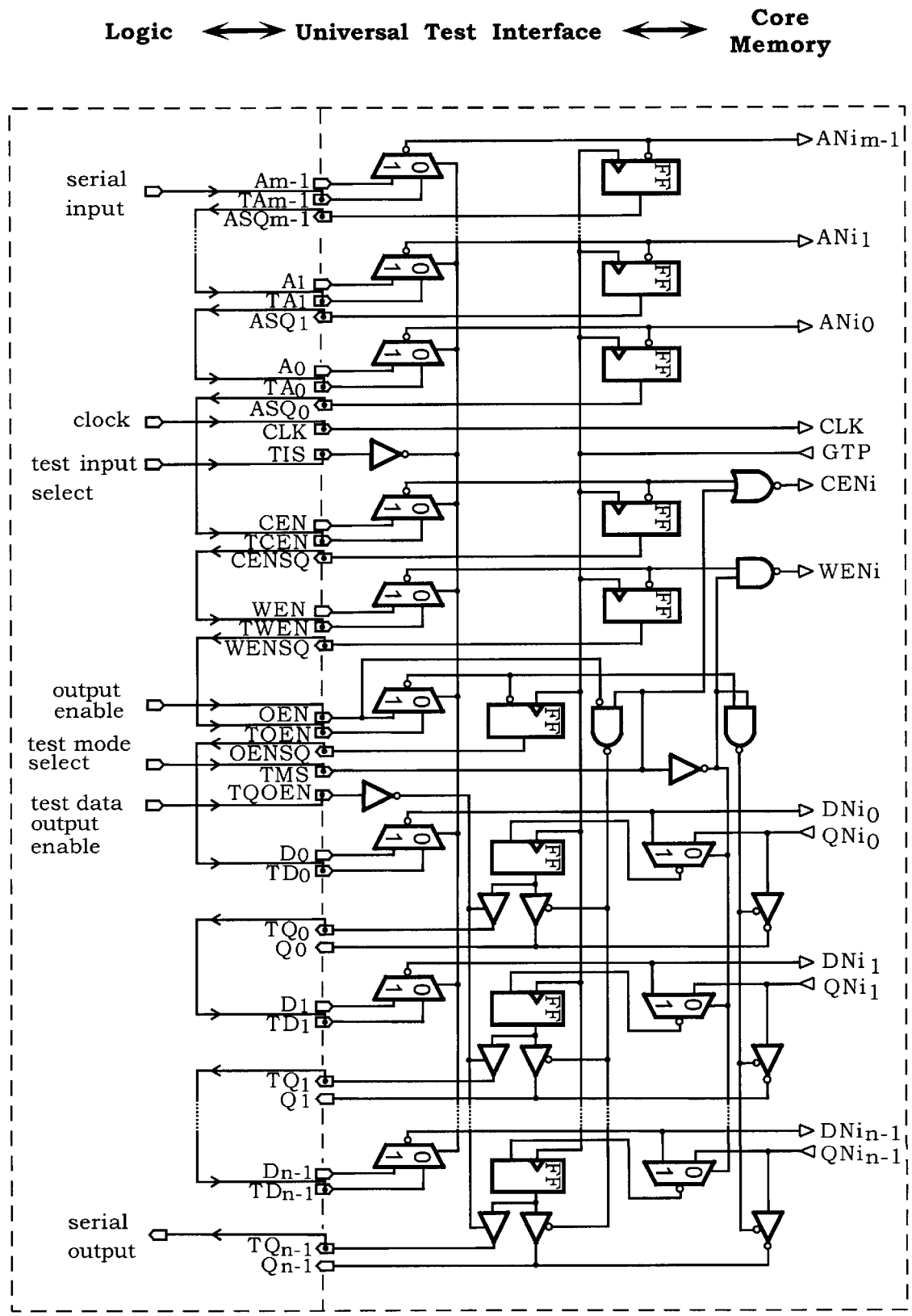

FIGS. 32 through 37 show examples of N-port UTI's (i.e., where N can be any number of ports) that are configured for SRAM memories. FIG. 32 shows a single-port SRAM UTI having pipeline capabilities. FIG. 33 shows a single-port SRAM UTI without pipeline capabilities. FIG. 34 shows a single-port SRAM UTI without pipeline capabilities and being wired to enable serial test mode operation. FIG. 35 shows a single-port SRAM UTI without pipeline capabilities and being wired to enable parallel test mode operation. FIG. 36 shows a single-port SRAM UTI without pipeline capabilities and being wired to enable serial BIST mode operation. Finally, FIG. 37 shows a single port SRAM UTI without pipeline capabilities and being wired to enable scan test mode operation.

From the above provided examples, one skilled in the art should appreciated that the universal test interface is truly a modular interface that may be integrated into any memory device and, easily programmed to perform the type of testing methodologies desired by the user/designer. Further, when the universal test interface of the present invention is compactly integrated as part of a memory device, such as, for example, those made using Process-Perfect™ memory generators designed by Artisan Components, Inc. of California, the user/designer may simply interconnect the UTI's input/output pins in a cost effective manner that enables rapid product design cycles. In addition, when UTI 206 is integrated to a memory core, drastic savings in core logic area may be achieved, thereby enabling more densely integrated and more compact high performance applications. Still further, the various UTI concepts, methods, and sub-circuits may easily be re-configured to provide a flexible test interface to any type of embedded circuit macro.

Although the foregoing invention has been described in some detail for purposes of clarity of understanding, it will be apparent that certain changes and modifications may be practiced within the scope of the appended claims. In particular circumstances, the various embodiments of the universal test interface may be implemented for any bus oriented embedded block, including, but not limited to memories, processors, controllers, etc. It should therefore be understood that the various circuit diagrams may be embodied in any form which may include, for example, any suitable semiconductor substrate, printed circuit board, packaged integrated circuit, or software implementation. By way of example, hardware description language (HDL) design and synthesis programs, such as, VHDL® hardware description language available from IEEE of New York, N.Y. may be implemented to design the silicon-level layouts. Accordingly, the present embodiments are to be considered as illustrative and not restrictive, and the invention is not to be limited to the details given herein, but may be modified within the scope and equivalents of the appended claims.

| DEFINITIONS |
| --- |
| APPLICABLE FOR TESTS OF APPENDICES "A THROUGH D" |

In one embodiment, for any stimulus of CONTROLLED INPUTS that do not change during a particular test, the input is simply tied high or tied low according to the test description. In another embodiment, the test controller may maintain the CONTROLLED INPUT in DC high or DC low during the particular test.
"vector" means: send a test vector, i.e., pulse the memory clock (CK) and provide appropriate setup and hold conditions on all other inputs.
"1" implies a DC high, and "0" implies a DC low waveform for all inputs, except CK. For CK, "1" implies a pulsed waveform, "0" implies a DC low.
For the purpose of clarity and consistency, an "active low" signal for all pins and signals described in this entire patent document shall have the following equivalent naming conventions: E.g., "/XX" "XX_" and "XXN"
Q(xx) values are checked or "strobed" after the access time following a CK rise.
Stimulus and Q(xx) compare values are repeated unless shown otherwise.
mem@A_w = the value of the word stored at the location called by address A(w).
m = number of address bits, a full address is referred to as A(0:m-1)
n = number of data bits, data word is referred to as D(0:n-1)
w = number of words

APPENDIX A

| SERIAL BIST |
| --- |
| Simulated or Real Stimulus & |
| Expected Response to and from the UTI |

```
TM   = 0        # Q's are not driven by the data scan flip flop output
TIS  = 1        # Test inputs are selected for the entire test
CK   = 1        # Clock is pulsed for the entire test
TOE_ = 0        # Enable the outputs of only the memory under test
TCE_ = 0        # Enable memory operation for the entire test
# 1 WRITE: load the memory with background data
Q(n-1) = don't care
TWE_ = 0        # Write memory
For i = 0 to (w-1) {
    TA(0:m-1) = 1       # Drive location for write
    For j = 0 to (n1) {
        TD(0) = 0       # Drive data to a low value for write
        vector
    }
}
# 2 READ AND OVERWRITE: check the background data and
put new data in.
For i = 0 to (w-1) {
    TA(0:m-1) = 1           # Drive location for read and write
    For j = 0 to (n-1) {
        TWE_ = 1            # Read memory
        Q(n-1) = 0          # Check the MSB of the read data word
        TD(0) = X           # Data input is ignored during a read vector
        TWE_ = 0            # Write memory
        TD(0) = 1           # Drive data to a high value for write
```

APPENDIX A-continued

| SERIAL BIST |
| --- |
| Simulated or Real Stimulus & |
| Expected Response to and from the UTI |

```
        Q(n-1) = don't care
        vector
    }
}
# 3 FINAL READ: check the most recent data
TWE_ = 1                # Read memory
For i = 0 to (w-1) {
    TA(0:m—1) = 1       # Drive location for read
    TWE_ = 1            # Read memory
    Q(n-1) = 1          # Check the MSB of the read data word
    TD(0) = X           # Data input is ignored during a read
    For j = 0 to (n-1) {
        vector
    }
}
# Repeat #1 and #2 as desired for different data patterns.
# Repeat entire serial BIST test for all memories if desired.
```

APPENDIX B

| SCAN TEST |
| --- |
| Simulated or Real Stimulus & |
| Expected Response to and from the UTI |

```
CK   =1        # Clock is pulsed for the entire scan test
OE_  =valid    # Enable only one memory at a time when Q bus is shared
TM   =1        # Test Mode must be high for entire scan test
```

1 LOAD CYCLES:
Load the memory scan chain elements with data. Since scan element outputs are meant to supply stimulus to other elements in parallel during the functional phase, we must prepare by loading the data scan flip flops with special values determined by a scan test controller.

```
Q(n-1) = don't care
A(0:m-1) = X    # mission mode inputs ignored when TIS high
CE_      = X    # mission mode ignored when TIS high
```

APPENDIX B-continued

SCAN TEST
Simulated or Real Stimulus &
Expected Response to and from the UTI

```
WE_    = X    # mission mode inputs ignored when TIS high
D(0:n-1) = X  # mission mode inputs ignored when TIS high
TIS    = 1    # Test inputs are selected for the load part of scan test.

For i = (n-1) to 0 {
      TA(0) = Q(i)    #Load bit i of special scan vector that will drive
                       (n-1)
      vector
                }
For i = 0 to (m+3)  {   # "push" the Q scan vector to the data scan flip flops
      TA(0) = X         # These bits will be never be used.
      vector
                }
```

2 FUNCTIONAL CYCLE:
When the clock rises, all the input scan flip flop slave, and the stages will be overwritten. This happens in parallel, whatever is on the chip drives that input during mission mode. The Q outputs will also disappear, their special scan vector will have been captured by whatever storage elements are downstream of the memory Q outputs.

```
A(0:m-1) = valid   # for simulation use sample data
CE_    = valid    # for simulation use sample data
WE_    = valid    # for simulation use sample data
D(0:n-1) = valid  # for simulation use sample data
TA(0)  = X        # scan input ignored
TIS    = 0        # must go from serial (test) input to parallel user input
vector
```

3 SHIFT OUT CYCLES:
The shift out cycles verify the functional cycle of step #2.

```
A(0:m-1) = X   # mission mode inputs ignored when TIS high
CE_    = X    # mission mode inputs ignored when TIS high
WE_    = X    # mission mode inputs ignored when TIS high
D(0:n-1) = X  # mission mode inputs ignored when TIS high
TIS    = 1    # Test inputs are selected for the shift out part of scan
test.

For i = 0 to (m+n+3) { #shift scan result vector out of the data scan flip
flops
      TA(0) = X            # These bits will be never be used.
      Q(0:n-2) = don't care  # Not interested in parallel output
      Q(n-1) = valid        # Check serial output matches parallel
input of 2
      vector
                  }
Q(n-1) = don't care
```

Note: In a simplified example, all high values may be loaded in step #1, all low values loaded in step #2 and checked in step #3.
Repeat entire test for any number of different data patterns if desired.
Repeat entire test for all memories if desired.

APPENDIX C

PARALLEL TEST/MUX ISOLATION
Simulated or Real Stimulus &
Expected Response to and from the UTI

```
TM = 0       # Q's are not driven by the data scan flip flop output
TIS = 1      # Test inputs are selected for the entire parallel test
CK = 1       # Clock is pulsed for the entire parallel test
TOE_ = 0     # Enable the outputs of only the memory under test
TCE_ = 0     # Enable memory for the entire test
# 1 WRITE: load the memory with data
Q(n-1) = don't care
TWE_ = 0             # Write memory
For i = 0 to (w-1) {
   TA(0:m-1) = w       # Drive location for write
   TD(0:n-1) = valid   # Drive sample data for write
   vector
}
```

APPENDIX C-continued

PARALLEL TEST/MUX ISOLATION
Simulated or Real Stimulus &
Expected Response to and from the UTI

```
# 2 READ: Check memory contents
TWE_ = 1                         # Read memory
For i = 0 to (w-1) {
   TA(0:m-1) = w                 # Drive location for read
   Q(0:n-1) = mem@A_w(0:n-1)     # Check the MSB of the read
                                   data word
   vector
}
Q(n-1) = don't care
# Repeat 1 and 2 as desired for different data patterns.
# Repeat entire parallel test for all memories if desired.
```

APPENDIX D

SERIAL TEST
Simulated or Real stimulus &
Expected Response to and from the UTI

```
TIS = 1     # Test inputs are selected for the entire serial test
CK = 1      # Clock is pulsed for the entire serial test
OE_ = 0     # Enable only the memory under test if Q bus is shared
# 1 WRITE: load the memory with data
Q(n-1) = don't care
TM = 1      # Q's are driven by the data scan flip flop output
TOE_ = X    # TM will over-ride TOE_ when TM is high
For i = 0 to (w-1) {
# 1.1 WRITE SERIAL LOAD: Load the scan flip flops in preparation for
a write
   TCE_ = X   # Core memory does not have to be enabled
   TWE_ = 1   # If TCE_ is low, we want to ensure core is not written
#DATA SERIAL LOAD
# Load D(0:n-1) into the serial flip flop chain
   For j = (n-1) to 0 {
      TA(0) = D(j)  # Load bit j of data word D(0:n-1)
      vector
   }
#ADDRESS SERIAL LOAD
# Load every address bit but A(0) into the flip flop chain
   For j = (m-1) to 1 {
      TA(0) = A(j)  # Load bit j of address A(w) of location w
      vector
   }
#1.2 WRITE CYCLE: Write memory location addressed by A(w) with
data
   TCE_ = 0   # Core memory must by enabled
   TWE_ = 0   # We are doing a write
   TA(0) = A(0)  # Dirve bit 0 of address A(w)
   vector
}
# 2 READ: Check memory contents
TWE_ = 1          # Do not write
For i = 0 to (w-1) {
# 2.1 READ ADDRESS SERIAL LOAD: Load the address scan flip flops
for a read
   TCE_ = X          # Core memory does not have to be enabled
   TM = X            # Q's are ignored during read address load
   For j = (m-2) to 0 {
      TA(0) = A(j)       # Load bit j of address A(w) of location w
      vector
   }
# 2.2 READ CYCLE: Read memory location addressed by A(w) with data
   TOE_ = 0          # Core memory output must be enabled
   TCE_ = 0          # Core memory operation must be enabled
   TM = 0            # Q's are driven by core memory
   TA(0) = A(0)      # Drive bit 0 of address A(w)
   Q(n-1) = mem@A_w(n-1)   # Check the MSB of the read data word
   vector
# 2.3 READ DATA SHIFT OUT: Shift out the rest of the word
mem@A_w
   TOE_ = X    # Core memory output does not have to be enabled
   TCE_ = X    # Core memory operation does not have to be enabled
   TA(0) = X   # Address does not matter any more
   TM = 1      # Q's are driven by data scan flip flops
   For j = (n2) to 0 {
      Q(n-1) = mem@A_w(j)   # Check the rest of the read data word
      vector
   }
}
Q(n-1) = don't care
# Repeat 1 and 2 as desired for different data patterns.
# Repeat entire serial test for all memories if desired.
```

What is claimed is:

1. A programmable memory test interface for testing a memory device, comprising:
   a plurality of programmable input pins and output pins;
   logic component means for interfacing the plurality of programmable input pins and output pins to the memory device, the logic component means is capable of being configured in accordance with one or more memory testing methodologies, and the configuring is accomplished by interconnecting selected ones of the plurality of programmable input pins and output pins; and
   a plurality of memory interfacing pins that connect the logic component means to the memory device.

2. A programmable memory test interface for testing a memory device as recited in claim 1, wherein the selected ones of the programmable input pins and output pins are interconnected to a test controller that is configured to drive the logic circuitry in the one or more memory testing methodologies.

3. A programmable memory test interface for testing a memory device as recited in claim 2, wherein the one or more memory testing methodologies are selected from the group consisting of a serial built-in-self-test (BIST), a parallel built-in-self-test (BIST), a parallel test, a serial test, and a scan test.

4. A programmable memory test interface for testing a memory device as recited in claim 3, wherein the logic component means includes a plurality of logic multiplexors that are connected to some of the plurality of programmable input pins and output pins.

5. A programmable memory test interface for testing a memory device as recited in claim 4, wherein the logic component means includes a plurality of flip flops that are connected to some of the plurality of programmable input pins and output pins.

6. A programmable memory test interface for testing a memory device as recited in claim 5, wherein the plurality of flip flops enable the logic component means to run the scan test.

7. A programmable memory test interface for testing a memory device as recited in claim 2, wherein the logic component means is capable of operating in one of a non-pipeline mode and a pipeline mode.

8. A programmable memory test interface for testing a memory device as recited in claim 7, wherein the logic component means is configured for one of a write-port and a read-port register file memory.

9. A programmable memory test interface for testing a memory device as recited in claim 2, wherein the memory device is an N-port SRAM memory.

10. A programmable memory test interface for testing a memory device as recited in claim 9, wherein the logic component means is configured for one of a non-pipeline mode and a pipeline mode.

11. A programmable memory test interface for testing a memory device as recited in claim 1, wherein the logic component means is integrated with the memory device in a semiconductor chip.

12. A programmable memory test interface, comprising:
   logic circuitry configured to be integrated to a memory device, the memory device having a plurality of receiving connections that are configured to be coupled to a plurality of internal connections of the logic circuitry;
   a plurality of programmable input pins and output pins leading to and from the logic circuitry, the programmable input pins and output pins are configured to receive control driving signals from external wiring that connects to selected ones of the programmable input pins and output pins that enable operating the memory device in one of a test mode and a mission mode; and
   wherein the programmable input pins and output pins are selectively interconnected to transform the logic circuitry into at least one type of memory testing methodology interface that enables testing the memory device when operating in the test mode and operating the memory device in a non-test mode when in the mission mode.

13. A programmable memory test interface as recited in claim 12, wherein the at least one type of memory testing methodology interface is selected from the group consisting of a serial built-in-self-test, a parallel built-in-self-test, a parallel test, a serial test, and a scan test.

14. A programmable memory test interface as recited in claim 13, wherein the logic circuitry includes a plurality of logic multiplexors connected to some of the plurality of programmable input pins and output pins.

15. A programmable memory test interface as recited in claim 13, wherein the logic circuitry includes a plurality of flip flops connected to some of the plurality of programmable input pins and output pins.

16. A programmable memory test interface as recited in claim 12, wherein the memory device and the logic circuitry is integrated onto a semiconductor chip.

17. A programmable memory test interface as recited in claim 12, wherein the logic circuitry is configured to operate in one of a non-pipeline mode and a pipeline mode.

18. A programmable memory test interface as recited in claim 17, wherein the memory device is a register file.

19. A programmable memory test interface as recited in claim 18, wherein the register file has one of a dedicated read port and a dedicated write port memory device.

20. A programmable memory test interface as recited in claim 12, wherein the memory device is an N-port SRAM memory.

21. A programmable memory test interface as recited in claim 12, further comprising:

logic means being connected to one or more of the plurality of programmable input pins and output pins, the logic means is provided for enabling operation of a desired test methodology interface when the logic means receives the control driving signals.

22. A programmable memory test interface for testing a memory device, comprising:

a plurality of programmable input pins and output pins; and logic interfacing means for connecting external signals to the plurality of programmable input pins and output pins, the external signals being processed by the logic interfacing means and then communicated to a plurality of memory connection pins that couple up to the memory device, the logic component means is capable of being configured in accordance with one or more memory testing methodologies including a serial built-in-self-test (BIST), a parallel built-in-self-test (BIST), a parallel test, a serial test, and a scan test, the configuring being performed by selectively interconnecting selected ones of the plurality of input pins and output pins to the external signals that drive the logic interface means in a test mode that operates in the one or more memory testing methodology or a mission mode.

23. A programmable memory test interface for testing a memory device as recited in claim 22, wherein the logic interfacing means includes a plurality of logic multiplexors that are connected to some of the plurality of programmable input pins and output pins.

24. A programmable memory test interface for testing a memory device as recited in claim 23, wherein the logic interfacing means includes a plurality of flip flops that are connected with some of the plurality of programmable input pins and output pins.

25. A programmable memory test interface for testing a memory device as recited in claim 24, wherein the plurality of flip flops enable the logic interfacing means to run the scan test.

26. A programmable memory test interface for testing a memory device as recited in claim 22, wherein the logic interfacing means is configured to operate in one of a non-pipeline mode and a pipeline mode.

27. A programmable memory test interface for testing a memory device as recited in claim 26, wherein the memory device is a register file.

28. A programmable memory test interface for testing a memory device as recited in claim 27, wherein the register file has one of a dedicated read port and a dedicated write port memory device.

29. A programmable memory test interface for testing a memory device as recited in claim 22, wherein the memory device is an N-port SRAM memory.

30. A method for using a memory generator to make a memory core on a semiconductor chip, the method comprising:

integrating interface logic circuitry to the memory core, the interface logic circuitry having a plurality of memory core pins that connect to the memory core, the interface logic also includes a plurality of input pins and output pins; and interconnecting some of the plurality of input pins and output pins to convert the programmable memory testing interface into at least one memory methodology tester that is selected from the group consisting of a serial built-in-self-test, a parallel built-in-self-test, a parallel test, a serial test, and a scan test, the plurality of input pins and output pins that are capable of being interconnected are further capable of being connected to wiring that is external to the interface logic circuitry, and the wiring is configured to drive the memory core in a test mode or a mission mode.

31. A method for using a memory generator to make a memory core on a semiconductor chip as recited in claim 30, further comprising:

coupling a test generator to the wiring for driving the interface logic circuitry in one of the test mode and the mission mode.

32. A method for using a memory generator to make a memory core on a semiconductor chip as recited in claim 31, further comprising:

integrating a plurality of flip flops in the interface logic circuitry for performing the scan test.

33. A method for using a memory generator to make a memory core on a semiconductor chip as recited in claim 31, further comprising:

operating the interface logic circuitry in one of a non-pipeline mode and a pipeline mode.

34. A method for using a memory generator to make a memory core on a semiconductor chip as recited in claim 30, wherein the memory core is a register file.

35. A method for using a memory generator to make a memory core on a semiconductor chip as recited in claim 34, wherein the register file has one of a dedicated read port and a dedicated write port memory core.

36. A method for using a memory generator to make a memory core on a semiconductor chip as recited in claim 30, wherein the memory core is an N-port SRAM memory.

* * * * *